United States Patent
Mizuno et al.

(10) Patent No.: US 6,891,650 B2
(45) Date of Patent: May 10, 2005

(54) MICROMIRROR UNIT FABRICATION METHOD AND MICROMIRROR UNIT MADE BY THE SAME

(75) Inventors: Yoshihiro Mizuno, Kawasaki (JP); Satoshi Ueda, Kawasaki (JP); Osamu Tsuboi, Kawasaki (JP); Ippei Sawaki, Kawasaki (JP); Hisao Okuda, Kawasaki (JP); Fumio Yamagishi, Kawasaki (JP); Norinao Kouma, Kawasaki (JP)

(73) Assignees: Fujitsu Limited,, Kawasaki (JP); Fujitsu Media Devices Limited, Nagano (JP)

( * ) Notice: Subject to any disclaimer, the term of this patent is extended or adjusted under 35 U.S.C. 154(b) by 0 days.

(21) Appl. No.: 10/755,339

(22) Filed: Jan. 13, 2004

(65) Prior Publication Data

US 2004/0141894 A1 Jul. 22, 2004

Related U.S. Application Data

(62) Division of application No. 09/995,588, filed on Nov. 29, 2001, now Pat. No. 6,723,659.

(30) Foreign Application Priority Data

Aug. 20, 2001 (JP) ........................................ 2001-249695

(51) Int. Cl.[7] .............................................. G02B 26/08
(52) U.S. Cl. ........................ 359/224; 359/291; 310/309

(58) Field of Search ................................. 359/196, 212, 359/213, 214, 223, 224, 290, 291; 257/415; 310/309

(56) References Cited

U.S. PATENT DOCUMENTS

| | | | | | |
|---|---|---|---|---|---|
| 5,444,566 | A | * | 8/1995 | Gale et al. | 359/291 |
| 5,552,924 | A | * | 9/1996 | Tregilgas | 359/224 |
| 6,369,931 | B1 | * | 4/2002 | Funk et al. | 359/223 |
| 6,449,079 | B1 | | 9/2002 | Herrmann | 359/214 |

FOREIGN PATENT DOCUMENTS

WO    WO 00/20899    4/2000

* cited by examiner

*Primary Examiner*—Mark A. Robinson
(74) *Attorney, Agent, or Firm*—Armstrong, Kratz, Quintos, Hanson & Brooks, LLP

(57) ABSTRACT

A method of making a micromirror unit is provided. In accordance with the method, a micromirror unit is made from a material substrate having a multi-layer structure composed of silicon layers and at least one intermediate layer. The resulting micromirror unit includes a mirror forming base, a frame and a torsion bar. The method includes the following steps. First, a pre-torsion bar is formed by subjecting one of the silicon layers to etching. The obtained pre-torsion bar is rendered smaller in thickness than the mirror forming base and is held in contact with the intermediate layer. Then, the desired torsion bar is obtained by removing the intermediate layer contacting with the pre-torsion bar.

9 Claims, 44 Drawing Sheets

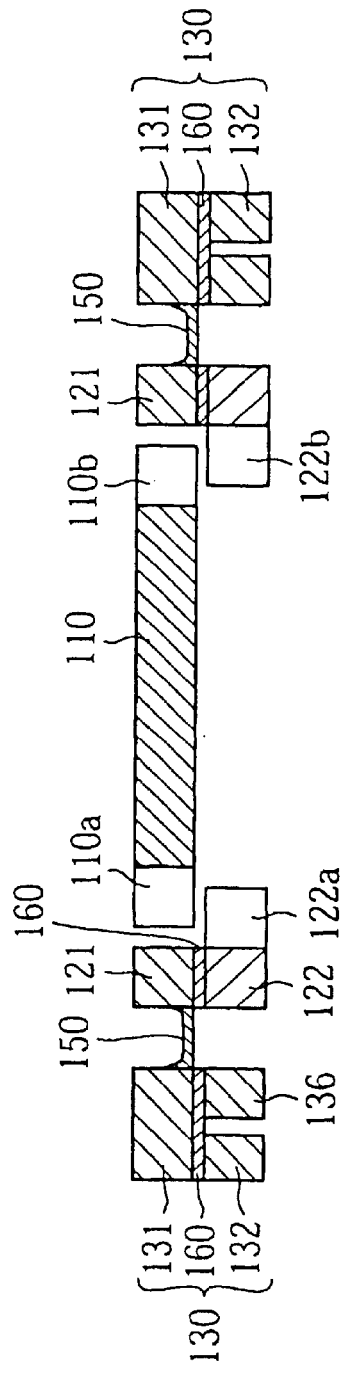
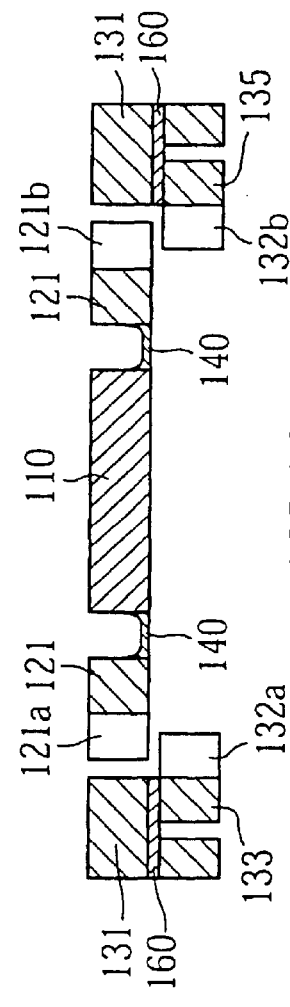
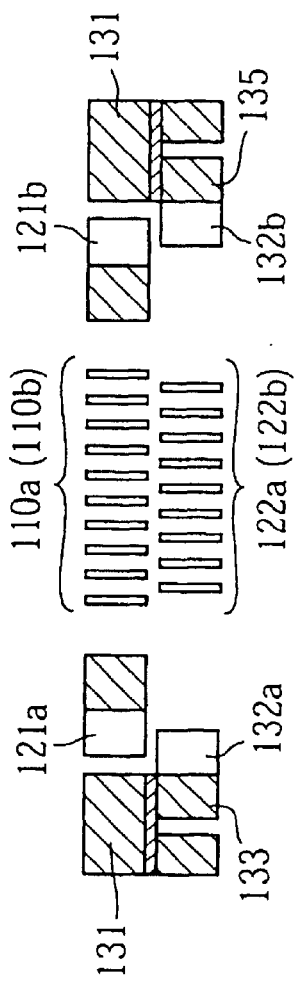
FIG.2A
FIG.2B
FIG.2C

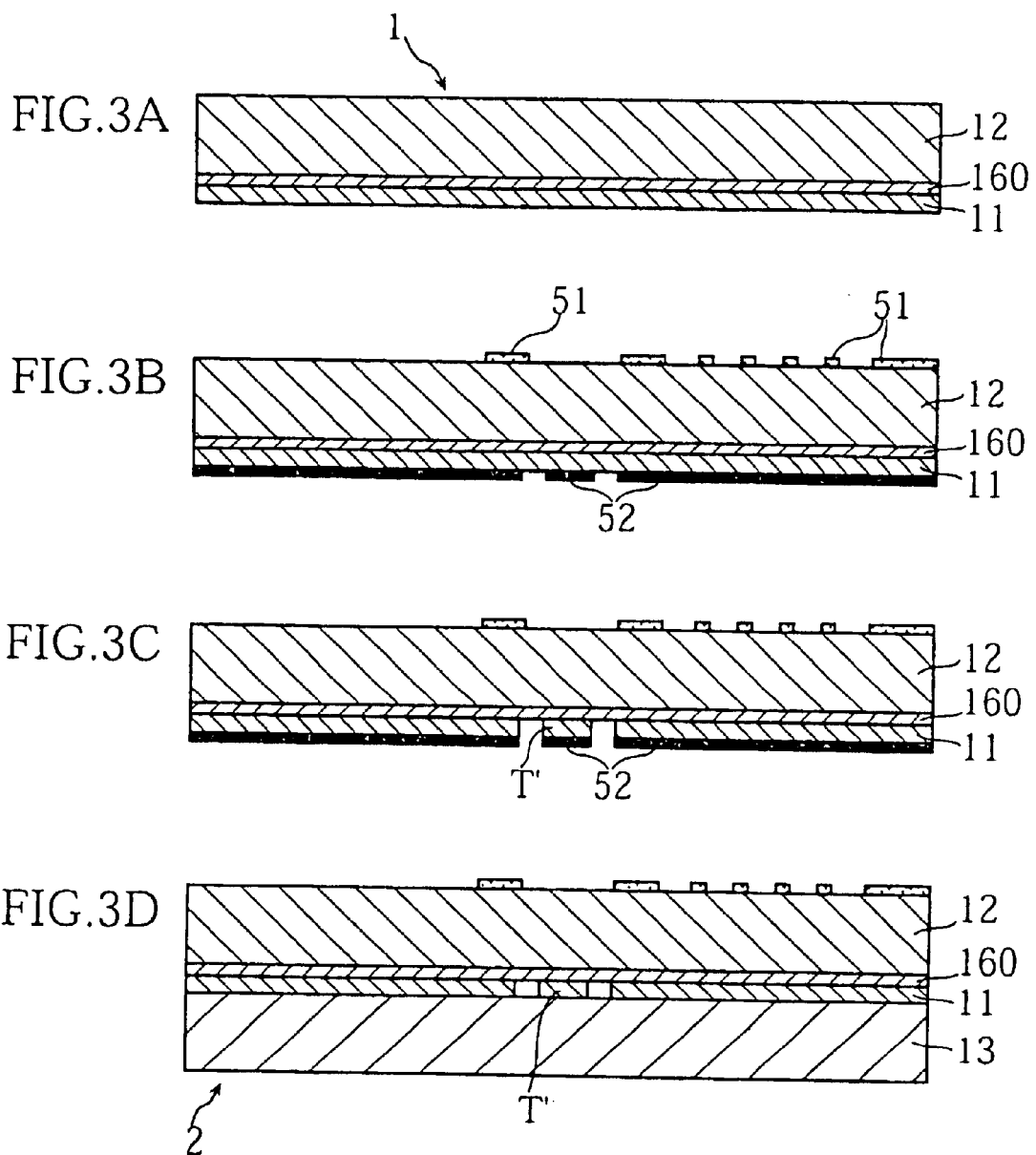

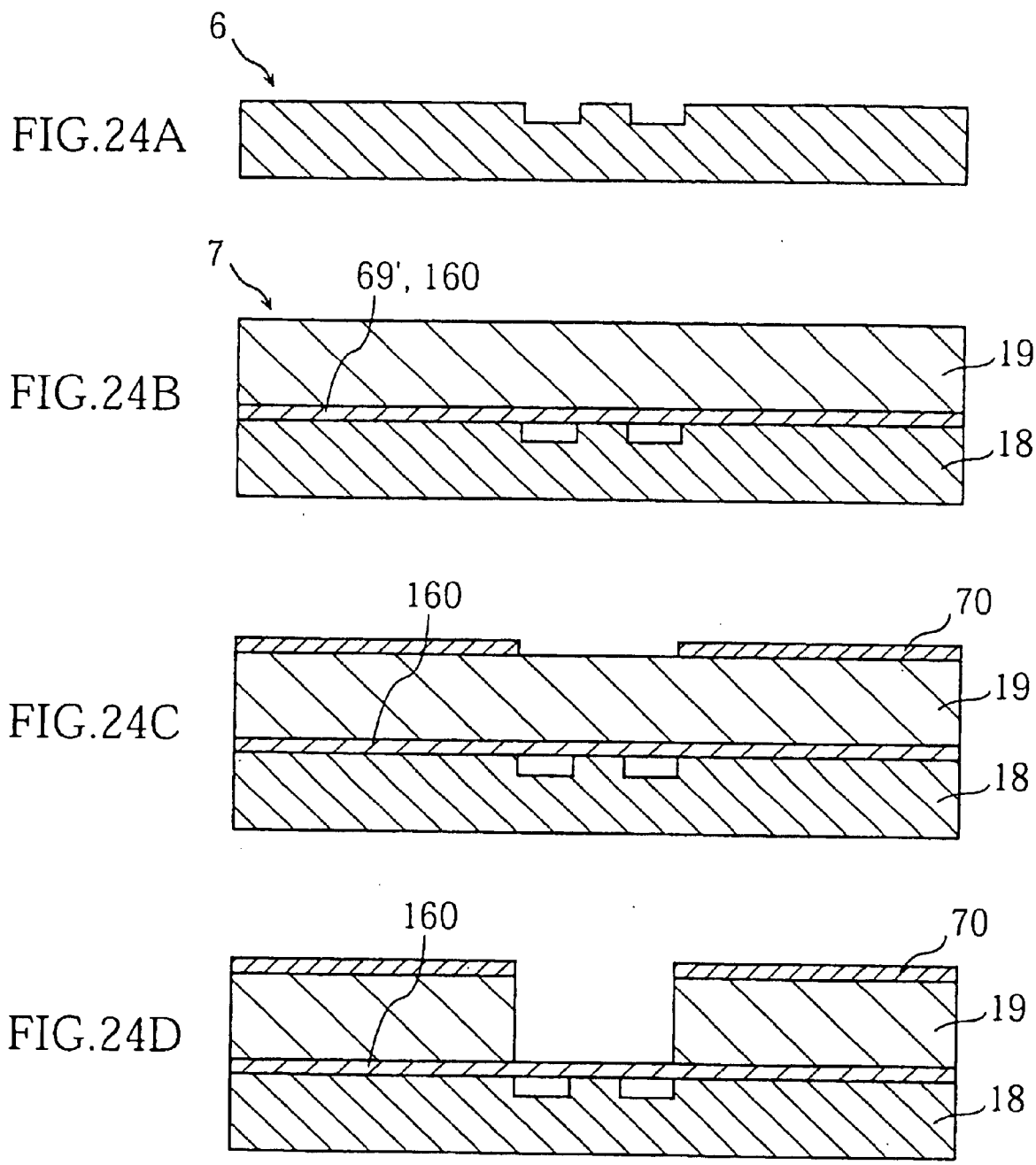

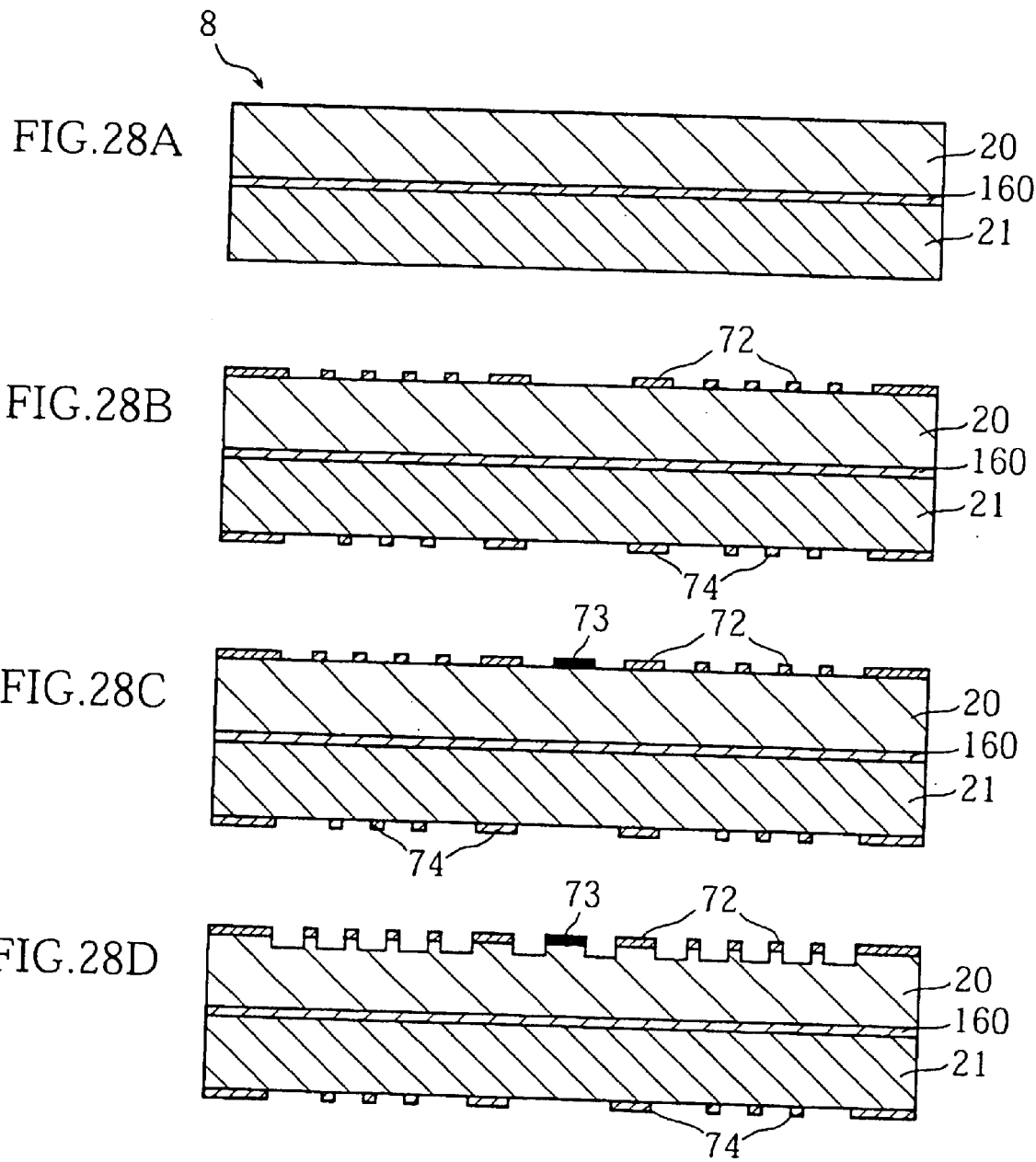

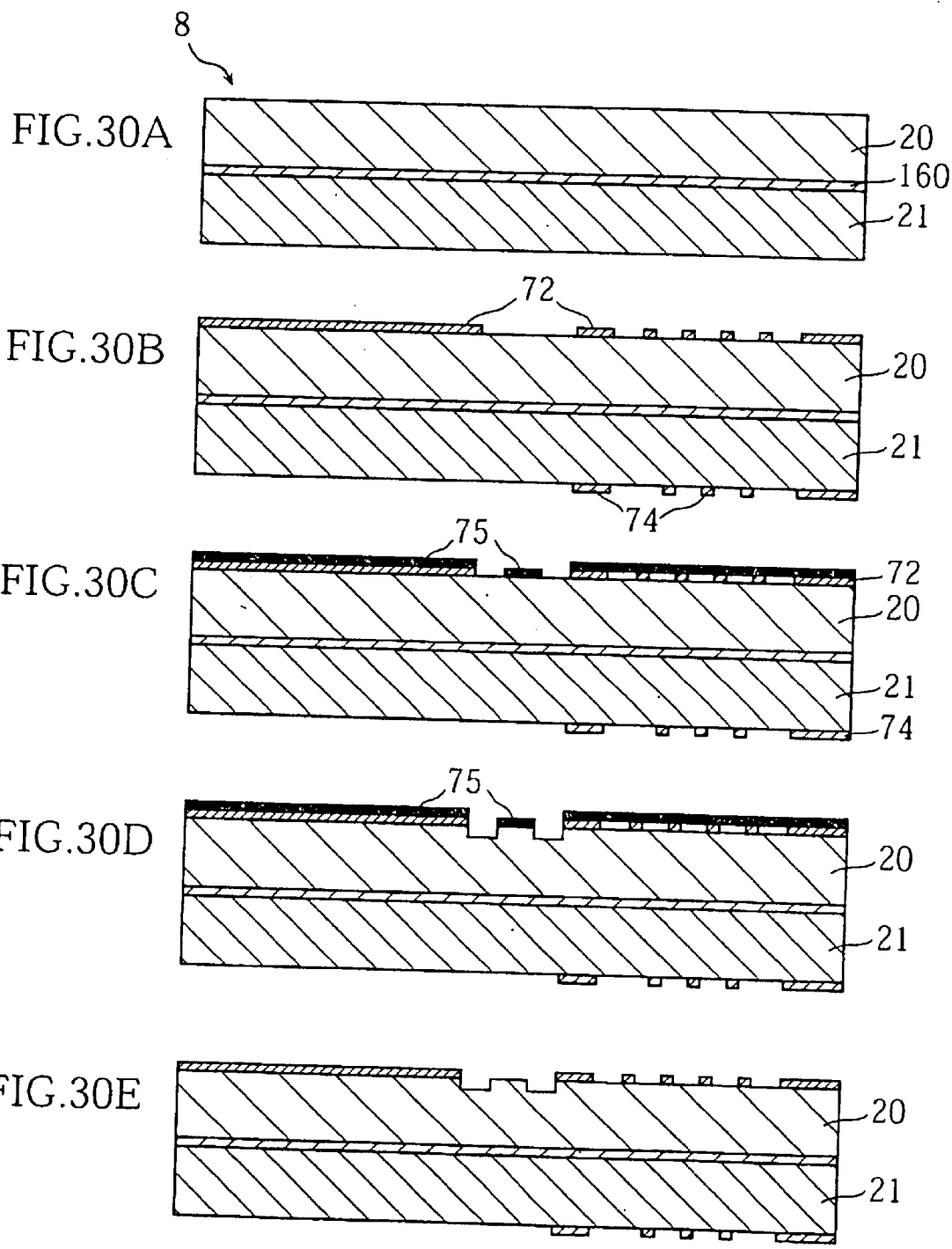

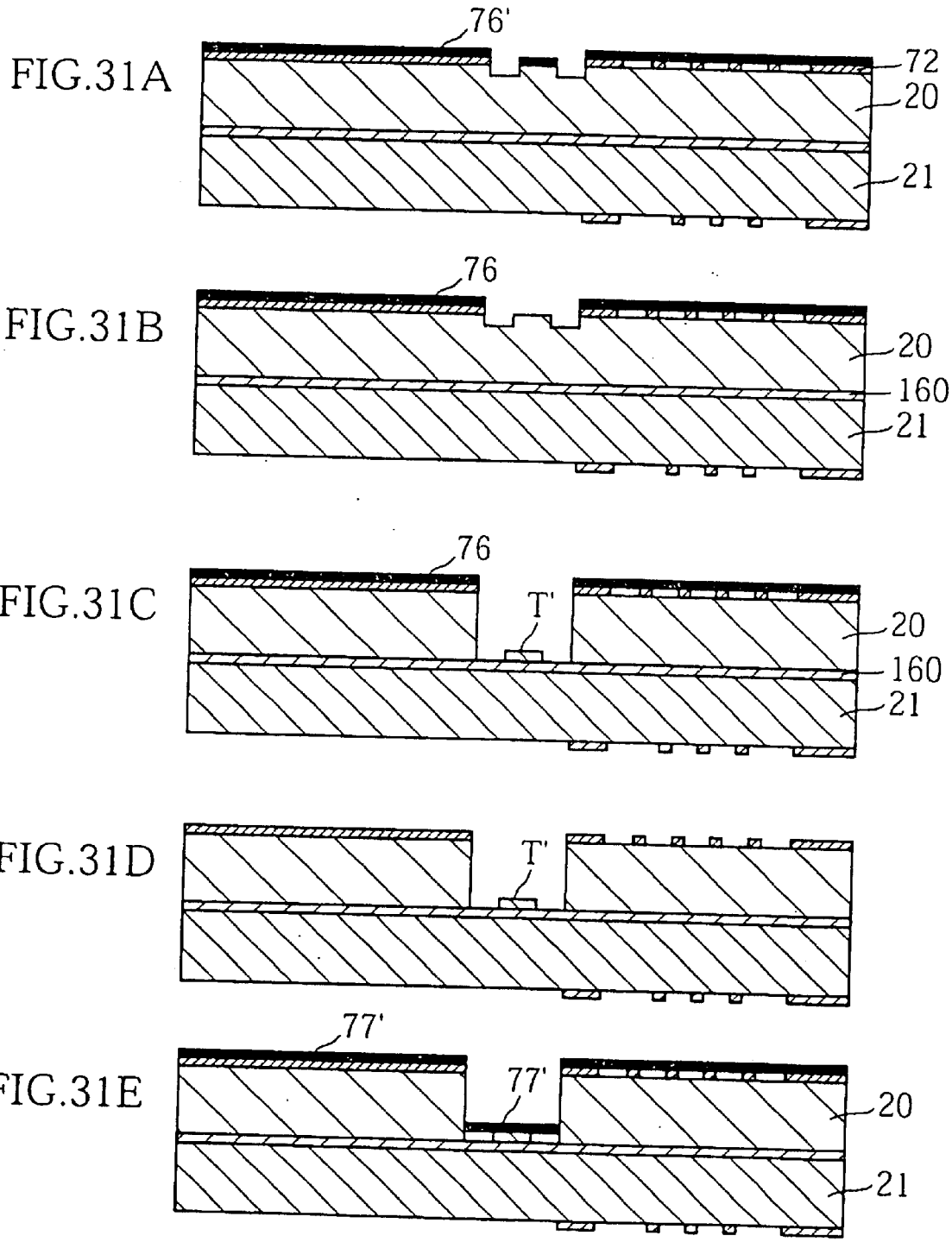

US 6,891,650 B2

MICROMIRROR UNIT FABRICATION METHOD AND MICROMIRROR UNIT MADE BY THE SAME

This is a Divisional Application of U.S. patent application Ser. No. 09/995,588, filed Nov. 29, 2001, now U.S. Pat. No. 6,723,659, which is hereby incorporated by reference.

BACKGROUND OF THE INVENTION

1. Field of the Invention

The present invention relates to a micromirror unit used in optical apparatus for the purposes of changing the direction of light. In particular, it relates to a micromirror unit of the type which is advantageously incorporated in an optical switching apparatus (for selectively connecting one optical fiber to another to provide a light passage), an optical disk apparatus (for writing to or reading data from an optical disk), etc.

2. Description of the Related Art

In recent years, optical communications techniques have been widely used in various fields. In optical communications, optical signals are transmitted through optical fibers. In general, use is made of an optical switching device for changing the transmission path of optical signals from one fiber to another. To attain proper data transmission, the operation of the switching device needs to meet several requirements, such as a large data-handling capacity, high-speed data transmission, high stability, etc. In light of these requirements, it is preferable that an optical switching device incorporates a micromirror unit fabricated by a micro-machining technique. With the use of a micromirror unit, there is no need to convert an optical signal to an electrical signal in performing the switching operation between the data input path and the data output path of the switching device. This feature enables a micromirror unit to meet the above-mentioned requirements.

An optical switching device incorporating a micromirror unit fabricated by a micro-machining technique is disclosed for example in a PCT application WO 00/20899 and a treatise titled "Fully Provisioned 112×112 Micro-Mechanical Optical Crossconnect with 35.8 Tb/sec Demonstrated Capacity (Proc. 25th Optical Fiber Communication Conf. Baltimore. PD12(2000)).

FIG. 39 of the accompanying drawings shows the basic structure of a typical optical switching device. The switching device 200 includes a pair of micromirror arrays 201–202, an input fiber array 203 and an output fiber array 204. The input fiber array 203 includes a predetermined number of input fibers 203a each of which corresponds to a micromirror unit 201a of the micromirror array 201. Likewise, the output fiber array 204 includes a predetermined number of output fibers 204a each of which correspond to a micromirror unit 202a of the micromirror array 202. A plurality of micro lenses 205 are arranged in facing relation to the ends of the respective input fibers 203a, while a plurality of micro lenses 206 are arranged in facing relation to the ends of the respective output fibers 204a.

In the optical data transmission, light beams L1 emitted from the input fibers 203a are collimated by the micro lenses 205 and strike upon the respective micromirror units 201a. Reflected on these units, the light beams are directed toward the second micromirror array 202. Each of the micromirror units 201a has a mirror surface which is adjustable in orientation for causing the reflected light to be properly directed toward a corresponding one of the micromirror units 202a. Likewise, each of the micromirror units 202a has a mirror surface which is adjustable in orientation. In this arrangement, the light beam L1 emitted from an input fiber 203a can be caused to enter a selected one of the output fibers 204a by changing the orientation of the micromirror units 201a and 202a.

FIG. 40 shows the basic structure of another optical switching device. The illustrated device 300 includes one micromirror array 301, a stationary mirror 302 and an input/output fiber array 303. The fiber array 303 includes a predetermined number of input fibers 303a and a predetermined number of output fibers 303b. The micromirror array 301 includes a plurality of micromirror units 301a disposed correspondingly to the respective fibers 303a, 303b. The switching device 300 also includes a plurality of micro lenses 304 each of which is arranged in facing relation to the end of a corresponding fiber 303a or 303b.

In the device 300 again, the respective micromirror units 301a are adjustable in orientation to change the path of a light beam. Specifically, in the optical data transmission, a light beam L2 emitted from an input fiber 303a passes through the micro lens 304 and strikes upon a micromirror unit 301a (the "first micromirror unit" 301a). Reflected on the first micromirror unit 301a, the light beam L2 is directed toward the stationary mirror 302, and reflected on the mirror 302 to be directed back toward the micromirror array 301. As readily understood, the returned light beam can be caused to strike upon a selected micromirror unit 301a (the "second micromirror unit" 301a) by adjusting the orientation of the first micromirror unit 301a. With the second micromirror unit 301a properly oriented, the reflected light beam L2 is caused to enter a selected one of the output fibers 303b.

In the above-described switching devices 200 and 300, the structure of each micromirror unit influences the overall performance of the switching device. For instance, the switching accuracy or switching speed may be altered by structural change in the switching device. Further, the control method of adjusting the inclination angle of the mirror surface of a micromirror unit depends on the structure of the micromirror unit. If the control method can be simplified, it is possible to increase the control accuracy. In addition, the simplification of the control method will reduce the burden on a control/drive circuit of the device, thereby making it possible to downsize the switching device as a whole. Furthermore, optical monitoring and prevention of cross talk will also be simplified.

FIG. 41 shows a conventional two-axis type micromirror unit that can be incorporated in the above-described optical switching device 200 or 300. The illustrated micromirror unit 400 includes a mirror substrate 410 and a base substrate 420. The mirror substrate 410 is arranged above the base substrate 420 with non-illustrated spacers provided therebetween. The mirror substrate 410 includes a mirror forming base 411, an inner frame 412 and an outer frame 413. The mirror forming base 411 is connected to the inner frame 412 by a pair of first torsion bars 414. The inner frame 412 is connected to the outer frame 413 by a pair of second torsion bars 415. The first torsion bars 414 define a rotation axis about which the mirror forming base 411 is rotated relative to the inner frame 412. Similarly, the second torsion bars 415 define another rotation axis about which the inner frame 412 (and hence the mirror forming base 411) is rotated relative to the outer frame 413.

The lower surface of the mirror forming base 411 is provided with a pair of first conductive strips or electrodes 411a and 41b, while the upper surface of the base 411 is provided with a mirror surface (not shown) for reflecting light. The lower side of the inner frame 412 is provided with a pair of second conductive plates or electrodes 412a and 412b.

The base substrate 420 is provided with a pair of third conductive plates or electrodes 420a and 420b arranged in facing relation to the first electrodes 411a and 411b, respectively. In addition, the base substrate 420 is provided with a pair of fourth conductive plates or electrodes 420c and 420d arranged in facing relation to the second electrodes 412a and 412b, respectively. In the micromirror unit 400, the mirror forming base 411 is driven about the first or second torsion bars 414 or 415 by generating electrostatic force between the above-mentioned electrodes.

With the above arrangement, the mirror forming base 411 undergoes rotation in an M3-direction (called "M3-rotation" below) about the first torsion bars 414, for example when the first electrode 411a is charged positively and the third electrode 420a is charged negatively. As readily understood, the rotation is caused by the electrostatic force generated between the positive electrode 411a and the negative electrode 420a.

To cause the inner frame 412 (together with the mirror forming base 411) to undergo rotation in an M4-direction (called "M4-rotation" below) about the second torsion bars 415, the second electrode 412a is charged positively, while the fourth electrode 420c is charged negatively. FIG. 42 shows a state in which the inner frame 412 has undergone an M4-rotation of θ degrees. In this state, it is possible to additionally cause the mirror forming base 411 to undergo an M3-rotation by generating an electrostatic force between the first electrode 411a and the third electrode 420a.

In the flat state shown in FIG. 41 and the slant state shown in FIG. 42, the orientation of the first electrodes 411a, 411b relative to the third electrodes 420a, 420b is different. Therefore, even when the same voltage is applied between the first electrode 411a and the third electrode 420a, the electrostatic force to be generated between the two electrodes will be different in strength for the flat state (FIG. 41) and for the slant state (FIG. 42). As a result, the angle of the M3-rotation the mirror forming base 411 undergoes will be different for the two states.

Thus, when an M3-rotation of the same angle is desired for the flat state and for the slant state, a proper control is required for the voltage to be applied between the first electrode 411a and the third electrode 420a. Specifically, the voltage control needs to be performed in accordance with prestored data on M3-rotation angles and M4-rotation angles. Such a technique, however, tends to be troublesome due to the necessity of the collection of the angle data and the necessity of reference to the stored angle data in performing the voltage control. In addition, generally, such data is disadvantageously copious.

Due to the above drawbacks, it is difficult to increase the switching speed of the micromirror unit 400 in which a complicated voltage control is required. Also, the burden on the driving circuit of the unit 400 tends to become unduly heavy.

Another problem the micromirror unit 400 may encounter is a "pull-in phenomenon" of the inner frame 412 and the inner frame 412 due to the flat-electrode structure of the unit 400. Specifically, as noted above, the base substrate 420 is provided with flat electrodes 420a–420d, the mirror forming base 411 is provided with flat electrodes 411a and 411b, and the inner frame 412 is provided with flat electrodes 412a and 412b. With the close facing relation of these electrodes, the mirror forming base 411 and/or the inner frame 412 may be excessively drawn toward the base substrate 420 upon application of a certain voltage (known as "pull-in voltage"). In such an instance, it is impossible to control the inclination angle of the mirror forming base 411. This problem becomes more serious as a great inclination angle (no less than about 5 degrees) is desired.

One way to overcome the above problem is to use a "comb-teeth electrode design" for driving a micromirror unit instead of the above-described flat electrode design. FIG. 43 shows the basic structure of a micromirror unit employing a comb-teeth electrode design. The illustrated micromirror unit 500 includes a mirror forming base 510 (whose upper or lower side is provided with a mirror surface), an inner frame 520 and an outer frame 530 (depicted fragmentally). Each of the elements 510, 520 and 530 is formed integral with comb-teeth electrodes. Specifically, the mirror forming base 510 is provided with a pair of first comb-teeth electrodes 510a and 510b spaced from each other across the rectangular base 510. The inner frame 520 is provided with a pair of second comb-teeth electrodes 520a and 520b extending inward and corresponding to the first comb-teeth electrodes 510a and 510b, respectively. In addition, the inner frame 520 is provided with a pair of third comb-teeth electrodes 520c and 520d extending outward. In correspondence with the third comb-teeth electrodes, the outer frame 530 is provided with a pair of fourth comb-teeth electrodes 530a and 530b extending inward.

The mirror forming base 510 is connected to the inner frame 520 by a pair of first torsion bars 540. The inner frame 520 is connected to the outer frame 530 by a pair of second torsion bars 550. The first torsion bars 540 define a rotation axis about which the mirror forming base 510 is rotated relative to the inner frame 520. The second torsion bars 550 define another rotation axis about which the inner frame 520 (and hence the mirror forming base 510) is rotated relative to the outer frame 530.

Referring to FIG. 44A, the first comb-teeth electrode 510a and the adjacent second comb-teeth electrode 520a for example are vertically offset from each other when no driving voltage is applied. Then, upon application of the voltage, the first comb-teeth electrode 510a is drawn into the second comb-teeth electrode 520a, as shown in FIG. 44B, thereby moving the mirror forming base 510. More specifically, referring to FIG. 43, the first comb-teeth electrode 510a may be charged positively, while the second comb-teeth electrode 520a may be charged negatively. As a result, the mirror forming base 510 is rotated in an M5-direction as twisting the first torsion bars 540. On the other hand, when the third comb-teeth electrode 520c is charged positively and the fourth comb-teeth electrode 530a is charged negatively, the inner frame 520 is rotated in an M6-direction as twisting the second torsion bars 550.

With the illustrated comb-teeth design, the orientation of the first comb-teeth electrodes 510a, 510b relative to the second comb-teeth electrodes 520a, 520b is maintained (supposing that no voltage is applied across the first and the second electrodes) regardless of the inclination angle of the inner frame 520 relative to the outer frame 530. Therefore, the inclination angle of the mirror forming base 510 relative to the inner frame 520 can be controlled easily. Further, in accordance with the comb-teeth design, the electrostatic force for driving the base 510 generally acts in a direction perpendicular to the rotational movement of the mirror forming base 510. In this way, no "pull-in phenomenon" of the mirror forming base 510 will occur in operation of the micromirror unit 500. Thus, it is possible to rotate the mirror forming base 510 through a relatively great angle.

In the micromirror unit 500, the comb-teeth of the electrodes are caused to shift in position as the mirror forming base 510 and the inner frame 520 are rotating. Thus, the comb-teeth electrodes need to have a great thickness in accordance with the inclination angle of the base 510 and the frame 520. For instance, supposing that the body 511 of the mirror forming base 510 has a length D of about 1 mm, when the mirror forming base 510 is rotated relative to the inner frame 520 through 5 degrees about the first torsion bars 540, one end portion 511' of the body 511 will be lowered by 44 μm. Therefore, the thickness T of the first comb-teeth electrodes 510a, 510b needs to be 44 μm at least.

On the other hand, in order to obtain a relatively great rotation angle with a low driving voltage, the torsion bars 540, 550 should be small in thickness. In the conventional micromirror unit 500, however, the torsion bars 540, 550 are equal in thickness to the mirror forming base 510 and the inner and the outer frames 520, 530. This means that the torsion bars 540, 550 have a fairly great thickness. According to this design, when the thickness T of the first comb-teeth electrodes 510a, 510b is rendered no less than 44 μm for example, the thickness of the torsion bars 510a, 510b will also be no less than 44 μm. With such a thick torsion bar, a higher driving voltage is required to generate a greater electrostatic force between the relevant comb-teeth electrodes to twist the torsion bar appropriately. Alternatively, the width of the torsion bar may be reduced so that the torsion bar can be twisted with a smaller force. While such a width-reduction design may work to some extent, the torsion bar may still fail to provide desired twist-resisting characteristics.

SUMMARY OF THE INVENTION

The present invention has been proposed under the circumstances described above. It is, therefore, an object of the present invention to provide some solutions for overcoming or alleviating the above problems. More specifically, an object of the present invention is to provide a method of fabricating a micromirror unit including precisely thin torsion bars. Another object of the present invention is to provide a micromirror unit produced by this method.

According to a first aspect of the present invention, there is provided a method of making a micromirror unit from a material substrate. The material substrate may have a multi-layer structure which includes a plurality of silicon layers and at least one intermediate layer. The intermediate layer may be made of an insulating material. The micromirror unit may include a mirror forming base, a frame and a torsion bar. The method of making such a unit includes the following steps. First, a ore-torsion bar is formed by subjecting the silicon layers to etching. The resulting pre-torsion bar is smaller in thickness than the mirror forming base and held in contact with the intermediate layer.

Then, the desired torsion bar is formed by removing the intermediate layer contacting with the pre-torsion bar. It should be noted here that the above phrase "removing the intermediate layer contacting with the pre-torsion bar" does not mean that the entirety of the intermediate layer is removed. To be precise, the intermediate layer has a portion held in contact with the pre-torsion bar, and at least this particular portion is removed. The other portions of the intermediate layer, as will become clearer from the detailed description of the preferred embodiments, may remain or may partially be removed.

With the above method, an advantageously thin torsion bar can be formed at the desired position in the resulting micromirror unit. Specifically, as viewed in a thickness direction, the intermediate layer is held between at least two silicon layers of the material substrate. Then, one of the silicon layers contacting with the intermediate layer may be subjected to etching with the use of a suitable mask until the etching reaches the intermediate layer in a manner such that only predetermined portions of the intermediate layer are exposed through the etched away portions of the silicon layer in accordance with the pattern of the mask. A remaining portion of the silicon layer contacting with the intermediate layer serves as a "pre-torsion bar", that is, a prototype of the desired torsion bar. The pre-torsion bar is made to have a thickness, width and length corresponding to those of the desired torsion bar. The pre-torsion bar is rendered smaller in thickness than the other elements such as a mirror forming base, a frame, a comb-teeth electrode, etc., which may be required in a micromirror unit.

According to the above method, use is made of an intermediate layer upon which a pre-torsion bar is formed. The intermediate layer can be accurately formed at a desired position in the material substrate by a known layer forming technique. Accordingly, the pre-torsion bar (and hence the torsion bar), which is to be formed on the intermediate layer, can be formed at the initially expected position in the resulting micromirror unit. Further, in the above method, the etching to the silicon layer is performed with the intermediate layer used as a reference base. Thus, the thickness of the pre-torsion bar can be adjusted more finely than when no such intermediate layer is present in the material substrate.

According to a second aspect of the present invention, there is provided a method of making a micromirror unit including a mirror forming base, a frame and a torsion bar. The method includes the steps of: preparing a first material substrate having a multi-layer structure including a first silicon layer, a second silicon layer and an intermediate layer disposed between the first and the second silicon layers, wherein the first silicon layer has a thickness corresponding to the thickness of the torsion bar; providing a first mask pattern on the first silicon layer to mask a portion of the first silicon layer that is processed into the torsion bar; performing first etching until the first etching reaches the intermediate layer, so that a pre-torsion bar contacting with the intermediate layer is formed; attaching a third silicon layer to the first silicon layer for forming a second material substrate incorporating the pre-torsion bar; subjecting the second silicon layer to second etching by using a second mask pattern arranged to avoid a region corresponding to the pre-torsion bar, the second etching being continued until the intermediate layer is exposed; subjecting the third silicon layer to third etching by using a third mask pattern arranged to avoid a region corresponding to the pre-torsion bar, wherein the third etching is continued until the pre-torsion bar is exposed; and subjecting the intermediate layer exposed by the second etching to fourth etching for removing the intermediate layer contacting with the pre-torsion bar so that a torsion bar is obtained.

Preferably, the above method may further include the step of forming a fourth mask pattern to mask the pre-torsion bar, wherein the fourth mask pattern forming step is performed after the pre-torsion bar is formed in the first material substrate and before the second material substrate is formed. With such an arrangement, it is possible to prevent the pre-torsion bar from being unduly etched away in the third etching process.

According to a third aspect of the present invention, there is provided a method of making a micromirror unit including a mirror forming base, a frame and a torsion bar. The method includes the steps of: preparing a first material substrate having a multi-layer structure including a first silicon layer, a second silicon layer and an intermediate layer disposed between the first and the second silicon layers, wherein the first silicon layer has a thickness corresponding to the thickness of the torsion bar; forming a first mask pattern to mask a region of the first silicon layer that is to be processed into the torsion bar; attaching a third silicon layer to the first silicon layer; subjecting the second silicon layer to first etching by using a second mask pattern arranged to avoid a region for forming the torsion bar, the first etching being performed until the intermediate layer is exposed; forming a pre-torsion bar contacting with the intermediate layer by subjecting the third silicon layer to second etching using a third mask pattern arranged to avoid a region for forming the torsion bar, the second etching being continued until the first mask pattern and the intermediate layer are exposed; and subjecting the intermediate layer exposed by the first etching to third etching for removing the intermediate layer contacting with the pre-torsion bar so that the torsion bar is provided.

According to a fourth aspect of the present invention, there is provided a method of making a micromirror unit including a mirror forming base, a frame and a torsion bar. The method includes the steps of: preparing a material substrate having a multi-layer structure including a first silicon layer, a second silicon layer and an intermediate layer disposed between the first and the second silicon layers; forming a groove in the first silicon layer by subjecting the first silicon layer to first etching using a first mask pattern arranged to avoid a region in which the torsion bar is formed, the first etching being continued until the intermediate layer is exposed; coating the groove with a silicon material; subjecting the second silicon layer to second etching using a second mask pattern arranged to cover a region in which the torsion bar is formed, the second etching being continued until the intermediate layer is exposed; subjecting the intermediate layer exposed by the second etching to third etching performed on a side of the second silicon layer, the third etching being continued until the silicon material applied at the groove is exposed; performing fourth etching on a side of the second silicon layer to remove the silicon material exposed by the third etching, so that a pre-torsion bar made of the silicon material and contacting with the intermediate layer is obtained; and forming the torsion bar by removing the intermediate layer contacting with the pre-torsion bar.

According to a fifth aspect of the present invention, there is provided a method of making a micromirror unit including a mirror forming base, a frame and a torsion bar. The method includes the steps of: preparing a material substrate having a multi-layer structure including a first silicon layer, a second silicon layer and an intermediate layer disposed between the first and the second silicon layers; forming a groove in the first silicon layer by subjecting the first silicon layer to first etching using a first mask pattern arranged to avoid a region in which the torsion bar is formed, the first etching being performed until the intermediate layer is exposed; coating the groove with a silicon material; subjecting the silicon material applied at the groove to second etching using a second mask pattern to mask a region in which the torsion bar is formed, the second etching being continued until the intermediate layer is exposed, so that a pre-torsion bar made of the silicon material and contacting with the intermediate layer is obtained; subjecting the third silicon layer to third etching using a third mask pattern arranged to avoid a region corresponding to the pre-torsion bar, the third etching being performed until the intermediate layer is exposed; and subjecting the intermediate layer exposed in the third etching to fourth etching for removing the intermediate layer contacting with the pre-torsion bar, so that the torsion bar is obtained.

According to a sixth aspect of the present invention, there is provided a method of making a micromirror unit including a mirror forming base, a frame and a torsion bar The method includes the steps of: preparing a first material substrate including a first silicon layer; forming a groove in the first material substrate by first etching using a first mask pattern arranged to avoid a region in which the torsion bar is formed; coating the groove with an intermediate layer material; applying a silicon material on the coating of the intermediate layer material to fill the groove; forming a second material substrate having a multi-layer structure which includes the first material substrate, an intermediate layer covering the groove of the first material substrate and a second silicon layer contacting with the intermediate layer, the second material substrate incorporating a pre-torsion bar that is made of the silicon material and held in contact with the intermediate layer; subjecting the first silicon layer to second etching using a second mask pattern arranged to avoid a region corresponding to the pre-torsion bar, the second etching being performed until the intermediate layer material applied to the groove is exposed; subjecting the second silicon layer to third etching using a third mask pattern arranged to avoid a region corresponding to the pre-torsion bar, the third etching being continued until the intermediate layer is exposed; and subjecting the intermediate layer material exposed in the second etching and the intermediate layer exposed in the third etching to fourth etching for removing the intermediate layer material and the intermediate layer to provide the torsion bar.

According to a seventh aspect of the present invention, there is provided a method of making a micromirror unit including a mirror forming base, a frame and a torsion bar. The method includes the steps of: preparing a first material substrate including a first silicon layer; subjecting the first material substrate to first etching using a first mask pattern arranged to mask a region to be processed into the torsion bar, the first etching being continued until the etching reaches a depth corresponding to a thickness of the torsion bar; preparing a second material substrate having a multi-layer structure which includes the first material substrate, an intermediate layer held in contact with an etched surface of the first material substrate and a second silicon layer held in contact with the intermediate layer; subjecting the second silicon layer to second etching using a second mask pattern arranged to avoid a region in which the torsion bar is formed, the second etching being continued until the intermediate layer is exposed; subjecting the first silicon layer to third etching using a third mask pattern arranged to avoid a region in which the torsion bar is formed, so that a pre-torsion bar contacting with the intermediate layer is obtained; and subjecting the intermediate layer exposed in the second etching to fourth etching for removing the intermediate layer contacting with the pre-torsion bar, so that the torsion bar is provided.

According to an eighth aspect of the present invention, there is provided a method of making a micromirror unit including a mirror forming base, a frame and a torsion bar. The method includes the steps of: preparing a material substrate having a multi-layer structure including a first silicon layer, a second silicon layer and an intermediate layer disposed between the first and the second silicon layer; subjecting the first silicon layer to first etching using a first mask pattern and a second mask pattern, the first mask pattern being arranged to mask a region in which the torsion bar is formed, the second mask pattern being arranged to avoid a region in which the torsion bar is formed, the first etching being continued until the etching reaches a depth corresponding to a thickness of the torsion bar; removing the first mask pattern; subjecting the first silicon layer to second etching using the second mask pattern, the second etching being continued until the intermediate layer is exposed, so that a pre-torsion bar contacting with the intermediate layer is obtained; subjecting the second silicon layer to third etching using a third mask pattern arranged to avoid a region corresponding to the pre-torsion bar, the third etching being continued until the intermediate layer is exposed; subjecting the intermediate layer exposed in the third etching to fourth etching for removing the intermediate layer contacting with the pre-torsion bar to provide the torsion bar.

According to a ninth aspect of the present invention, there is provided a method of making a micromirror unit including a mirror forming base, a frame and a torsion bar. The method includes the steps of: preparing a material substrate having a multi-layer structure which includes a first silicon layer, a second silicon layer having a thickness corresponding to the thickness of the torsion bar, a third silicon layer, a first intermediate layer between the first and the second silicon layers, and a second intermediate layer between the second and the third silicon layers; subjecting the first silicon layer to first etching using a first mask pattern and a second mask pattern, the first mask pattern being arranged to mask a region in which the torsion bar is formed, the second mask pattern being arranged to avoid a region in which the torsion bar is formed, the first etching being continued until the etching reaches a depth corresponding to a thickness of the torsion bar; removing the first mask pattern; subjecting the first silicon layer to second etching using the second mask pattern, the second etching being continued until the first intermediate layer is exposed, so that a third mask pattern is formed at the first silicon layer disposed on the first intermediate layer; subjecting the first intermediate layer exposed in the second etching to third etching using the third mask pattern, the third etching being continued until the second silicon layer is exposed, so that a fourth mask pattern is formed at the first intermediate layer disposed on the second silicon layer; subjecting the second silicon layer exposed in the third etching to fourth etching using the fourth mask pattern, the fourth etching being continued until the second intermediate layer is exposed, so that a pre-torsion bar is formed between the first and the second intermediate layers; subjecting the third silicon layer to fifth etching using a fifth mask pattern arranged to avoid a region corresponding to the pre-torsion bar, the fifth etching being continued until the second intermediate layer is exposed; and performing sixth etching to the second intermediate layer exposed in the fifth etching and to the first intermediate layer on the pre-torsion bar, so that the first and the second intermediate layers contacting with the pre-torsion bar are removed to provide the torsion bar.

In the above second etching, a comb-teeth electrode may be formed at one of the mirror forming base and the frame. Alternatively, use is made of an etching process other than the second etching for forming a comb-teeth electrode at the mirror forming base and/or the frame.

According to a tenth aspect of the present invention, there is provided a method of making a micromirror unit including a mirror forming base, frames and a torsion bar. The method includes the steps of: preparing a material substrate having a multi-layer structure which includes a first silicon layer, a second silicon layer having a thickness corresponding to a thickness of the torsion bar, a third silicon layer, a first intermediate layer between the first and the second silicon layers, and a second intermediate layer between the second and the third silicon layers; subjecting the first silicon layer to first etching using a first mask pattern arranged to avoid a region in which the torsion bar is formed, the first etching being continued until the first intermediate layer is exposed; forming a second mask pattern on the first intermediate layer exposed in the first etching, the second mask pattern being arranged to mask a region in which the torsion bar is formed; subjecting the first intermediate layer to second etching using the second mask pattern, the second etching being continued until the second silicon layer is exposed; removing the first mask pattern; subjecting the second silicon layer to third etching using the first intermediate layer exposed by the removal of the first mask pattern, the third etching being continued until the second intermediate layer is exposed, so that a pre-torsion bar contacting with the first and the second intermediate layers is obtained; subjecting the third silicon layer to fourth etching using a third mask pattern arranged to avoid a region corresponding to the pre-torsion bar, the fourth etching being continued until the second intermediate layer is exposed; and performing fifth etching to the second intermediate layer exposed in the fourth etching and to the first intermediate layer on the pre-torsion bar, so that the first and the second intermediate layers contacting with the pre-torsion bar are removed to provide the torsion bar.

In the above methods, the etching performed to each silicon layer may be inductively coupled plasma etching. With this, it is possible to perform highly anisotropic etching.

The frames may include a first frame and a second frame connected to the first frame by a torsion bar.

According to an eleventh aspect of the present invention, there is provided a micromirror unit which includes: a mirror forming base; frames having a multi-layer structure including a plurality of silicon layers and at least one intermediate layer; and a torsion bar which is smaller in thickness than the mirror forming base, the torsion bar defining an axis about which the mirror forming base is rotated relative to the frames, the torsion bar having an end connected to a portion of the silicon layers that is held in contact with the intermediate layer.

The above frames may include a first frame and a second frame each of which includes a silicon layer and an intermediate layer held in contact with the silicon layer, a torsion bar having one end connected to the silicon layer of the first frame and another end connected to the silicon layer of the second frame.

The frames may include two intermediate layers between which only one of the silicon layers is disposed, wherein the torsion bar is connected to said one of the silicon layers.

In a preferred embodiment, the frames of a micromirror unit may include first and second frames each of which includes two intermediate layers between which only one silicon layer is disposed, wherein the torsion bar has one end connected to said one silicon layer of the first frame and another end connected to said one silicon layer of the second frame.

The mirror forming base of a micromirror unit may be provided with a first comb-teeth electrode, while the frames may be provided with a second comb-teeth electrode cooperating with the first comb-teeth electrode to move the mirror forming base. When the frames include a first frame and a second frame, the first frame may be provided with a third comb-teeth electrode, while the second frame may be provided with a fourth comb-teeth electrode cooperating with the third comb-teeth electrode to move the first frame and the mirror forming base.

Other features and advantages of the present invention will become apparent from the detailed description given below with reference to the accompanying drawings.

BRIEF DESCRIPTION OF THE DRAWINGS

FIGS. 2A, 2B and 2C are sectional views taken along lines A—A, B—B and C—C, respectively, in FIG. 1;

FIGS. 3A–3D, 4A–4E, 5A–5D, 6A–6D and 7A–7D are sectional views illustrating a micromirror unit fabrication method according to a second embodiment of the present invention;

FIGS. 24A–24D and 25A–25C are sectional views illustrating a micromirror unit fabrication method according to an eighth embodiment of the present invention;

FIGS. 28A–28D and 29A–29D are sectional views illustrating a modified version of a micromirror unit fabrication method according to the ninth embodiment of the present invention, in which a torsion bar and a comb-teeth electrode are made in the same etching process;

FIGS. 30A–30E, 31A–31E, 32A–32E and 33A–33F are sectional views illustrating a modified version of a micromirror unit fabrication method according to the ninth embodiment of the present invention, in which a torsion bar and a comb-teeth electrode are made in different etching process;

DETAILED DESCRIPTION OF THE PREFERRED EMBODIMENT

The preferred embodiments of the present invention will be described below with reference to the accompanying drawings.

Figure 1A:
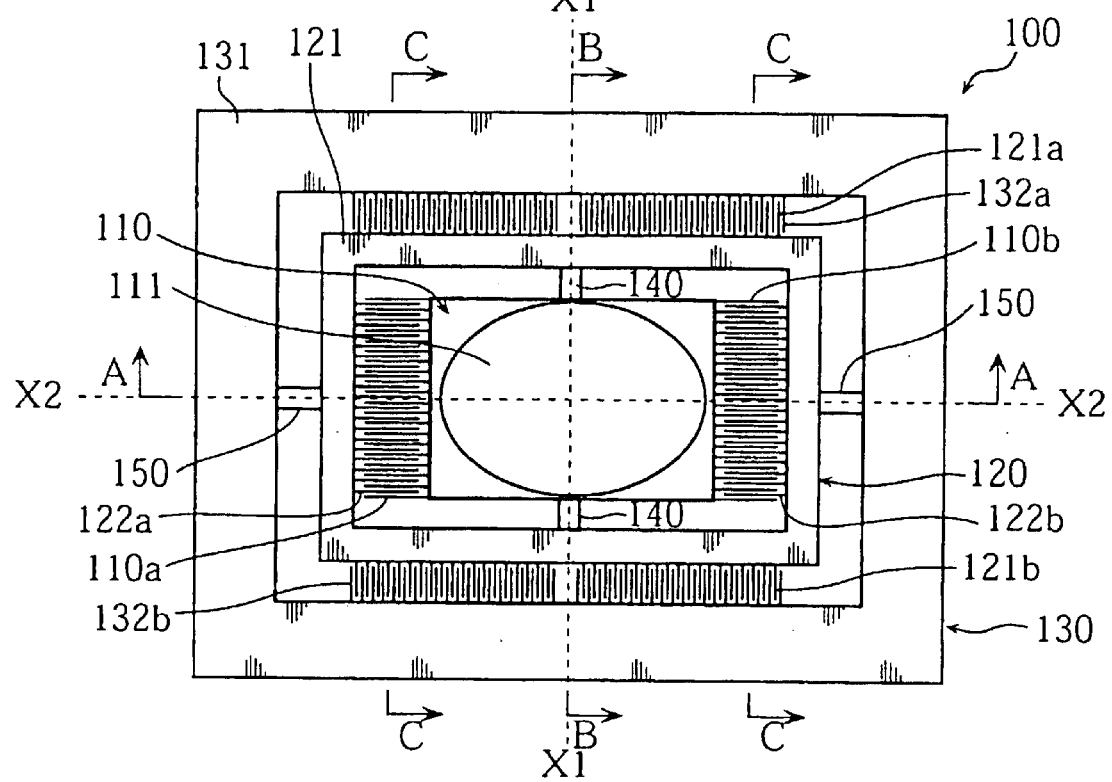
FIG. 1A is a top view showing a micromirror unit according to a first embodiment of the present invention.
Figure 1B:
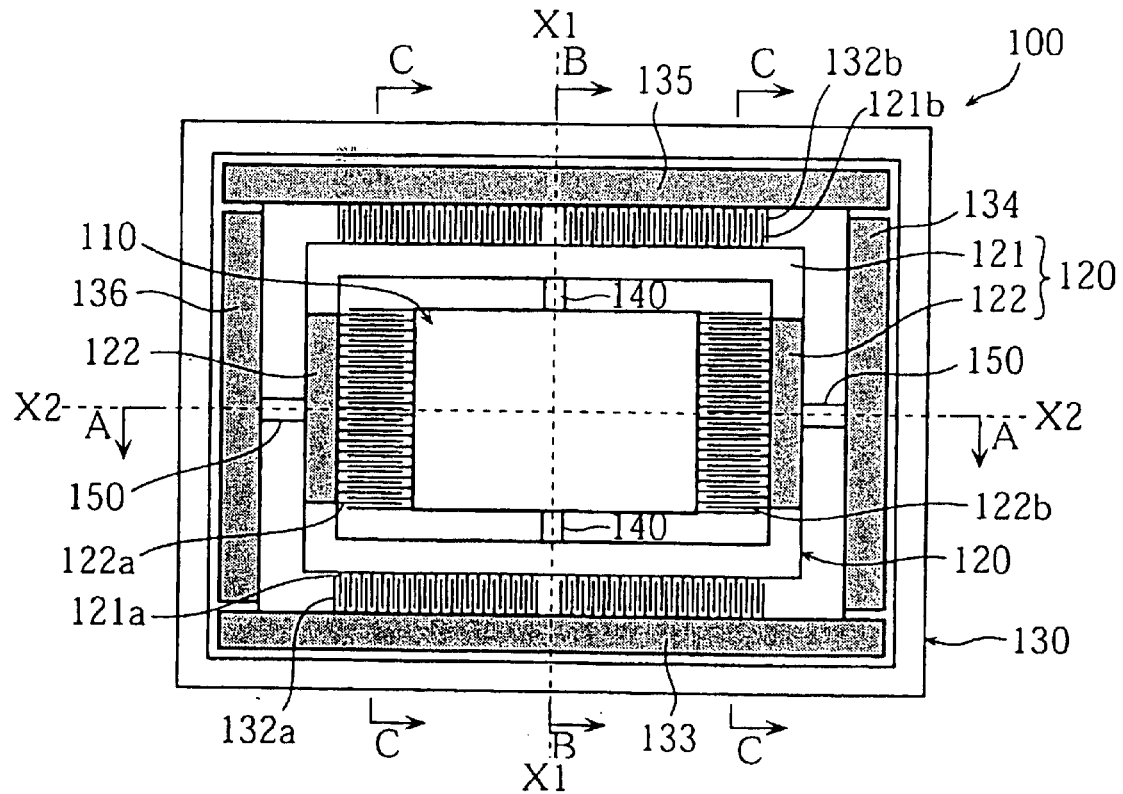
FIG. 1B is a bottom view showing the micromirror unit of FIG. 1A.

FIGS. 1A–1B and 2A–2C show a micromirror unit 100 according to a first embodiment of the present invention. FIG. 1A is an upper-side plan view of the unit 100, while FIG. 1B is a lower-side plan view of the unit 100. FIGS. 2A–2C are sectional views taken along lines A—A, B—B and C—C, respectively, in FIG. 1.

As shown in FIGS. 1A and 1B, the micromirror unit 100 includes a mirror forming base 110, an inner frame 120 (surrounding the base 110), an outer frame 130 (surrounding the inner frame 120), a pair of first torsion bars 140 (connecting the mirror forming base 110 to the inner frame 120) and another pair of second torsion bars 150 (connecting the inner frame 120 to the outer frame 130). The first torsion bars 140 define a first rotation axis X1 about which the mirror forming base 110 is rotated relative to the inner frame 120. The second torsion bars 150 define a second rotation axis X2 about which the inner frame 120 (together with the mirror forming base 110) is rotated relative to the outer frame 130. In the illustrated example, the first axis X1 and the second axis X2 are generally perpendicular to each other. The micromirror unit 100 as a whole is made of a conductive material except for a mirror surface 111 and an insulating layer 160 (to be described later). A conductive material may be silicon (or polysilicon) doped with n-type impurity (e.g. phosphorus or arsenic) or p-type impurity (e.g. boron).

As shown in FIG. 1A, the mirror forming base 110 has an upper surface upon which a mirror member 111 is formed. Also, the base 110 includes two opposing side surfaces from which first comb-teeth electrodes 110a, 110b extend laterally.

As shown in FIG. 1B and FIG. 2, the inner frame 120 has a multi-layer structure composed of an inner frame body 121, a pair of electrode bases 122 and an insulating layer 160 disposed between the body 121 and the bases 122. The insulating layer 160 is made of silicon oxide. Each of the electrode bases 122 is formed integral with a second comb-teeth electrode 122a or 122b extending inward. The inner frame body 121 is formed integral with third comb-teeth electrodes 121a and 121b extending outward. As shown in FIG. 2A, the second comb-teeth electrodes 122a, 122b are disposed below the first comb-teeth electrodes 110a, 110b. When the mirror forming base 110 is driven, the first comb-teeth electrodes 110a, 110b may be moved downward. To avoid the interference between the first and the second comb-teeth electrodes, the first comb-teeth electrodes 110a, 110b are laterally offset from the second comb-teeth electrodes 122a, 122b, as shown in FIG. 2C.

As shown in FIG. 2B, the first torsion bars 140 are made smaller in thickness than the mirror forming base 110. The inner end of each bar 140 is connected to the mirror forming base 110, while the outer end of the bar 140 is connected to the inner frame body 121.

As shown in FIG. 2A, the outer frame 130 is composed of a first outer frame member 131, a second outer frame member 132 and an insulating layer 160 disposed between the first and the second outer frame members. The second outer frame member 132, as shown in FIG. 1B, is provided with a first island 133, a second island 134, a third island 135 and a fourth island 136 all of which are separated from each other by an gap. As shown in FIGS. 2B and 2C, each of the first island 133 and the third island 135 is formed integral with a fourth comb-teeth electrode 132a or 132b extending inward. The fourth comb-teeth electrodes 132a, 132b are disposed below the third comb-teeth electrodes 121a, 121b of the inner frame body 121. Laterally, the fourth and the third comb-teeth electrodes are offset from each other so that they do not interfere with each other in operation.

As shown in FIG. 2A, each of the second torsion bars 150 is connected, at its inner end, to a portion of the inner frame body 121 that is held in contact with the insulating layer 160, and also connected, at its outer end, to a portion of the first outer frame member 131 that is held in contact with the insulating layer 160.

In the illustrated example, when voltage is applied to the first outer frame member 131, the first comb-teeth electrodes 110a, 110b and the third comb-teeth electrodes 121a, 121b are held at the same electrical potential. This is because the first outer frame member 131, the second torsion bars 150, the inner frame body 121, the first torsion bars 140 and the mirror forming base 110 are integrally made of the same silicon-base material. With the above-mentioned electrodes held at the same potential, the second comb-teeth electrode 122a or 122b is charged accordingly so that an electrostatic force is generated between the first comb-teeth electrode 110a and the second comb-teeth electrode 122a, or, between the first comb-teeth electrode 10b and the second comb-teeth electrode 122b, thereby rotating the mirror forming base 110 about the first axis X1. As readily understood, to rotate the mirror forming base 110 together with the inner frame 120 about the second axis X2, an electrostatic force is generated between the third comb-teeth electrode 121a and the fourth comb-teeth electrode 132a, or, between the third comb-teeth electrode 121b and the fourth comb-teeth electrode 132b. To this end, the fourth comb-teeth electrode 132a or 132b is charged to a predetermined potential.

Reference is now made to FIGS. 3A–3D, 4A–4E, 5A–5D, 6A–6D and 7A–7D illustrating a micromirror unit fabrication method according to a second embodiment of the present invention. This method employs a micro-machining technique and can produce the above-described micromirror unit 100 in the following manner. It should be noted that each of the figures presents a sectional view which appears to be flat, though this is done only for simplicity of illustration. In reality, the section is not taken linearly but taken zigzaggedly. More specifically, a mirror forming portion M represents a sectional view of the mirror forming base 110. Likewise, a torsion bar portion T represents a sectional view of the first torsion bars 140 and 150. A comb-teeth electrode portion E1 represents a sectional view of the first and the second comb-teeth electrodes 110a, 110b, 122a and 122b. A comb-teeth electrode portion E2 represents a sectional view of the third and the fourth comb-teeth electrodes 121a, 121b, 132a and 132b. The top and down of each sectional view shown in FIGS. 3–7 are opposite to those of the sectional views shown in FIG. 2.

In fabricating a micromirror unit 100, to begin with, a first SOI (Silicon on Insulator) wafer 1 is prepared. The wafer 1 has a multi-layer structure composed of a relatively thin first silicon layer 11, a relatively thick second silicon layer 12 and an insulating layer 160 held between the first and the second silicon layers 11, 12. The first silicon layer 11 is made of a conductive silicon material (or polysilicon material) doped with n-type impurity (e.g. phosphorus or arsenic). The second silicon layer 12 is also made of a conductive silicon material doped with n-type impurity (e.g. phosphorus or arsenic). For providing conductivity, the silicon material may be doped with p-type impurity (e.g. boron). The insulating layer 160 is made up of silicon oxide produced in a surface of the first or second silicon layer 11 or 12 by thermal oxidation or CVD (chemical vapor deposition). After the insulating layer 160 is produced, the first silicon layer 11 and the second silicon layer 12 are fixed to each other. Thus, the first SOI wafer 1 is obtained. In the illustrated example, the first silicon layer 11 has a thickness of 5 μm, the second silicon layer 12 has a thickness of 100 μm, and the insulating layer 160 has a thickness of 1 μm.

Then, a film of silicon oxide is grown on the second silicon layer 12 by thermal oxidation. This oxide film is subjected to patterning, as shown in FIG. 3B, so that an oxide film pattern 51 is formed. The patterning of the oxide film may be performed with the use of an etchant such as buffered hydrofluoric acid (produced by Daikin Industries, Ltd.) composed of hydrofluoric acid and ammonium fluoride. This etchant may be used for the subsequent oxide film patterning (to be described later). The oxide film pattern 51 covers portions of the second silicon layer 12 that will be processed into a comb-teeth electrode portion E2 and a frame. More specifically, referring to FIG. 1B, the pattern 51 has been configured in a manner corresponding to the electrode bases 122, the second comb-teeth electrodes 122a–122b, the first to the fourth islands 133–136 of the second outer frame member 132 and the fourth comb-teeth electrodes 132a–132b. Further, a photoresist film is formed on the first silicon layer 11 by spin coating. This film is processed into a resist pattern 52 by exposure of light and development. An example of photoresist material may be AZP4210 (produced by Clariant Japan) or AZ1500 (produced by Clariant Japan). The same material may be used for the subsequent similar procedures. The resist pattern 52 covers portions of the first silicon layer 11 that correspond to the mirror forming portion M, the torsion bar portion T, the comb-teeth electrode portion E1 and the frame forming portion.

Then, as shown in FIG. 3C, the first silicon layer 11 is subjected to DRIE (Deep Reactive Ion Etching) using the resist pattern 52 as a mask until the etching reaches the insulating layer 160. In the DRIE, the "Bosch process" is adopted, whereby etching and side wall protection are alternatively performed. Specifically, a first etching step may be performed for 8 seconds by using SF6 gas, and then a first side wall protection step may be performed for 6.5 seconds by using C4F8 gas. Thereafter, these two steps may be repeated several times. In the process, a bias of 23 watts is applied to the wafer for attaining proper etching.

The above-described Bosch process may be adopted in the subsequent DRIE for a silicon layer and a polysilicon layer. Instead of DRIE, wet etching with the use of e.g.

KOH solution may be performed. It is also possible to employ inductively coupled plasma etching, whereby etching is performed in high density plasma.

As the result of the etching process to the first silicon layer 11, a pre-torsion bar T' (which will become a torsion bar T later) is formed. The pre-torsion bar t' is held in contact with the insulating layer 160 and has a thickness of 5 μm. After the pre-torsion bar T' is formed, the resist pattern 52 is removed by using an exfoliation solution such as AZ Remover 200 (produced by Clariant Japan). The same exfoliation solution may be used for the subsequent removal of resist patterns.

Then, as shown in FIG. 3D, a third silicon layer 13 is attached to the wafer 1 on the lower side (in the figure) where the pre-torsion bar T' has been formed. Thus, a second SOI wafer 2, which incorporates the pre-torsion bar T', is obtained. The attachment of the layer 13 is performed under vacuum. At this time, the wafer 1 and the third silicon layer 13 may preferably be heated up to 1100° C. The third silicon layer 13 is made of a conductive silicon material doped with impurities and has a thickness of 100 μm. In place of the third silicon layer 13, use may be made of a silicon wafer having a thickness of 300 μm. This initially thick wafer is attached to the wafer 1 and then subjected to grinding to be made 100 μm in thickness.

Figure 4A:
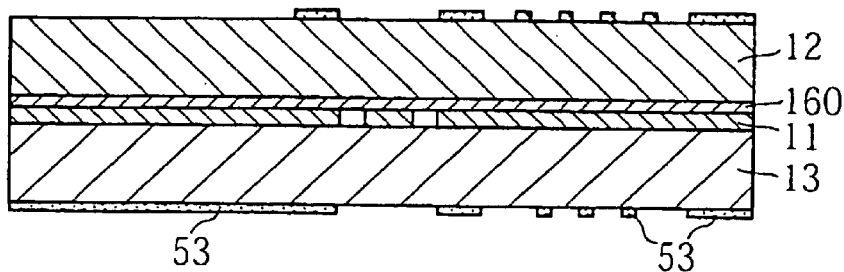

Then, as shown in FIG. 4A, an oxide film pattern 53 is formed on the third silicon layer 13. The pattern 53 is made by patterning an oxide film which is grown on the layer 13 by thermal oxidation. The oxide film pattern 53 covers portions of the third silicon layer 13 that correspond to the mirror forming portion M, the comb-teeth electrode portion E1 and the frames. Specifically, the pattern 53 is configured in accordance with the mirror forming base 110 (see FIG. 1A), the first comb-teeth electrodes 110a–110b, the inner frame body 121, the third comb-teeth electrodes 121a–121b and the first outer frame member 131.

Figure 4B:
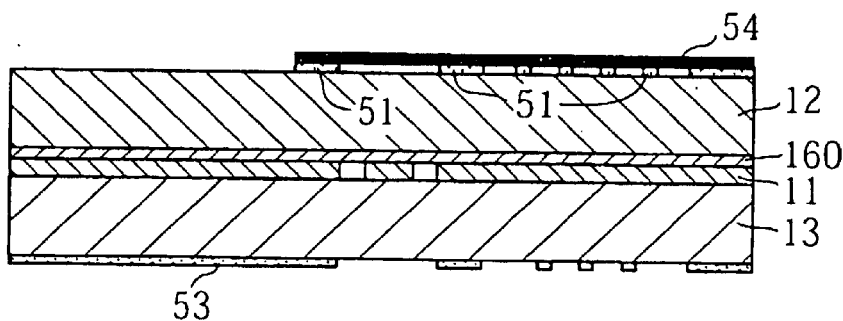

Then, as shown in FIG. 4B, a photoresist pattern 54 is formed on the second silicon layer 12. The pattern 54 may be made by subjecting a photoresist film to exposure of light and development. The pattern 54 covers the second silicon layer 12 except for a region thereof corresponding to the mirror forming portion M. For simplicity of illustration, referring to FIG. 4B, the resist pattern 54 is depicted as being spaced from the second silicon layer 12. In reality, however, the pattern 54, covering the oxide film pattern 51, is held in contact with the second silicon layer 12. The same simplicity scheme holds for the subsequent depiction of a resist pattern formed on the silicon layers.

Figure 4C:
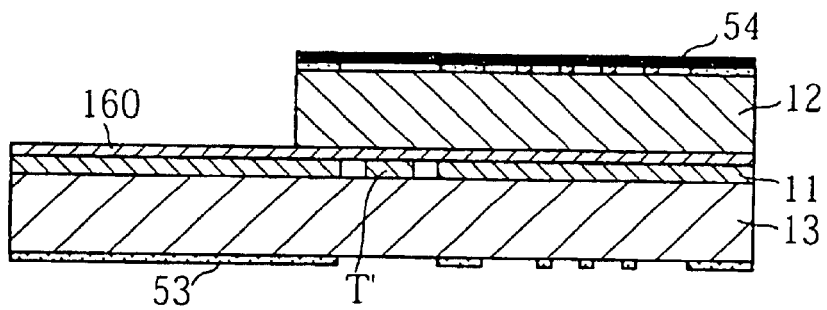

Then, as shown in FIG. 4C, the second silicon layer 12 is subjected to DRIE, with the resist pattern 54 used as a mask. The DRIE continues until the etching reaches the insulating layer 160. As a result, the uncovered portion of the layer 12 is etched away, thereby exposing a part of the insulating layer 160. The insulating layer 160 remains substantially intact through the DRIE using SF6 gas and C4F8 gas.

Figure 4D:
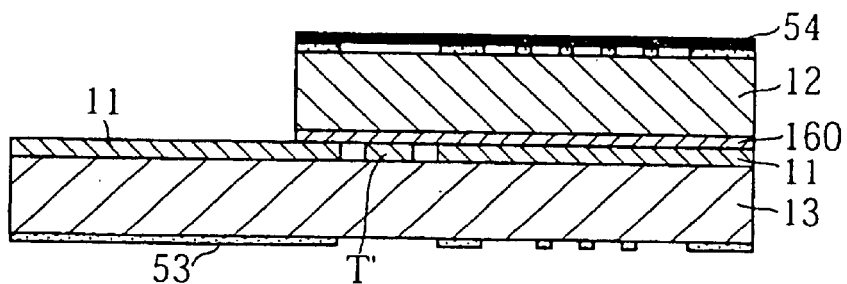

Then, as shown in FIG. 4D, the exposed part of the insulating layer 160 is removed by etching, whereby the first silicon layer 11 is partially exposed. The etchant suitable for the layer 160 (made of silicon oxide) may be buffered hydrofluoric acid composed of hydrofluoric acid and ammonium fluoride.

Figure 4E:
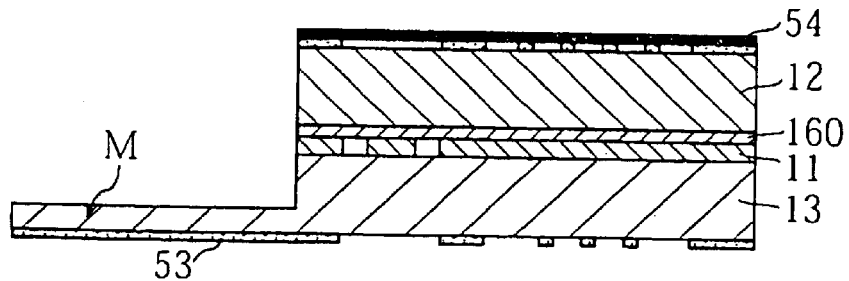

Then, as shown in FIG. 4E, the exposed part of the first silicon layer 11 and the underlying part of the third silicon layer 13 are removed by DRIE. In this manner, a part of the mirror forming portion M is reduced in thickness by a predetermined amount. Due to the partial reduction in thickness, the mirror forming portion M is reduced in weight. This is advantageous to improving the speed of the operation of the mirror forming base 110 in a product micromirror unit 100.

Figure 5A:
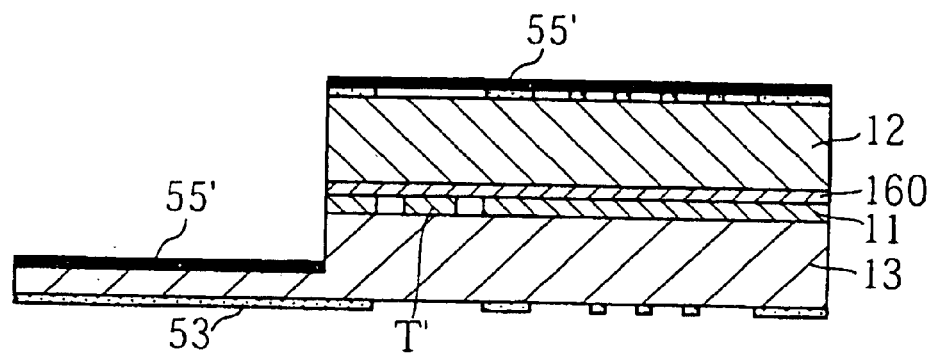

Then, the resist pattern 54 is removed. Next, as shown in FIG. 5A, a photoresist 55' is formed by spraying a photoresist solution from above. The photoresist solution may be AZP4210 (produced by Clariant Japan) which is diluted with AZ5200 thinner (produced by Clariant Japan). The concentration of the resulting solution may be one fifth of the original concentration of the AZP4210 (five-times dilution).

Figure 5B:
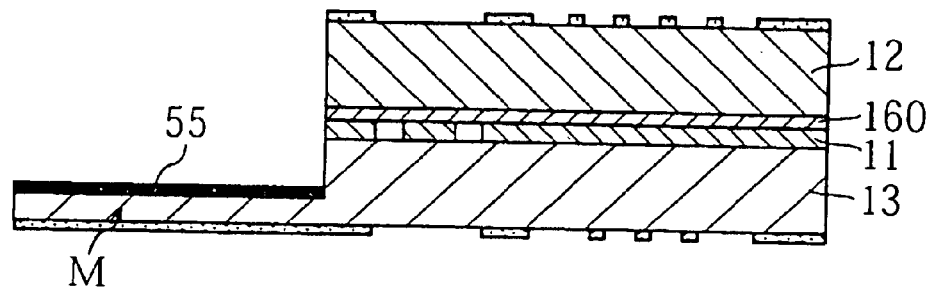

Then, the photoresist 55' is exposed to light and developed, to be processed into a resist pattern 55, as shown in FIG. 5B. Specifically, the photoresist 55' on the second silicon layer 12 is removed at this stage. The resist pattern 55 covers the bottom side of the mirror forming portion M in the third silicon layer 13.

Figure 5C:
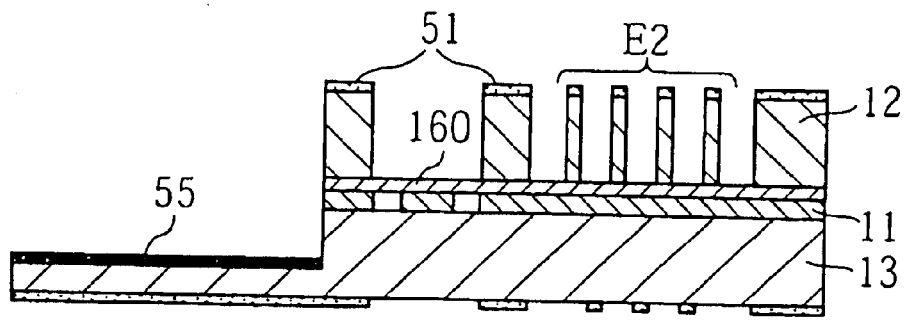
Figure 5D:
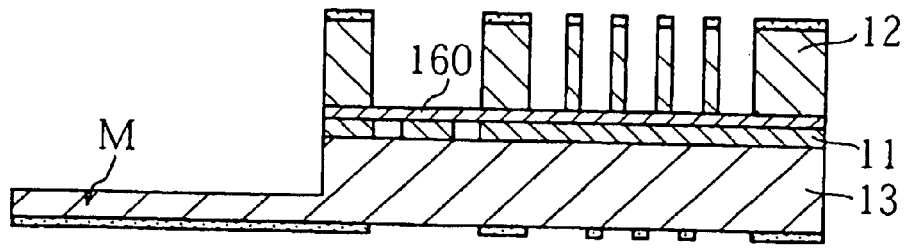

Then, as shown in FIG. 5C, the second silicon layer 12 is subjected to DRIE with the oxide film pattern 51 used as a mask until the etching reaches the insulating layer 160. As a result, the comb-teeth electrode E2 is formed. At this stage, the mirror forming portion M is not affected by the etchant due to the masking of the resist pattern 55. Thereafter, as shown in FIG. 5D, the resist pattern 55 is removed from the bottom side of the mirror forming portion M.

Figure 6A:
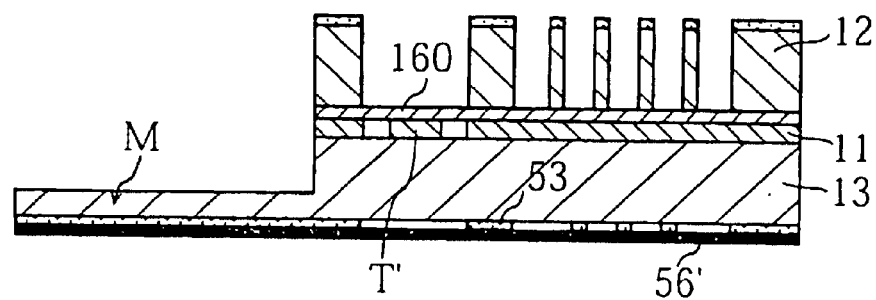
Figure 6B:
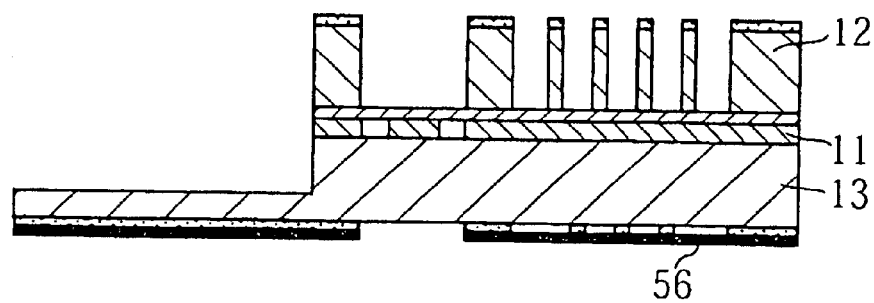

Then, as shown in FIG. 6A, a photoresist 56' is formed on the third silicon layer 13 by spin coating. The photoresist 56' is then exposed to light and developed, to be processed into a resist pattern 56, as shown in FIG. 6B. The resist pattern 56 covers regions of the third and the first silicon layers 13, 11 that correspond to the mirror forming portion M, the comb-teeth electrode E1 and the frame.

Figure 6C:
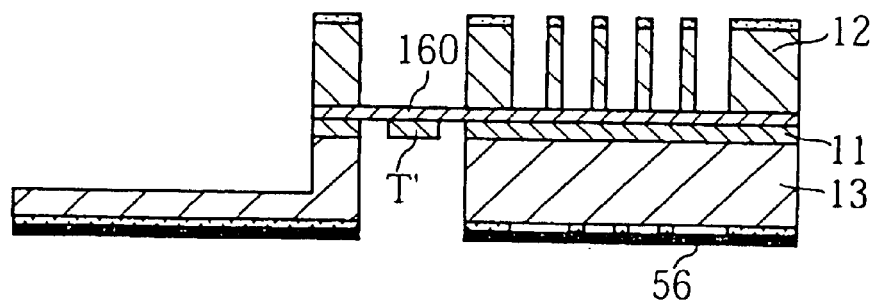
Figure 6D:
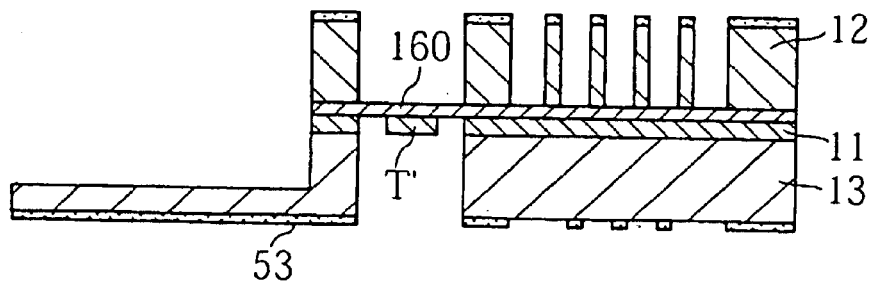

Then, as shown in FIG. 6C, the third and the first silicon layers 13, 11 are subjected to DRIE with the resist pattern 56 used as a mask until the pre-torsion bar T' is exposed. Thereafter, as shown in FIG. 6D, the resist pattern 56 is removed.

Figure 7A:
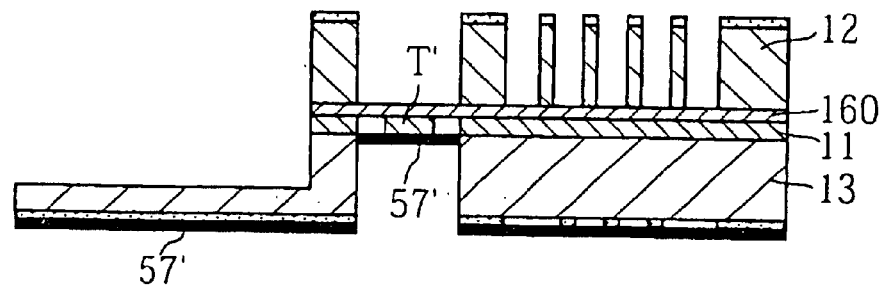
Figure 7B:
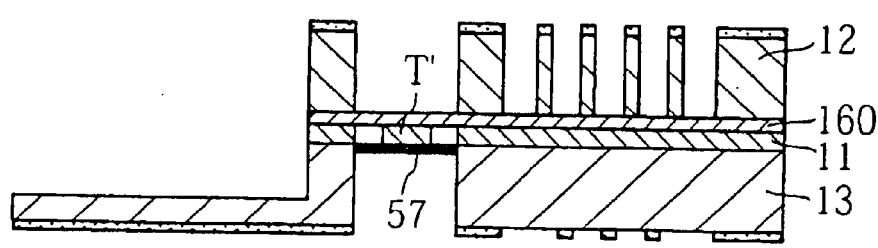

Then, as shown in FIG. 7A, a photoresist 57' is formed by spraying the material from below (in FIG. 7A). The photoresist 57' is then subjected to exposure of light and development, to be processed into a resist pattern 57, as shown in FIG. 7B. The resist pattern 57 covers the pre-torsion bar T'.

Figure 7C:
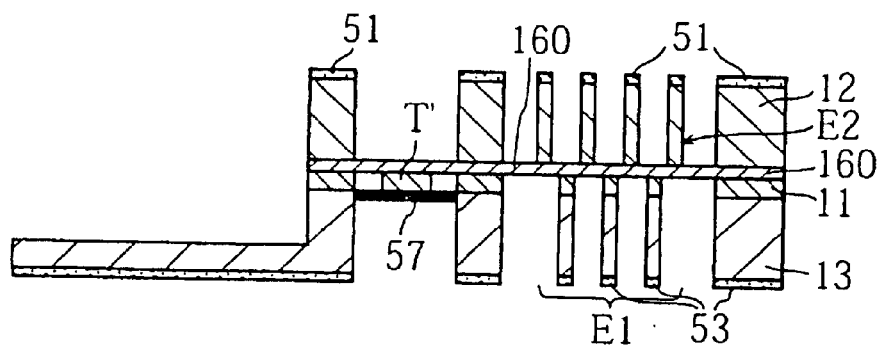

Then, as shown in FIG. 7C, the third and the first silicon layers 13, 11 are subjected to DRIE with the oxide film pattern 53 used as a mask until the etching reaches the insulating layer 160. As a result, the comb-teeth electrode E1 is obtained. At this stage, the pre-torsion bar T' is not affected by the etching due to the masking of the resist pattern 57.

Figure 7D:
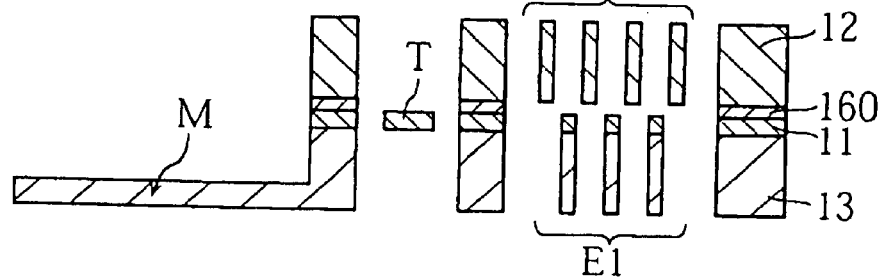

Then, after the resist pattern 57 is removed, the exposed part of the insulating layer 160 is etched away, as shown in FIG. 7D, by immersion in the etchant. At this time, the exposed oxide film patterns 51, 53 are also removed. As a result, upper and lower comb-teeth electrodes E1, E2 having a thickness of 100 μm are obtained. Also, a thin torsion bar T is obtained. The torsion bar T is located exactly at the vertical center of the second SOI wafer 2 and has a precise thickness of 5 μm. In addition, a mirror forming portion M, which is partially reduced in thickness, is obtained. Accordingly, a micromirror unit 100 drivable with low power is obtained.

Reference is now made to FIGS. 8A–8E, 9A–9E, 10A–10D, 11A–11D and 12A–12D illustrating a micromirror unit fabrication method according to a third embodiment of the present invention. In the illustrated example, the method is used for making the above-described micromirror unit 100.

According to the fabrication method of the third embodiment, to begin with, a first SOI wafer 1 (FIG. 8A) is prepared through the same steps as described above with reference to FIGS. 3A–3C. The wafer 1 shown in FIG. 8A includes a first silicon layer 11, a second silicon layer 12, an oxide film pattern 51, a resist pattern 52 and a pre-torsion bar T'. The oxide film pattern 51 is formed on the second silicon layer 12. The pre-torsion bar T' is formed in the first silicon layer 11 by DRIE with the resist pattern 52 used as a mask. The pre-torsion bar T' has a thickness of 5 µm.

Figure 8A:
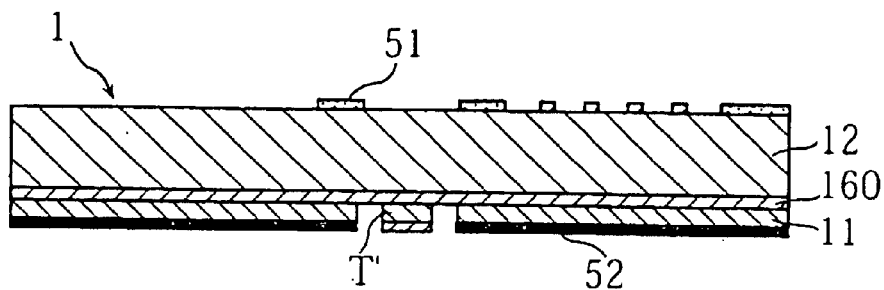
FIGS. 8A–8E, 9A–9E, 10A–10D, 11A–11D and 12A–12D are sectional views illustrating a micromirror unit fabrication method according to a third embodiment of the present invention.
Figure 8B:
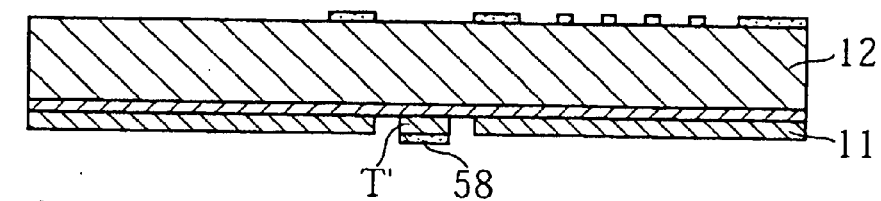

Then, the resist pattern 52 is removed. Thereafter, an oxide film is formed on the first silicon layer 11 by thermal oxidation. This film is processed into an oxide film pattern 58, as shown in FIG. 8B. The pattern 58 is used for the masking of a pre-torsion bar T' at a latter etching process.

Figure 8C:
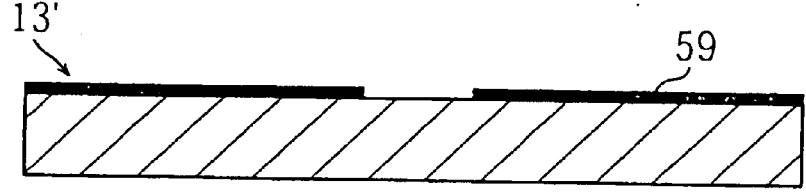

According to the illustrated method, a silicon wafer 13' (see FIG. BC) is also prepared together with the first wafer 1. (After being attached to the first wafer 1, the silicon wafer 13' may be referred to as a third silicon layer 13.) A photoresist film is formed on the wafer 13' and subjected to light exposure and development. Thus, as shown in FIG. 8C, a resist pattern 59 is obtained. The wafer 13' is made of a conductive silicon material doped with an impurity and has a thickness of 100 µm. The resist pattern 59 covers regions of the wafer 13' that correspond to a mirror forming portion M, a comb-teeth electrode E1 and a frame.

Figure 8D:
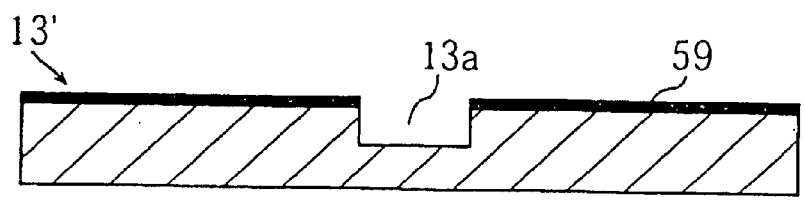

Then, as shown in FIG. 8D, the wafer 13' is subjected to DRIE with the resist pattern 59 used as a mask until the etching reaches a predetermined depth. As a result, a groove 13a is formed. Then, the resist pattern 59 is removed.

Figure 8E:
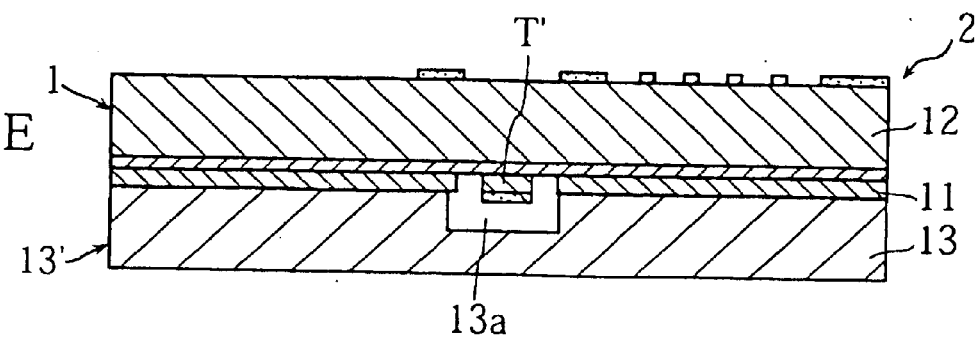

Then, as shown in FIG. 8E, the wafer 13' is attached to the first silicon layer 11 of the first wafer 1 under vacuum. For proper attachment, the wafers 1 and 13' are heated up to 1100° C. The first wafer 1 is positioned to the counterpart wafer 13' so that the pre-torsion bar T' faces the groove 13a formed in the wafer 13'. In this manner, a second SOI wafer 2 including a third silicon layer 13 and a concealed pre-torsion bar T' is obtained.

Figure 9A:
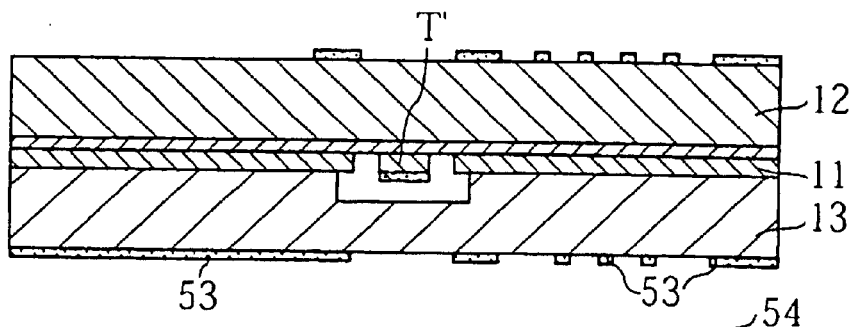

Then, an oxide film is formed on the third silicon layer 13 by thermal oxidation and then processed into a oxide film pattern 53, as shown in FIG. 9A. The pattern 53 is configured in accordance the plan geometry involving the mirror forming base 110, the first comb-teeth electrodes 110a–110b, the inner frame body 121, the third comb-teeth electrodes 121a–121b and the first outer frame member 131.

Figure 9B:
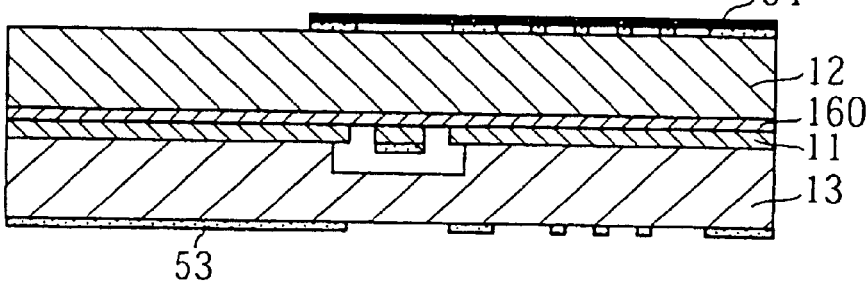
Figure 9C:
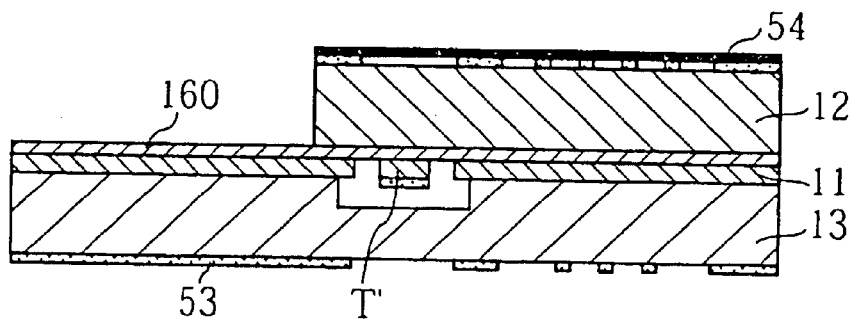
Figure 9D:
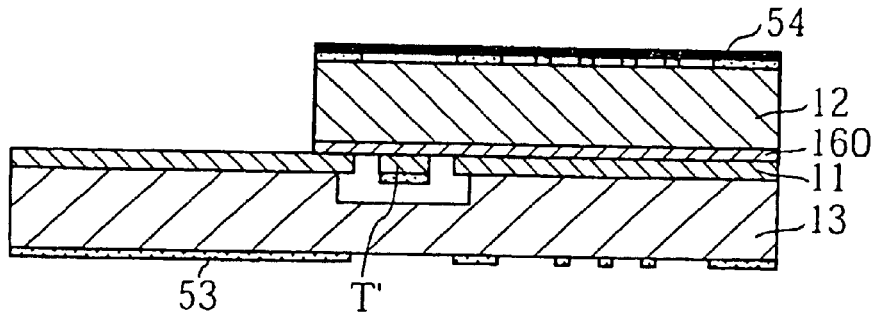
Figure 9E:
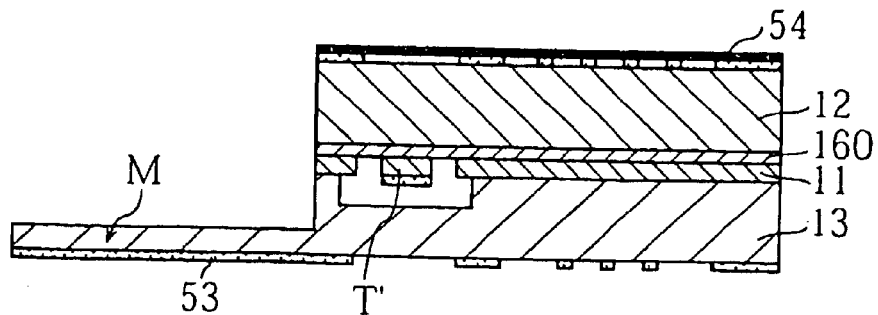

Then, as shown in FIG. 9B, a resist pattern 54 is formed by growing a photoresist on the second silicon layer 12 and then subjecting the photoresist to light exposure and development. Except for the region corresponding to the mirror forming portion M, the resist pattern 54 covers all the other regions in the upper surface of the second silicon layer 12. Then, as shown in FIG. 9C, the second silicon layer 12 is subjected to DRIE with the resist pattern 54 used as a mask until the etching reaches the insulating layer 160. Then, as shown in FIG. 9D, the exposed portion of the insulating layer 160 is etched away. Then, as shown in FIG. 9E, the first and the third silicon layers 11, 13 are subjected to DRIE, thereby reducing the thickness of a part of the mirror forming portion M. As seen from the comparison of the relevant figures, the procedure shown in FIGS. 9A–9E is similar to the procedure shown in FIGS. 4A–4E (second embodiment of the present invention).

Figure 10A:
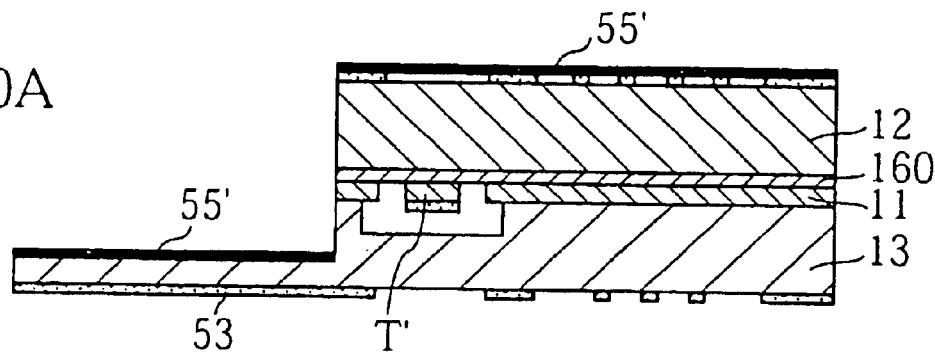
Figure 10B:
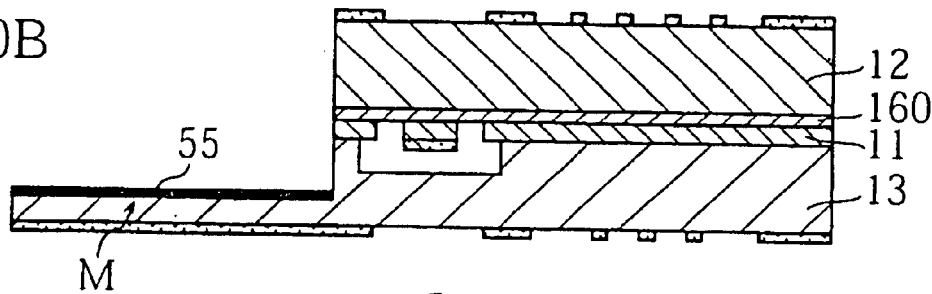
Figure 10C:
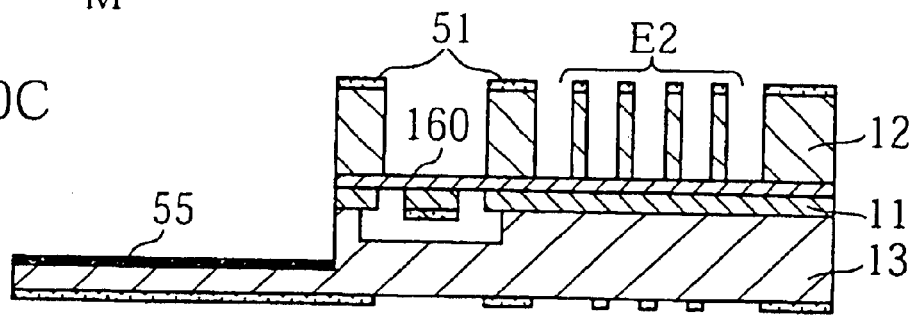
Figure 10D:
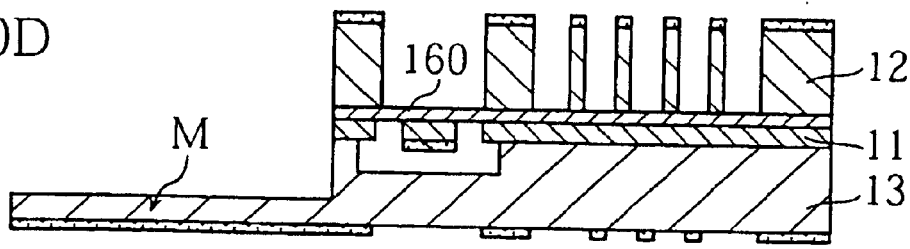

Then, after the resist pattern 54 is removed, a photoresist 55' is formed by spraying the material from above, as shown in FIG. 10A. The photoresist 55' is then exposed to light and developed, to be processed into a resist pattern 55, as shown in FIG. 10B. The resist pattern 55 covers the bottom side of the mirror forming portion M in the third silicon layer 13. Then, as shown in FIG. 10C, the first silicon layer 11 is subjected to DRIE with the oxide film pattern 51 used as a mask until the etching reaches the insulating layer 160. As a result, the comb-teeth electrode E2 is produced. Then, as shown in FIG. 10D, the resist pattern 55 is removed. The procedure shown in FIGS. 10A–10D is similar to the procedure shown in FIGS. 5A–5D (second embodiment of the present invention).

Figure 11A:
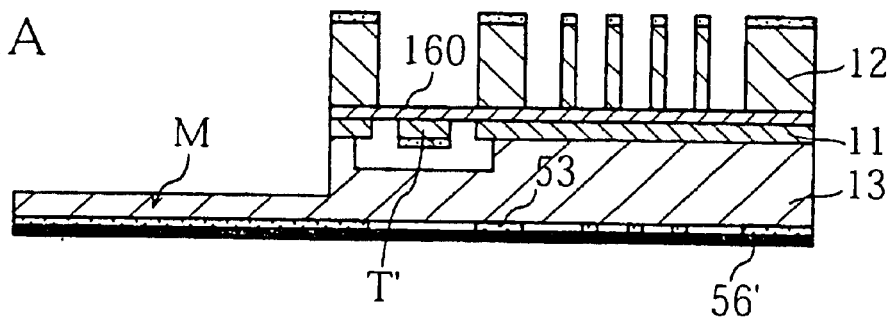
Figure 11B:
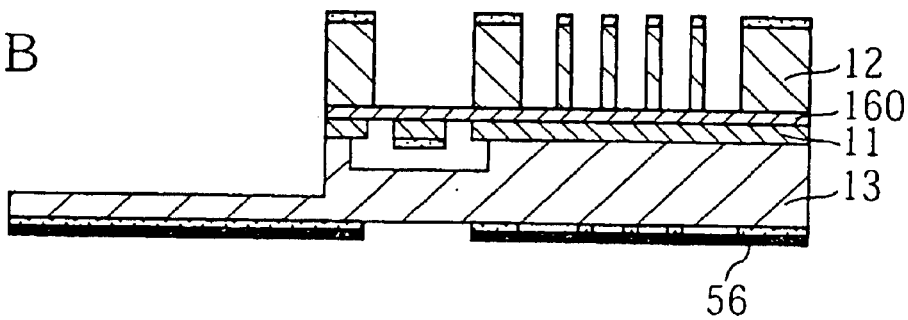
Figure 11C:
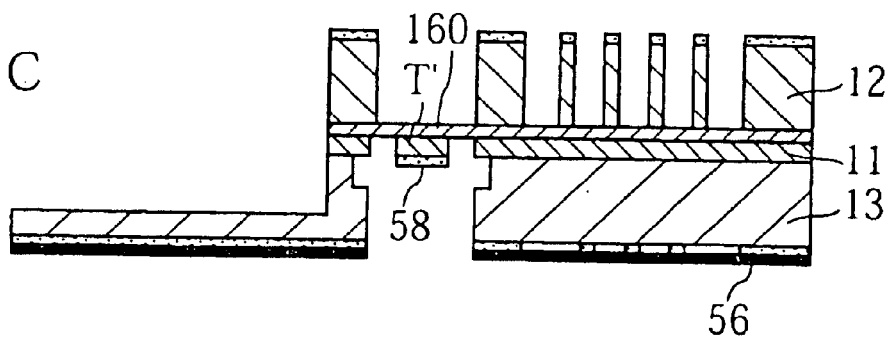
Figure 11D:
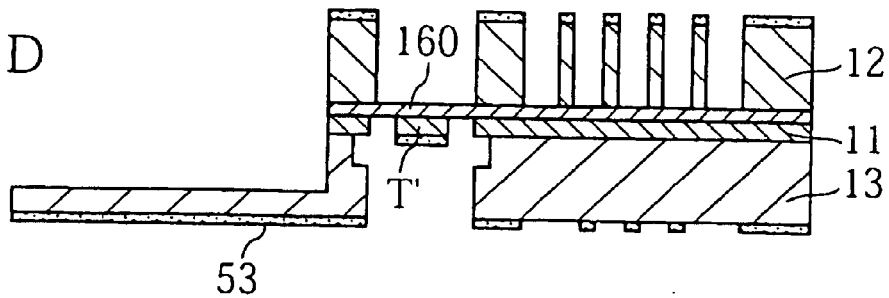

Then, as shown in FIG. 11A, a photoresist 56' is formed on the third silicon layer 13 and then exposed to light and developed, to be processed into a resist pattern 56, as shown in FIG. 11B. The resist pattern 56 covers regions of the third and first silicon layers 13, 11 that correspond to the mirror forming portion M, the comb-teeth electrode E1 and the frame. Then, as shown in FIG. 11C, the third and the first silicon layers 13, 11 are subjected to DRIE with the resist pattern 56 used as a mask until the pre-torsion bar T' is revealed. Due to the covering of the oxide film pattern 58, the pre-torsion bar T' is not etched away. Then, as shown in FIG. 11D, the resist pattern 56 is removed. The procedure shown in FIGS. 11A–11D is similar to the procedure shown in FIGS. 6A–6D.

Figure 12A:
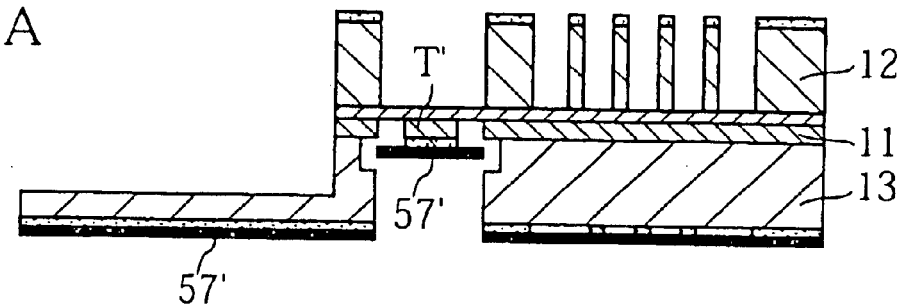
Figure 12B:
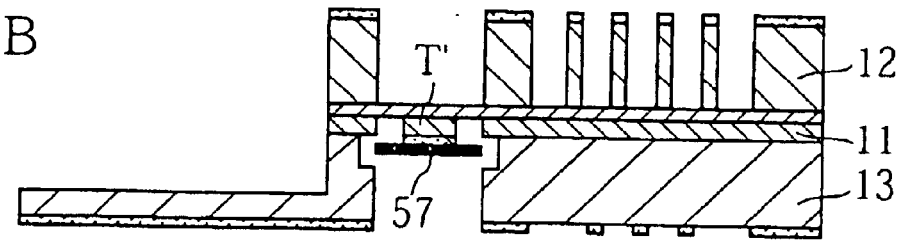
Figure 12C:
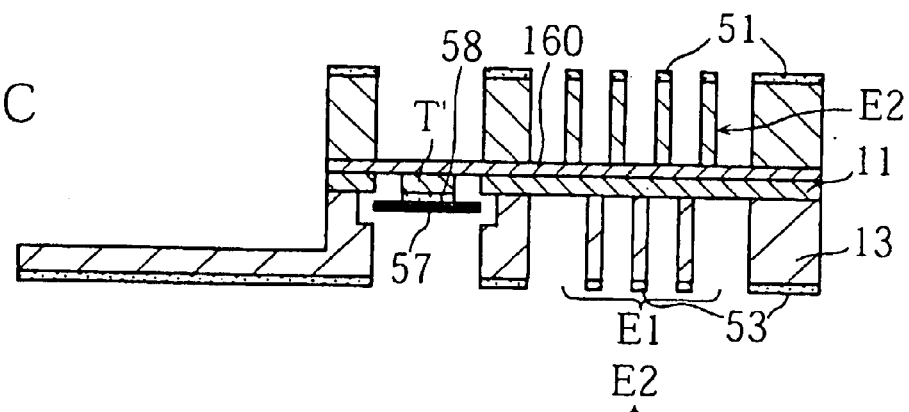
Figure 12D:
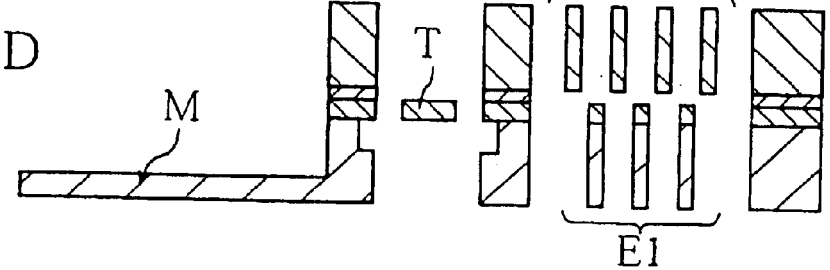

Then, as shown in FIG. 12A, a photoresist 57' is formed by spraying the material from below. The photoresist 57' is then exposed to light and developed, to be processed into a resist pattern 57, as shown in FIG. 12B. The pattern 57 serves as an additional mask for the pre-torsion bar T'. Then, as shown in FIG. 12C, the third and the first silicon layers 13, 11 are subjected to DRIE with the oxide film pattern 53 used as a mask until the etching reaches the insulating layer 160. Thus, the comb-teeth electrode E1 is obtained. At this time, the pre-torsion bar T' is not affected by the etchant due to the double masking by the pattern 58 and the pattern 57. Then, as shown in FIG. 12D, the resist pattern 57 is removed, and the exposed insulating layer 160 and pattern 58 are etched away. At this time, the exposed oxide film patterns 51, 53 are also removed. As a result, upper and lower comb-teeth electrodes E1, E2 having a thickness of 100 µm are obtained. The resulting torsion bar T is advantageously thin (having a thickness of 5 µm with high precision), and is disposed accurately at the vertical center of the second SOI wafer 2. The procedure shown in FIGS. 12A–12D is similar to the procedure shown in FIGS. 7A–7D (second embodiment of the present invention).

Reference is now made to FIGS. 13A–13E, 14A–14E, 15A–15D, 16A–16D and 17A–17D illustrating a micromirror unit fabrication method according to a fourth embodiment of the present invention. In the illustrated example, the method is used for making the above-described micromirror unit 100.

Figure 13A:
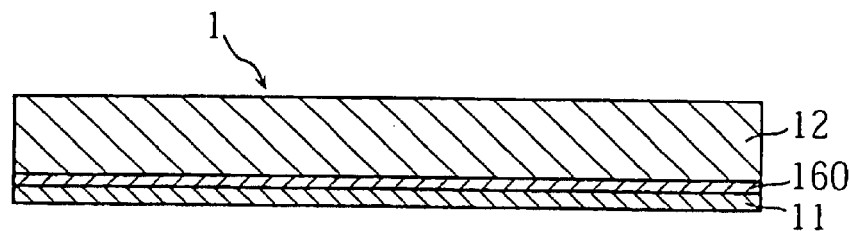
FIGS. 13A–13E, 14A–14E, 15A–15D, 16A–16D and 17A–17D are sectional views illustrating a micromirror unit fabrication method according to a fourth embodiment of the present invention.
Figure 13B:
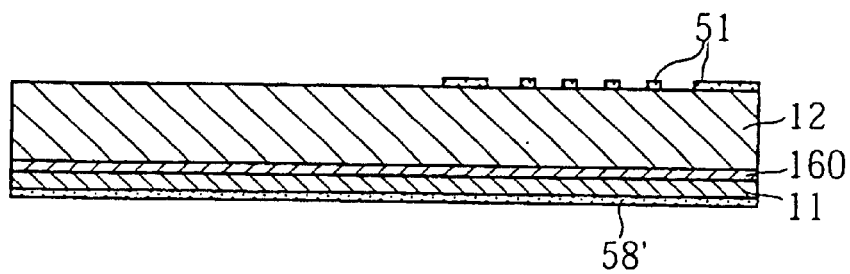

First, as shown in FIG. 13A, a first SOI wafer 1 is prepared. The illustrated water is the same as the one shown in FIG. 3A (second embodiment of the present invention). Then, as shown in FIG. 13B, an oxide film pattern 51 is formed on the second silicon layer 12 by growing a silicon oxide film on the layer 12 (by thermal oxidation) and then patterning this oxide film. Another oxide film 58' is grown on the first silicon layer 11. However, the oxide film 58' is not subjected to patterning.

Figure 13C:
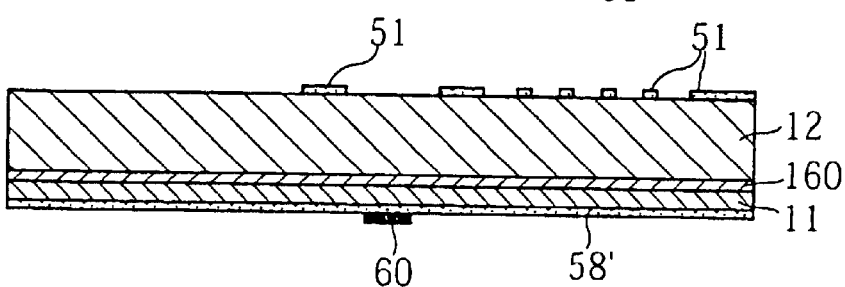
Figure 13D:
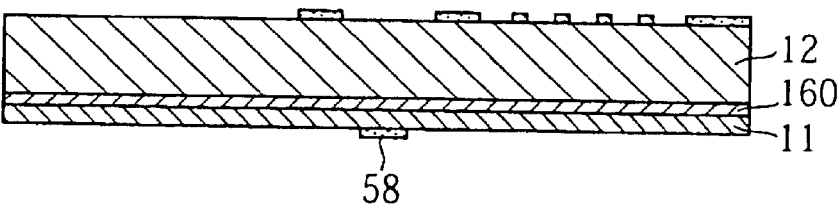

Then, a photoresist is formed on the oxide film 58', and then subjected to patterning to form a resist pattern 60, as shown in FIG. 13C. Then, the oxide film 58' is etched with the resist pattern 60 used as a mask. Thereafter, the resist pattern 60 is removed. Thus, as shown in FIG. 13D, on oxide film pattern 58 is obtained. The pattern 58 will serve as a mask for a pre-torsion bar T' at a subsequent etching step.

Figure 13E:
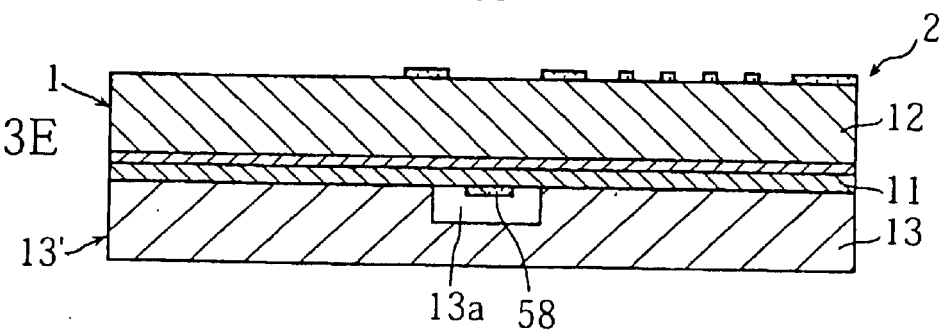

Then, a silicon water 13' is prepared in the same manner as described with reference to FIGS. 8C and 8D (third embodiment of the present invention). After the resist pattern 59 is removed, the silicon wafer 13' is attached to the first SOI wafer 1 so that the pattern 58 faces the groove 13a of the wafer 13', as shown in FIG. 13E.

Figure 14A:
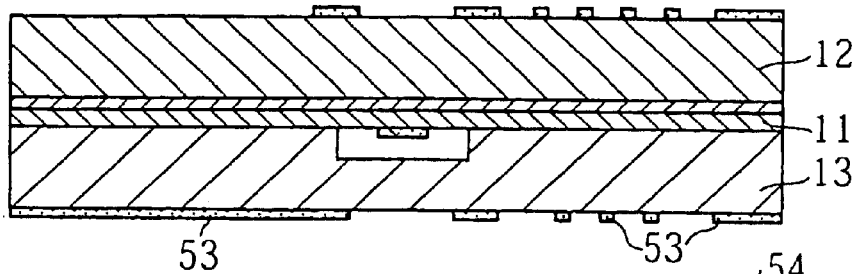

Then, an oxide film is grown on the third silicon layer 13 by thermal oxidation. Then, as in the first embodiment of the present invention, the oxide film is processed into an oxide film pattern 53, as shown in FIG. 14A.

Figure 14B:
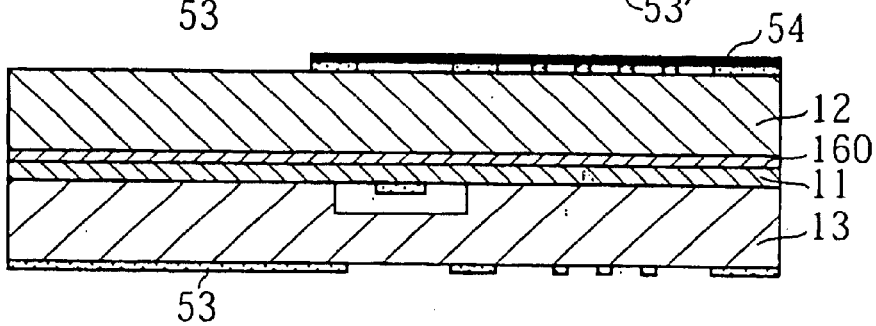
Figure 14C:
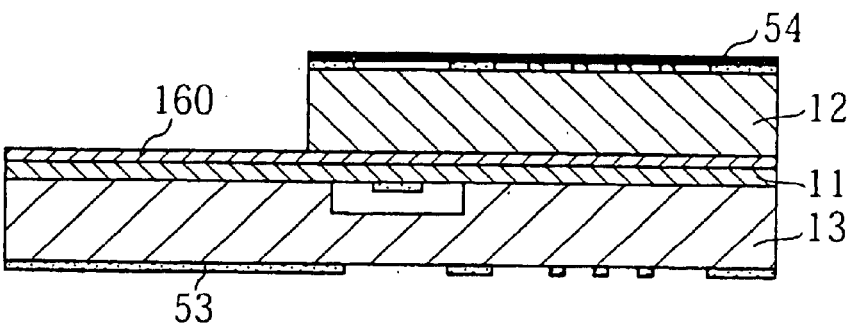
Figure 14D:
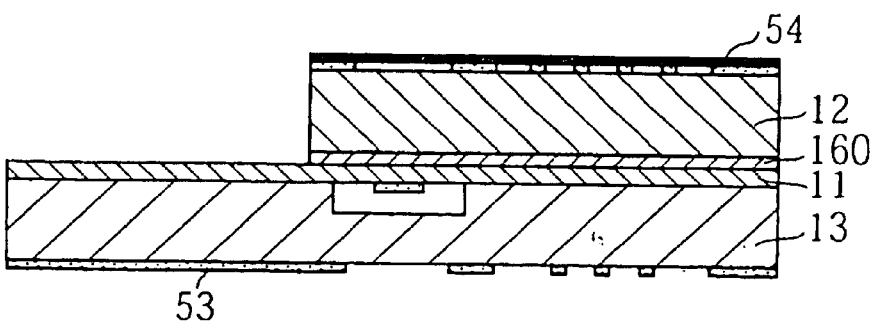
Figure 14E:
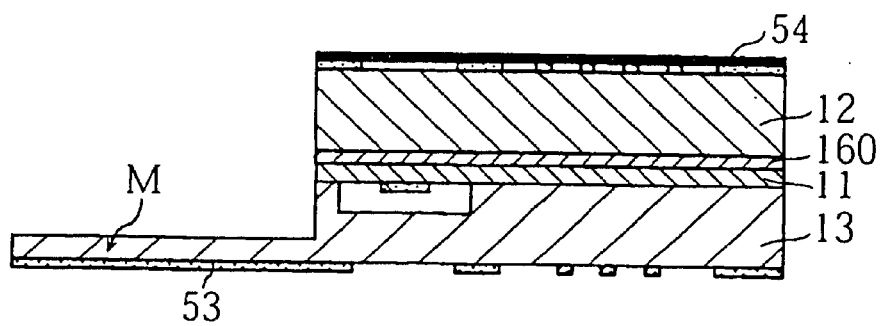

Then, a photoresist is formed on the second silicon layer 12. This photoresist is exposed to light and developed, to be processed into a resist pattern 54, as shown in FIG. 14B. The pattern 54 serves as a mask for the second silicon layer 12, but does not cover a region of the layer 12 that corresponds to the mirror forming portion M. Then, as shown in FIG. 14C, the second silicon layer 12 is subjected to DRIE with the resist pattern 54 used as a mask until the etching reaches the insulating layer 160. Then, as shown in FIG. 14D, the exposed portion of the insulating layer 160 is etched away. Then, as shown in FIG. 14E, the exposed first silicon layer 11 and the underlying third silicon layer 13 are subjected to DRIE, thereby partially reducing the thickness of the mirror forming portion M. The procedure shown in FIGS. 14A–14E is similar to the procedure shown in FIGS. 4A–4E (second embodiment of the present invention).

Figure 15A:
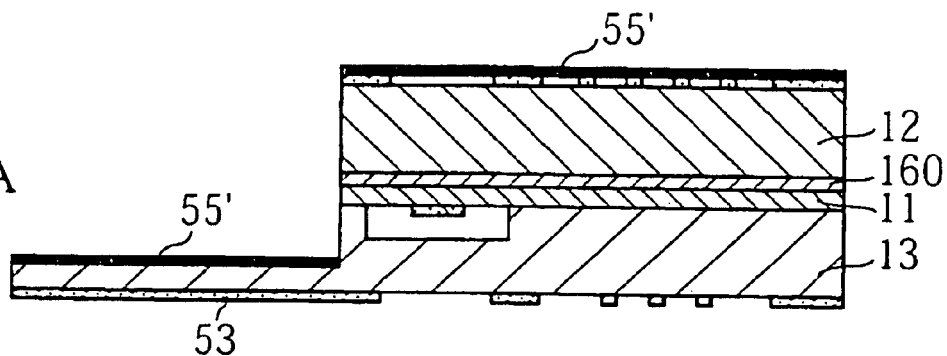
Figure 15B:
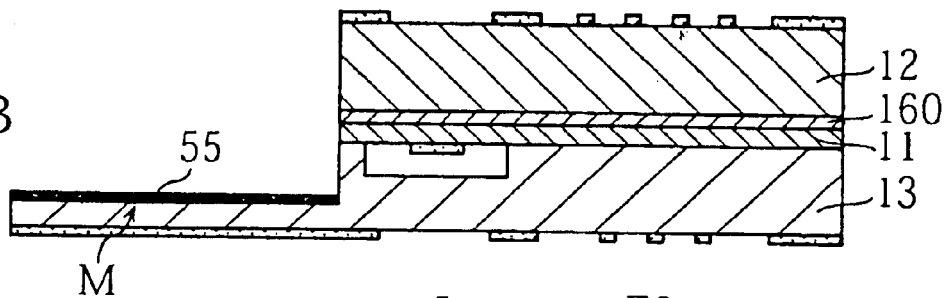
Figure 15C:
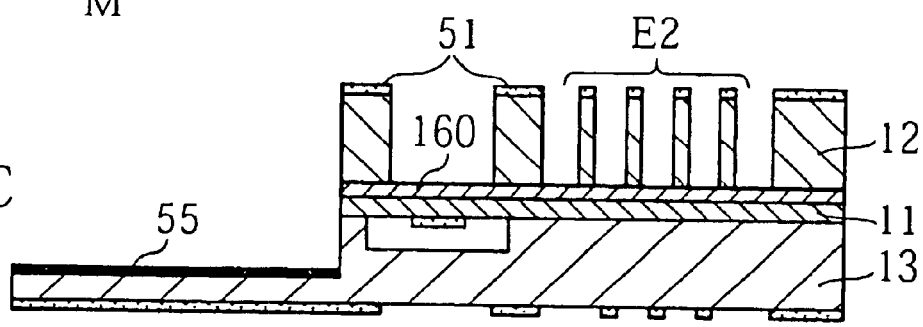
Figure 15D:
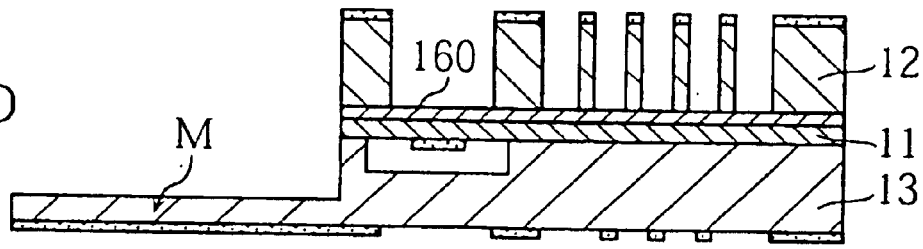

Then, the resist pattern 54 is removed. Thereafter, as shown in FIG. 15A, a photoresist 55' is formed by spraying the material from above. The photoresist 55' is then exposed to light and developed, to be processed into a resist pattern 55, as shown in FIG. 15B. The resist pattern 55 serves as a mask for the bottom side of the mirror forming portion M in the third silicon layer 13. Then, as shown in FIG. 15C, the first silicon layer 11 is subjected to DRIE with the pattern 51 used as a mask until the etching reaches the insulating layer 160. Thus, the comb-teeth electrode E2 is obtained. Then, as shown in FIG. 15D, the resist pattern 55 is removed. The procedure shown in FIGS. 15A–15D is similar to the procedure shown in FIGS. 5A–5D (second embodiment of the present invention.

Figure 16A:
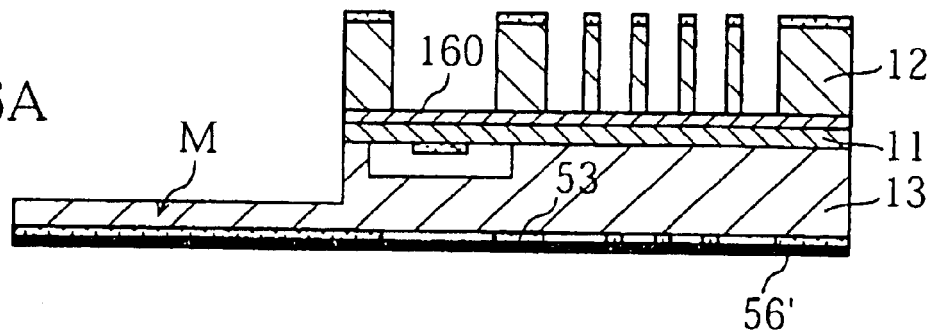
Figure 16B:
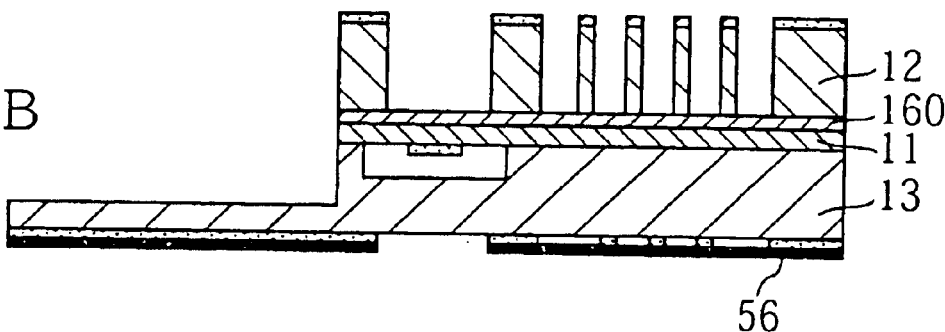
Figure 16C:
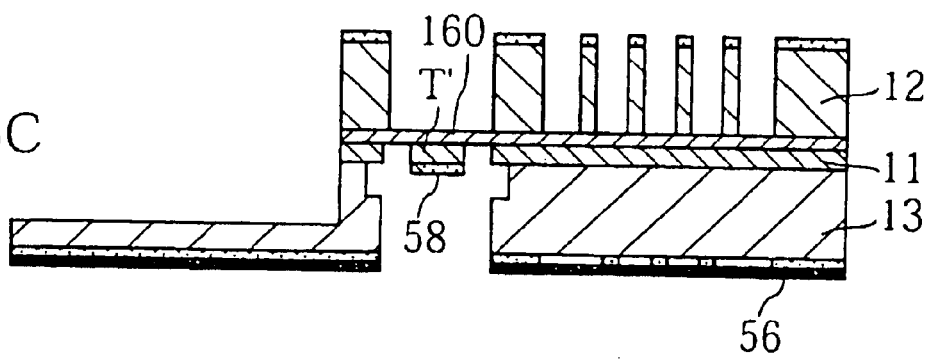
Figure 16D:
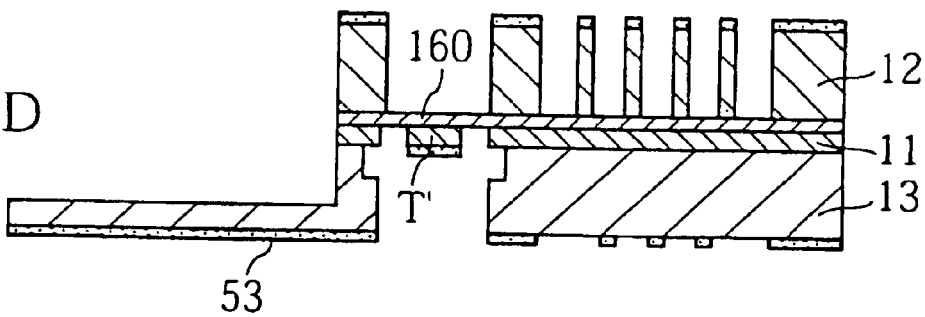

Then, as shown in FIG. 16A, a photoresist 56' is formed on the third silicon layer 13. The photoresist 56' is exposed to light and developed, to be processed into a resist pattern 56, as shown in FIG. 16B. The resist pattern 56 serves as a mask for regions of the third and the first silicon layers 13, 11 that correspond to the mirror forming portion M, the comb-teeth electrode E1 and the frame. Then, as shown in FIG. 16C, the third and the first silicon layers 13, 11 are subjected to DRIE with the pattern 56 used as a mask. The etching continues until the oxide film 58 is revealed and further the insulating layer 160 is exposed. As a result, a pre-torsion bar T' is obtained. At this stage, the pre-torsion bar T' is held in contact with the insulating layer 160. Due to the protection by the oxide film 58, the pre-torsion bar T' remains intact during the DRIE. Then, as shown in FIG. 16D, the resist pattern 56 is removed. The procedure shown in FIGS. 16A–16D is similar to the procedure shown in FIGS. 6A–6D (second embodiment of the present invention).

Figure 17A:
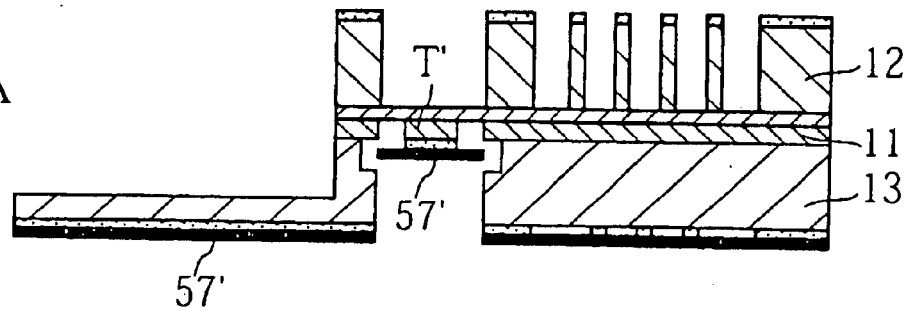
Figure 17B:
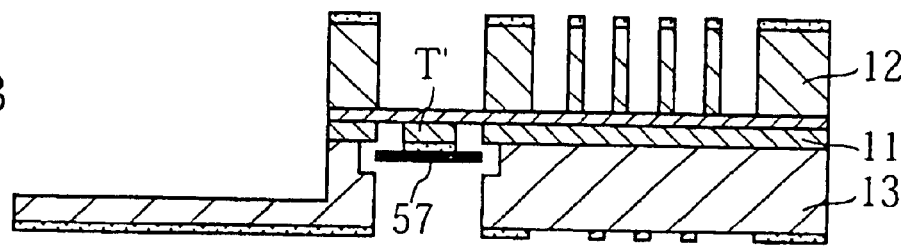
Figure 17C:
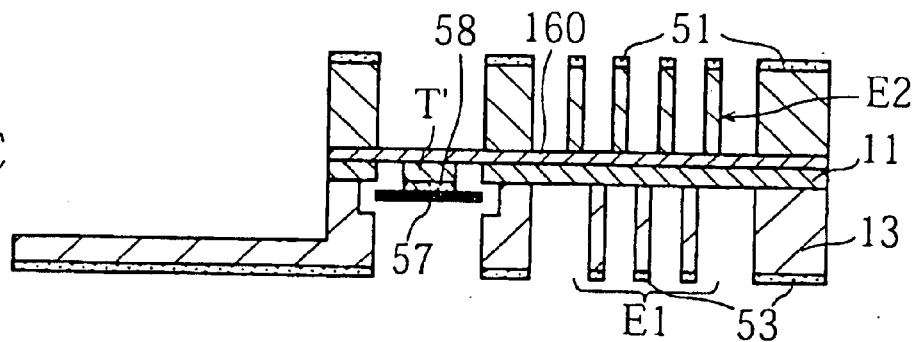
Figure 17D:
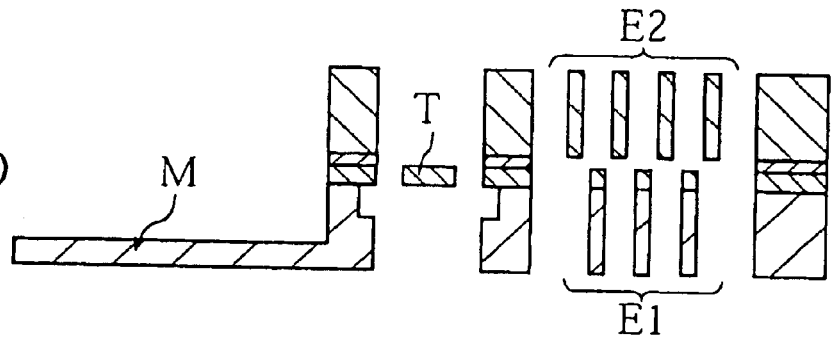

Then, as shown in FIG. 17A, a photoresist 57' is formed by spraying the material from below. The photoresist 57' is exposed to light and developed, to be processed into a resist pattern 57, as shown in FIG. 17B. The resist pattern 57 serves as an additional mask for the pre-torsion bar T'. Then, as shown in FIG. 17C, the third silicon layer 13 and the underlying first silicon layer 11 are subjected to DRIE with the oxide pattern 53 used as a mask until the etching reaches the insulating layer 160. Thus, the comb-teeth electrode E1 is obtained. At this stage, the pre-torsion bar T' is masked doubly by the patterns 58 and 57, so that it can remain intact during the etching. Then, the resist pattern 57 is removed. Thereafter, as shown in FIG. 17D, the exposed insulating layer 160 and the oxide film pattern 58 are etched away. At this time, the oxide film patterns 51, 53 are also etched away. As a result, upper and lower comb-teeth electrodes E1, E2 having a thickness of 100 µm are obtained. Also, a thin torsion bar T is obtained. The torsion bar T is located exactly at the vertical center of the second SOI wafer 2 and has a precise thickness of 5 µm. In addition, a mirror forming portion M, which is partially reduced in thickness, is obtained. Accordingly, a micromirror unit 100 drivable with low power is obtained. The procedure shown in FIGS. 17A–17D is similar to the procedure shown in FIGS. 7A–7D.

Reference is now made to FIGS. 18A–18D and 19A–19D illustrating a micromirror unit fabrication method according to a fifth embodiment of the present invention. This method also employs a micro-machining technique and can produce the above-described micromirror unit 100.

Figure 18A:
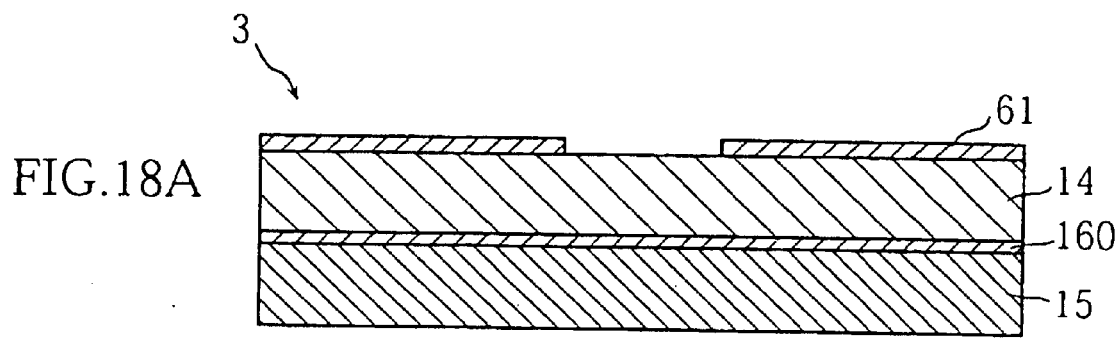
FIGS. 18A–18D and 19A–19D are sectional views illustrating a micromirror unit fabrication method according to a fifth embodiment of the present invention.

First, as shown in FIG. 18A, a mask pattern 61 is formed on an SOI wafer 3 by using an oxide film, a photoresist etc. The wafer 3 has a multi-layer structure composed of a first silicon layer 14, a second silicon layer 15 and an insulating layer 160 held between the first and the second layers 14, 15. Each of the first and the second silicon layers 14, 15 is made of a conductive silicon material doped with n-type impurities such as phosphorus or arsenic. The insulating layer 160 is made of silicon oxide grown on the layer 14 or 15 by thermal oxidation. In the illustrated example, each of the first and the second silicon layers 14, 15 has a thickness of 100 µm, while the insulating layer 160 has a thickness of 1 µm.

Figure 18B:
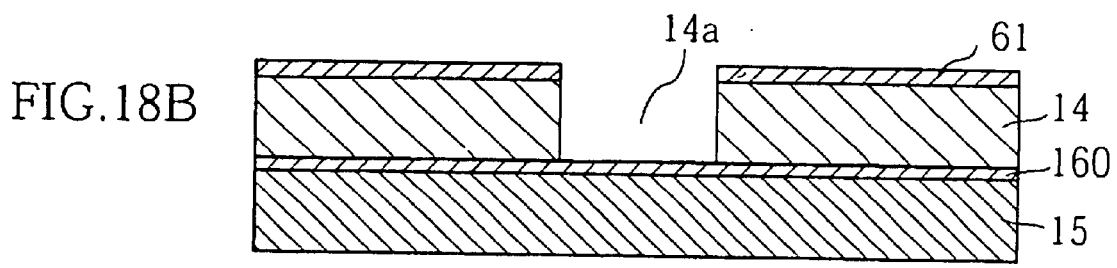
Figure 18C:
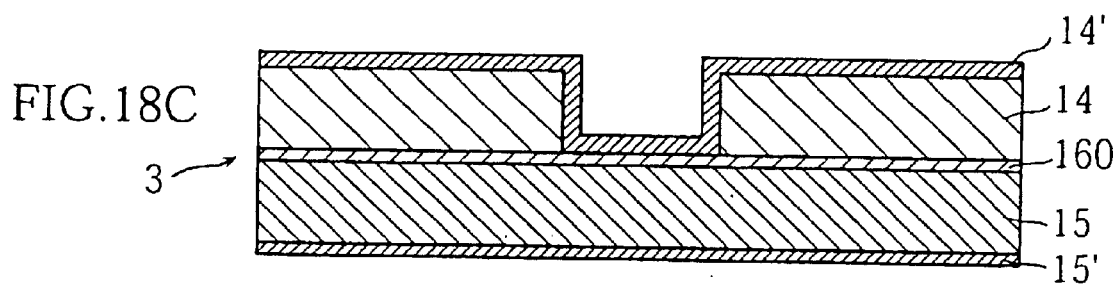
Figure 18D:
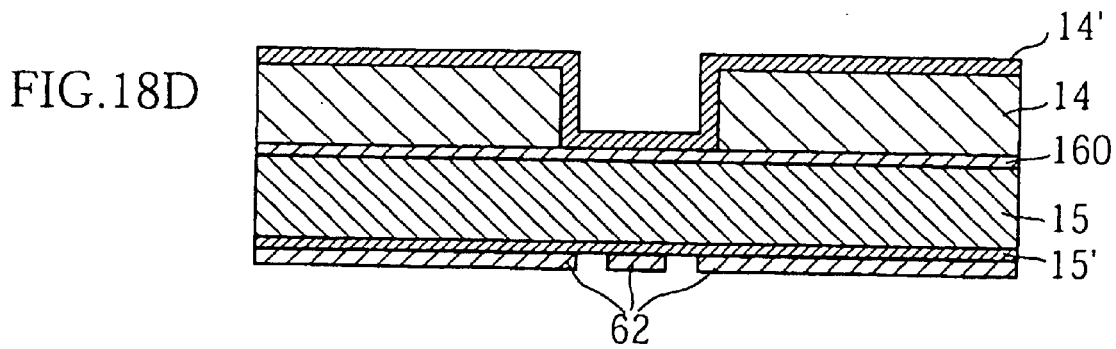

Then, as shown in FIG. 18B, the first silicon layer 14 is subjected to DRIE with the presence of the mask pattern 61 until the etching reaches the insulating layer 160. Thus, a groove 14a is obtained. Then, the mask pattern 61 is removed. Then, as shown in FIG. 18C, the SOI wafer 3 as a whole is coated by polysilicon layers 14' and 15' each having a thickness of 5 µm. These layers may be produced by reduced-pressure chemical vapor deposition. In the illustrated example, the polysilicon to be used is doped with impurities so that it is rendered electrically conductive. Then, an oxide film is grown on the polysilicon layer 15' by thermal oxidation. The thus obtained oxide film is then processed into an oxide film pattern 62, as shown in FIG. 18D.

Figure 19A:
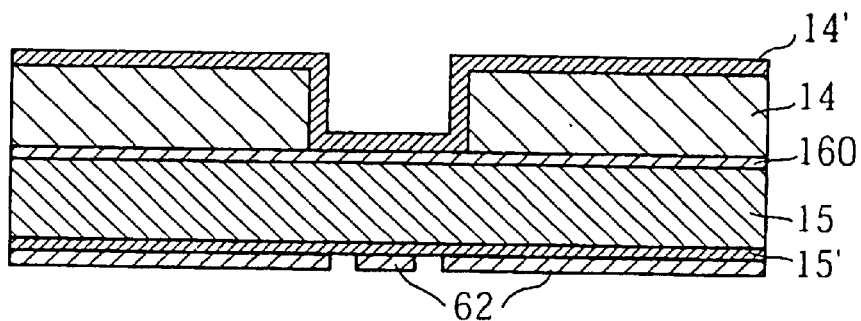
Figure 19B:
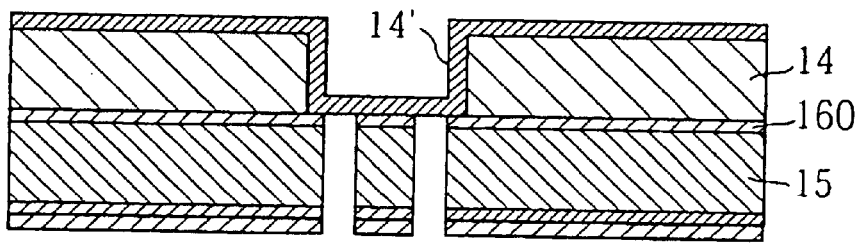
Figure 19C:
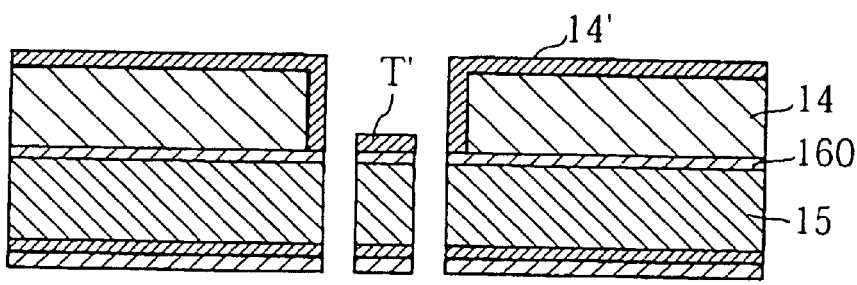
Figure 19D:
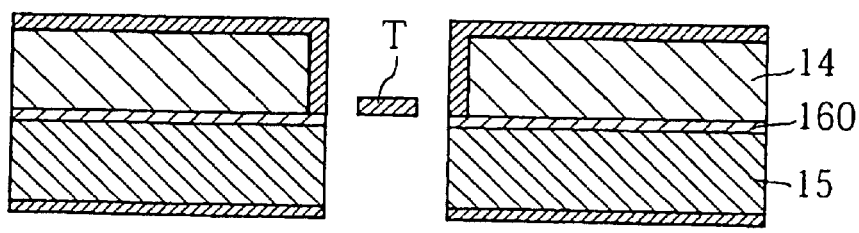

Then, as shown in FIG. 19A, the second silicon layer 15 and the polysilicon layer 15' are subjected to DRIE with the oxide film pattern 62 used as a mask until the etching reaches the insulating layer 160. Then, as shown in FIG. 19B, the exposed insulating layer 160 is etched away. Then, as shown in FIG. 19C, portions of the polysilicon layer 14' that are exposed on the side of the second silicon layer 15 are removed by DRIE. Thus, a pre-torsion bar T' held in contact with the insulating layer 160 is obtained. Then, as shown in FIG. 19D, etching is performed so that the portion of the insulating layer 160 that is held in contact with the pre-torsion bar T' is removed. More specifically, the SOI wafer 3 is immersed in etchant. As a result, the above-mentioned particular portion of the insulating layer 160 is dissolved. Accordingly, it is possible to remove the portion of the second silicon layer 15 that is held in contact with the dissolved insulating layer portion. At this time, the exposed oxide film pattern 62 is also removed. Thus, the torsion bar T is obtained.

In the above embodiment again, first a pre-torsion bar T' held in contact with an insulating layer 160 is produced, and then the attached insulating layer 160 is removed from the pre-torsion bar T'. The thickness of the pre-torsion bar T' is determined by the thickness of the polysilicon layer 14' formed at the step shown in FIG. 18C. The thickness of the layer 14' can be precisely determined by a film forming technique. Accordingly, it is possible to set the thickness of the torsion bar T at a desired small value with high precision.

Reference is now made to FIGS. 20A–20D and 21A–21D illustrating a micromirror unit fabrication method according to a sixth embodiment of the present invention. This method also employs a micro-machining technique and can produce the above-described micromirror unit 100.

Figure 20A:
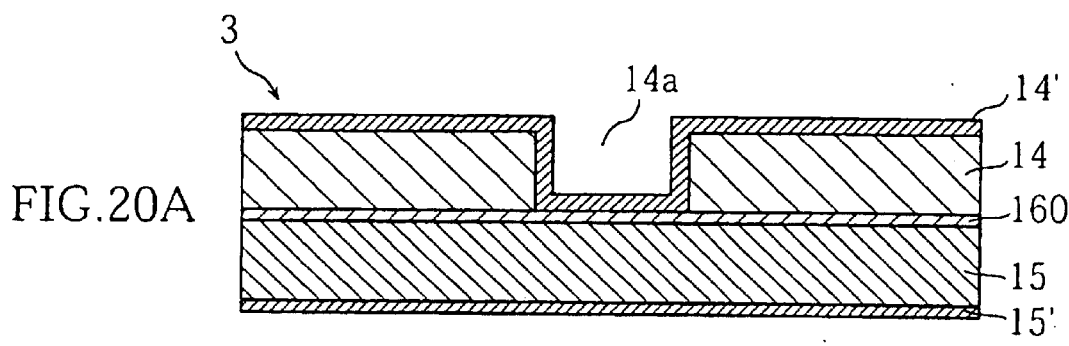
FIGS. 20A–20D and 21A–21D are sectional views illustrating a micromirror unit fabrication method according to a sixth embodiment of the present invention.

In the illustrated embodiment, an SOI wafer 31 is subjected to the same process as shown in FIGS. 18A–18C (fifth embodiment of the present invention), so that a processed wafer 3 shown in FIG. 20A is obtained. The illustrated wafer 3 includes a first silicon layer 14, a second silicon layer 15 and an insulating layer 160 disposed between the first and the second silicon layers 14 and 15. The first silicon layer 14 is formed with a groove 14a. The wafer 3 as a whole is coated with polysilicon layers 14' and 15'.

Figure 20B:
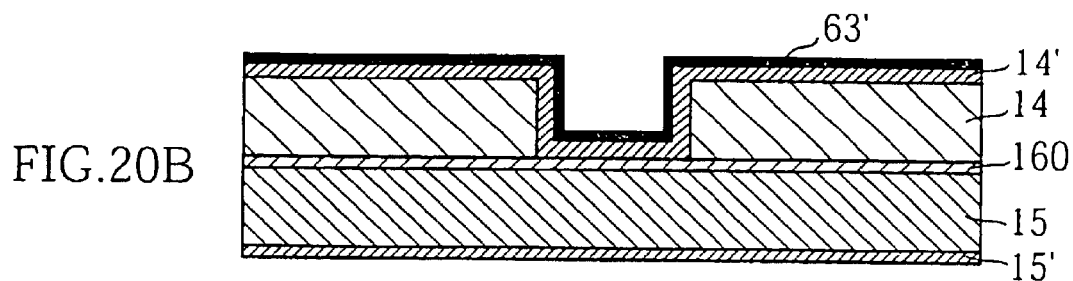
Figure 20C:
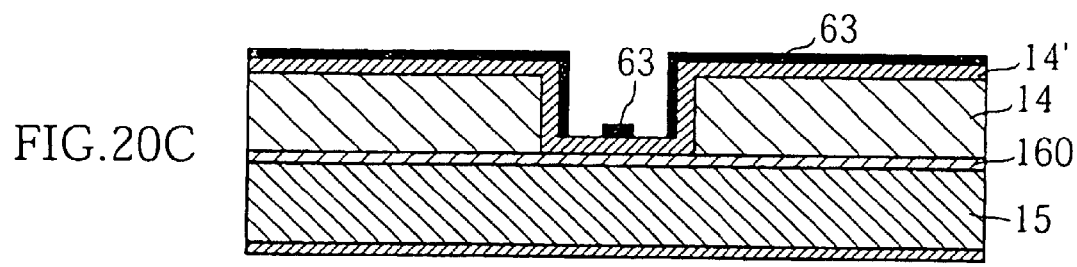
Figure 20D:
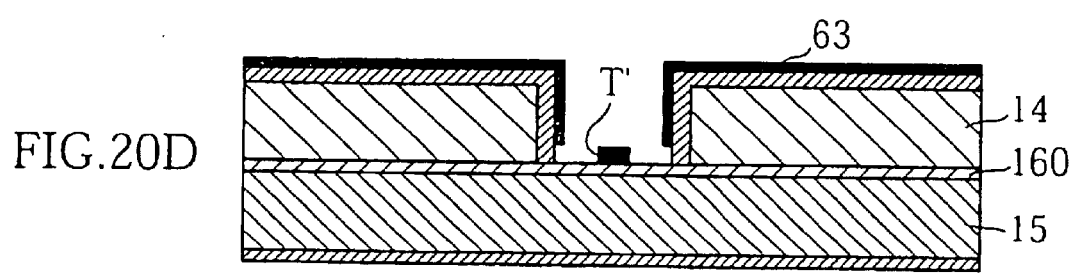

Then, as shown in FIG. 20B, a photoresist 63' is formed on the polysilicon layer 14'. The photoresist 63' is then processed into a resist pattern 63, as shown in FIG. 20C. The resist pattern 63 serves as a mask for producing a torsion bar T in the polysilicon layer 14' Then, the exposed portions of the polysilicon layer 14' are removed, as shown in FIG. 20D, by DRIE with the resist pattern 63 used as a mask. Thus, a pre-torsion bar T' held in contact with the insulating layer 160 is obtained.

Figure 21A:
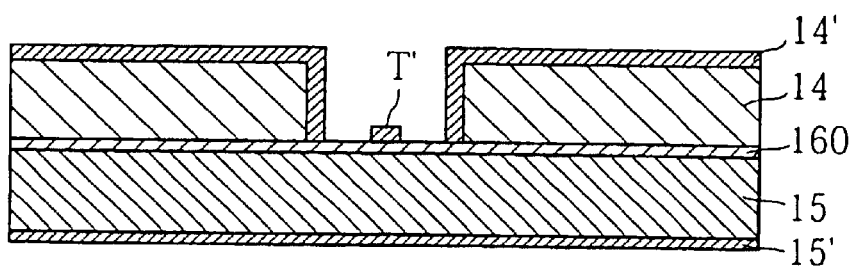
Figure 21B:
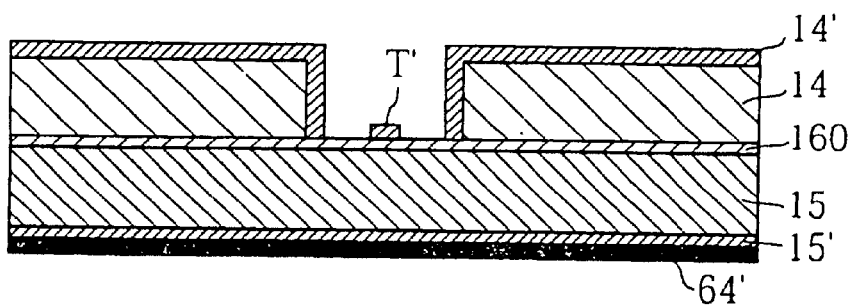
Figure 21C:
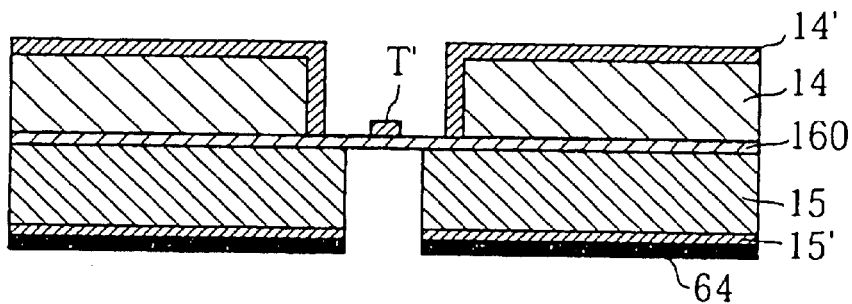
Figure 21D:
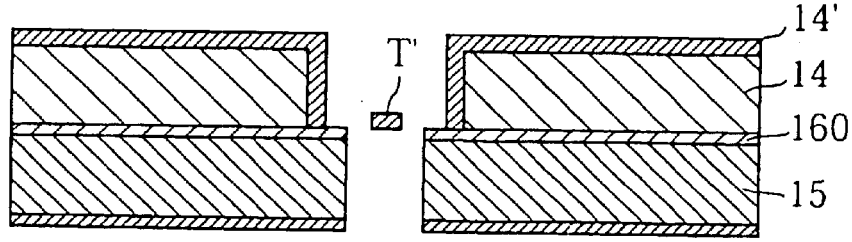

Then, as shown in FIG. 21A, the resist pattern 63 is removed. Then, a resist 64' is formed on the polysilicon layer 15', as shown in FIG. 21B. This resist is then processed into a resist pattern 64. Then, the second silicon layer 15 and the polysilicon layer 15' are subjected to DRIE with the resist pattern 64 used as a mask until the etching reaches the insulating layer 160, as shown in FIG. 21C. Then, as shown in FIG. 21D, a portion of the insulating layer 160 that is held in contact with the pre-torsion bar T' is etched away. Thus, a torsion bar T is obtained. Thereafter, the resist pattern 64 is removed, as required.

Reference is now made to FIGS. 22A–22E and 23A–23D illustrating a micromirror unit fabrication method according to a seventh embodiment of the present invention. This method again employs a micro-machining technique and can produce the above-described micromirror unit 100.

Figure 22A:
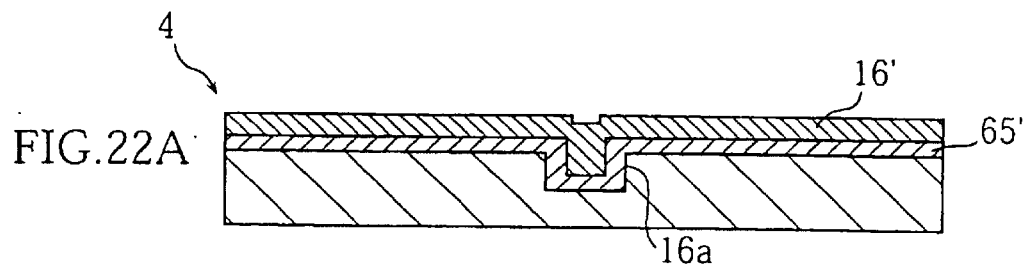
FIGS. 22A–22E and 23A–23D are sectional views illustrating a micromirror unit fabrication method according to a seventh embodiment of the present invention.
Figure 22B:
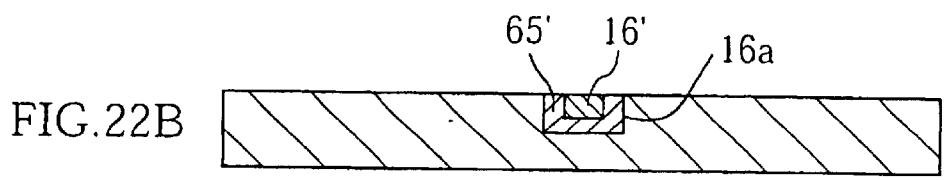
Figure 22C:
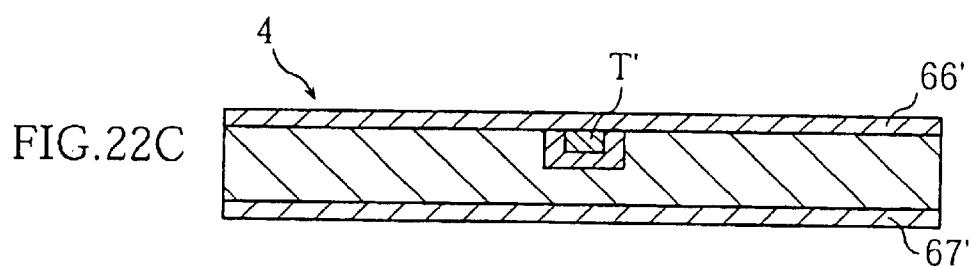
Figure 22D:
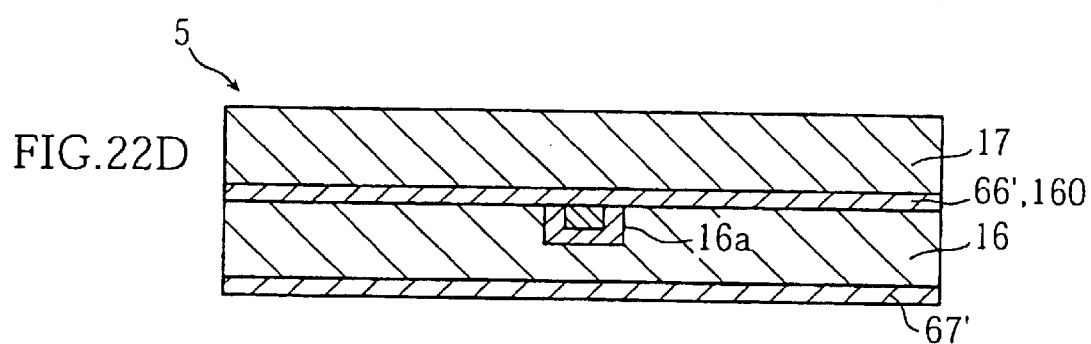
Figure 22E:
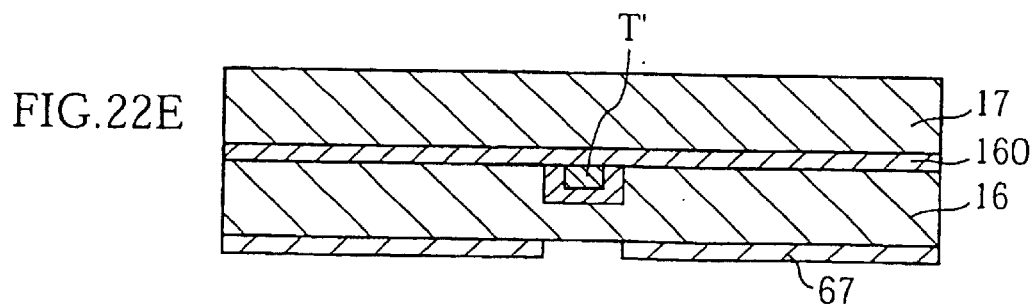

In the illustrated embodiment, as shown in FIG. 22A, first a groove 16a is formed in a silicon wafer 4. Then, an oxide film 65' is formed on the wafer 4 so as to cover the groove 16a. In addition, a polysilicon layer 16' is formed on the film 65' in a manner such that a part of the layer 16' fills the groove 16a. Then, as shown in FIG. 22B, the oxide film 65' and the polysilicon layer 16' are removed by grinding except for the projecting portion filling the groove 16a. Then, as shown in FIG. 22C, oxide films 66' and 67' are grown on the upper or lower surface of the wafer 4 by thermal oxidation. The oxide film 66' will serve as an intermediate insulating layer 160. The projecting portion of the polysilicon 16' serves as a pre-torsion bar T'. Then, as shown in FIG. 22D, a second silicon layer 17 is attached to the wafer 4 with the film 66' intervening therebetween. Thus, an SOI wafer 5 having a multi-layer structure is obtained. Then, the oxide film 67' is processed into an oxide film pattern 67, as shown in FIG. 22E.

Figure 23A:
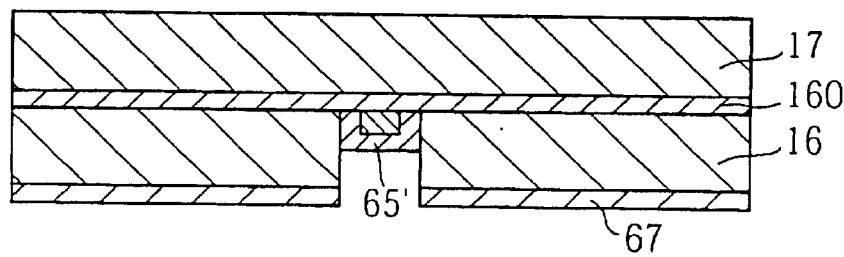
Figure 23B:
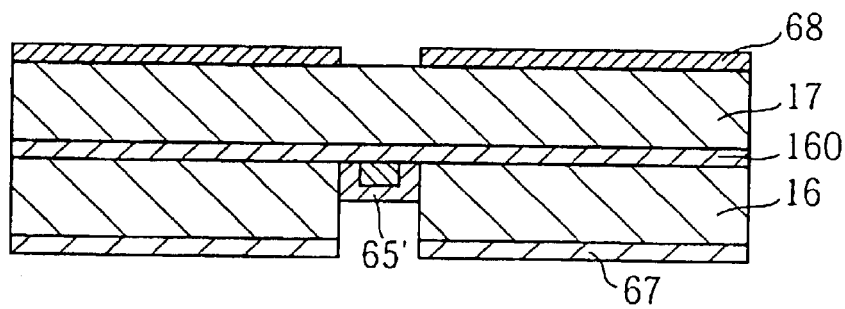
Figure 23C:
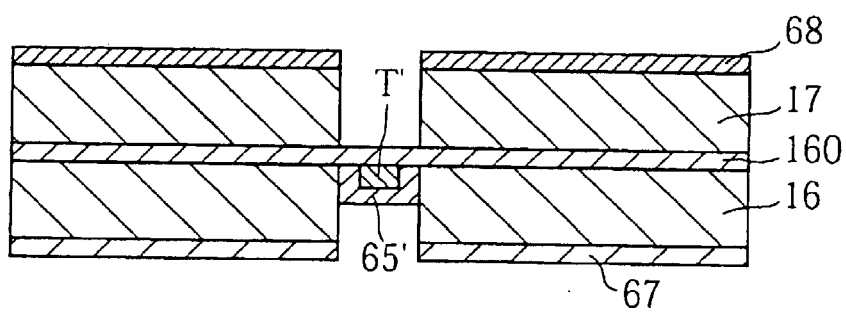
Figure 23D:
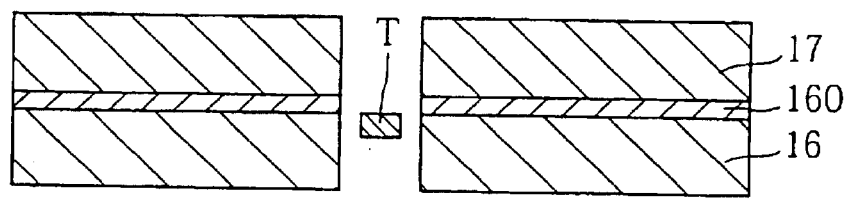

Then, as shown in FIG. 23A, the first silicon layer 16 is subjected to DRIE with the pattern 67 used as a mask until the oxide film 65' formed in the groove 16a is exposed. Then, an oxide film is formed on the second silicon layer 17 and then processed into an oxide film pattern 68, as shown in FIG. 23B. Then, as shown in FIG. 23C, the second silicon layer 17 is subjected to DRIE with the pattern 68 used as a mask until the etching reaches the insulating layer 160. Then, as shown in FIG. 23D, the exposed insulating layer 160 and the oxide film 65' are etched away by immersing the SOI wafer in etchant. At this time, the oxide film patterns 67 and 68 are also removed. Thus, a torsion bar T is obtained.

Reference is now made to FIGS. 24A–24D and 25A–25C illustrating a micromirror unit fabrication method according to an eighth embodiment of the present invention. This method again employs a micro-machining technique and can produce the above-described micromirror unit 100.

In the illustrated embodiment, first a silicon wafer 6, which will serve as a first silicon layer 18 at a latter stage, is prepared. As shown in FIG. 24A, the wafer 6 is formed with two grooves by etching with the use of a suitable mask pattern (not shown). This mask pattern covers a portion of the wafer 6 that will become a torsion bar T. The depth of each groove is rendered equal to the thickness of the torsion bar T to be obtained. Then, as shown in FIG. 24B, a second silicon layer 19 provided with an oxide film 69' is attached to the wafer 6. Thus, an SOI wafer 7 is obtained. The oxide film 69' serves as an intermediate insulating layer 160 in the wafer 7. Then, as shown in FIG. 24C, an oxide film pattern 70 is formed on the second silicon layer 19. Then, as shown in FIG. 24D, the second silicon layer 19 is subjected to DRIE with the pattern 70 used as a mask until the etching reaches the insulating layer 160.

Figure 25A:
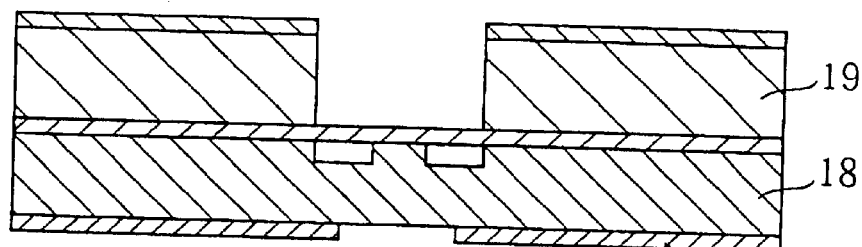
Figure 25B:
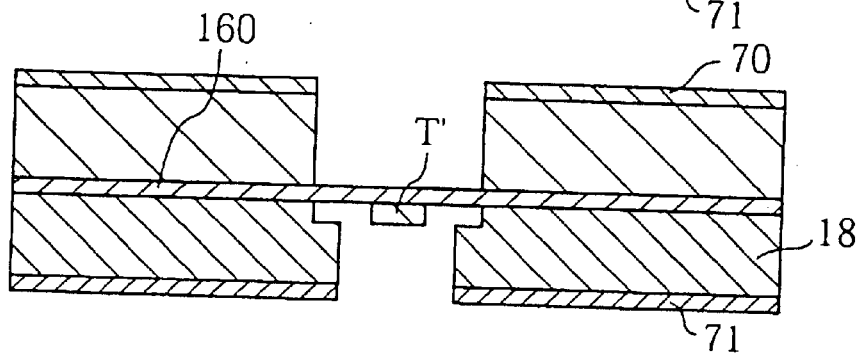
Figure 25C:
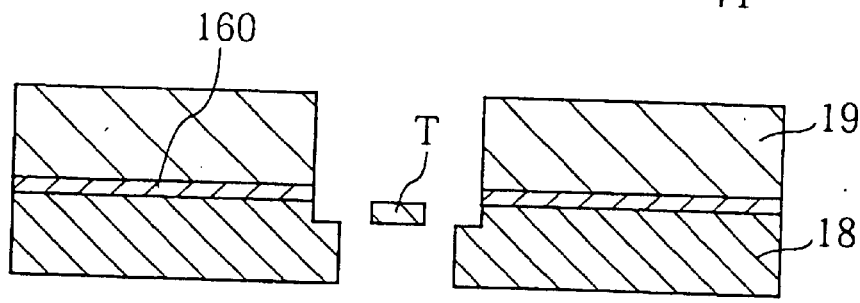

Then, as shown in FIG. 25A, an oxide film pattern 71 is formed on the first silicon layer 18. Then, as shown in FIG. 25B, the first silicon layer 18 is subjected to DRIE with the pattern 71 used as a mask until a pre-torsion bar T' held in contact with the insulating layer 160 is obtained. Then, as shown in FIG. 25C, the insulating layer 160 contacting with the bar T' is etched away. At this time, the oxide film patterns 70, 71 are also removed. Thus, a torsion bar T is obtained.

Reference is now made to FIGS. 26A–26E and 27A–27C illustrating a micromirror unit fabrication method according to a ninth embodiment of the present invention. This method again employs a micro-machining technique and can produce the above-described micromirror unit 100.

Figure 26A:
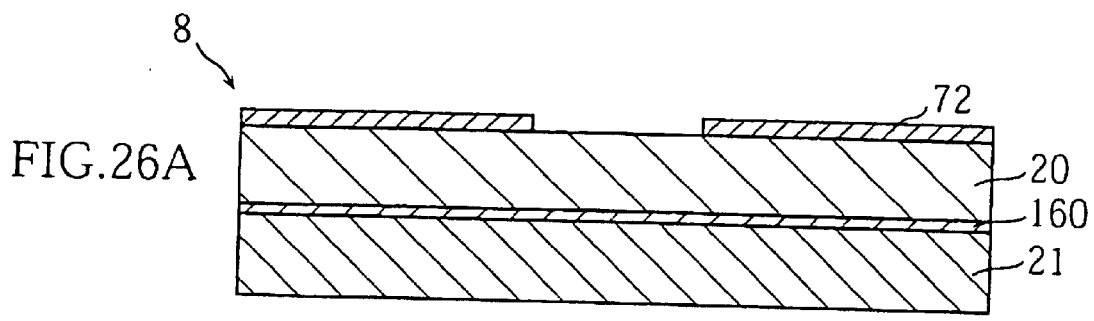
FIGS. 26A–26D and 27A–27C are sectional views illustrating a micromirror unit fabrication method according to a ninth embodiment of the present invention.

In the illustrated embodiment, as shown in FIG. 26A, an oxide film pattern 72 is formed on an SOI wafer 8. The SOI wafer 8 has a multi-layer structure composed of a first silicon layer 20, a second silicon layer 21 and an intermediate insulating layer 160 disposed between the first and the second silicon layers 20, 21. Each of the first and the second silicon layers 20, 21 is made of a conductive silicon material doped with n-type impurities such as phosphorus and arsenic. The insulating layer 160 is made of silicon oxide which is grown on the surface of the first or second silicon layer 20 or 21 by thermal oxidation. In the illustrated embodiment, both the first and the second silicon layers 20, 21 have a thickness of 100 $\mu$m, while the insulating layer 160 has a thickness of 1 $\mu$m.

Figure 26B:
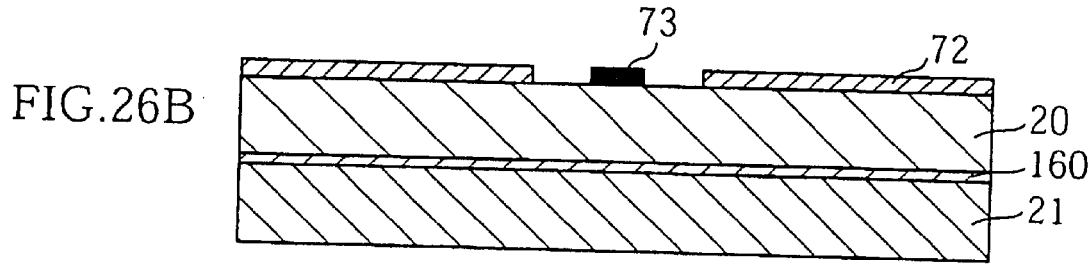
Figure 26C:
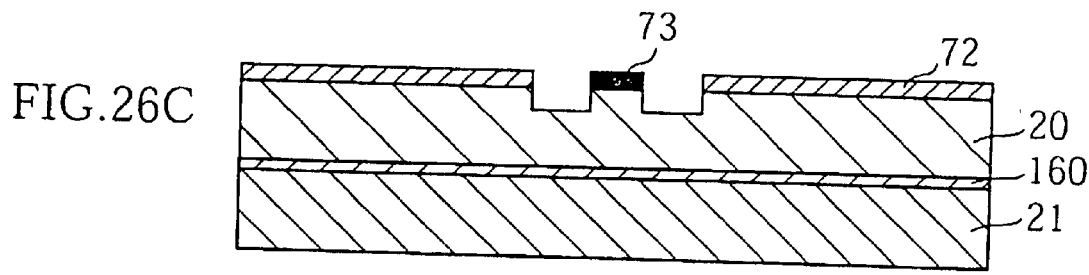
Figure 26D:
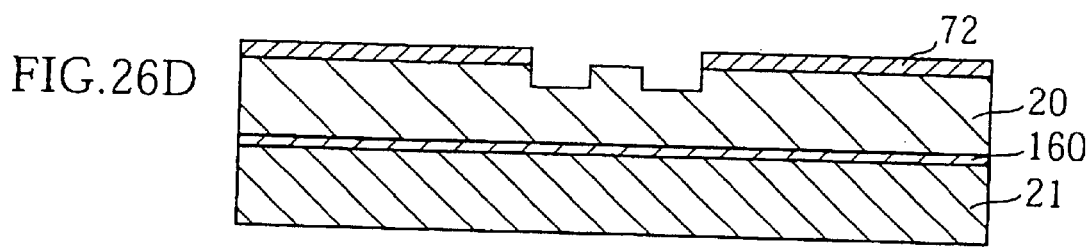
Figure 26E:
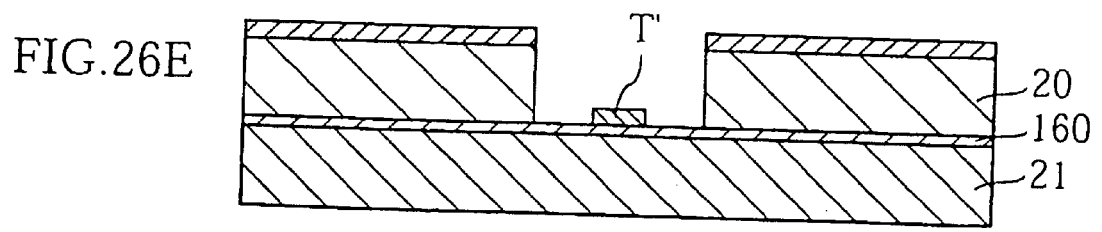

Then, as shown in FIG. 26B, a resist pattern 73 is formed on the exposed area of the first silicon layer 20. The masked portion of the layer 20 is processed into a torsion bar T. As shown in FIG. 26C, the first silicon layer 20 is subjected to DRIE with the patterns 72 and 73 used as a mask (first etching step), thereby producing two identical grooves. The depth of each groove corresponds to the thickness of the torsion bar T. In the illustrated embodiment, the depth of the grooves is Sum. Then, as shown in FIG. 26D, the resist pattern 73 is removed. As shown in FIG. 26E, the first silicon layer 20 is subjected to DRIE with the oxide film pattern 72 used as a mask (second etching step) until the etching reaches the insulating layer 160. Thus, a pre-torsion bar T' contacting with the insulating layer 160 is obtained.

Figure 27A:
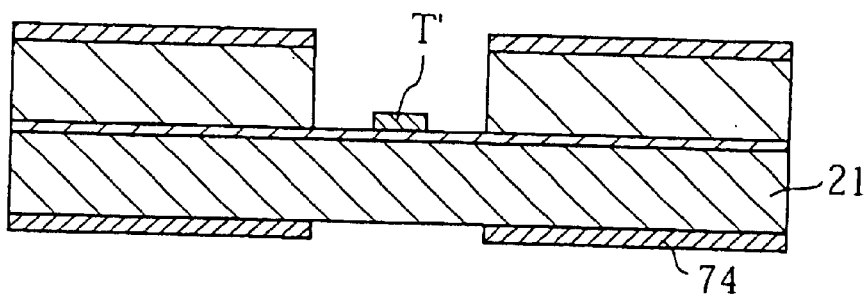
Figure 27B:
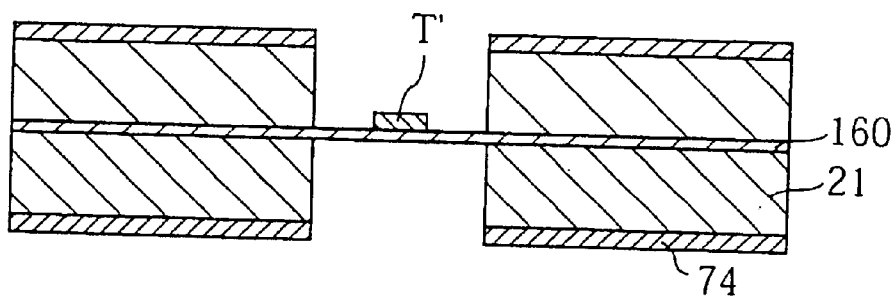
Figure 27C:
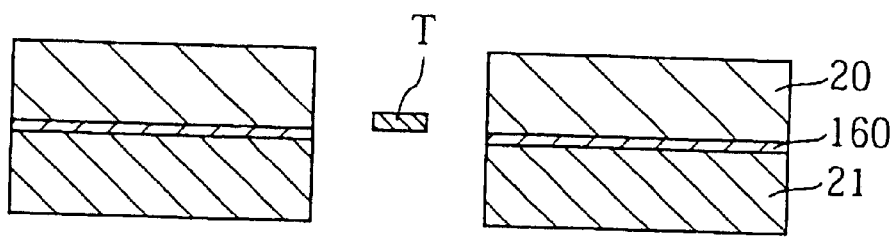

Then, as shown in FIG. 27A, an oxide film pattern 74 is formed on the second silicon layer 21. As shown in FIG. 27B, the second silicon layer 21 is subjected to DRIE with the pattern 74 used as a mask until the etching reaches the insulating layer 160. Then, as shown in FIG. 27C, the insulating layer 160 contacting with a pre-torsion bar T' is etched away by immersion in etchant. At this time, the oxide film patterns 72, 74 are also removed. Thus, a torsion bar T is obtained.

Reference is now made to FIGS. 28A–28D and 29A–29D illustrating a modified version of the micromirror unit fabrication method according to the ninth embodiment of the present invention. In this version, comb-teeth electrodes E1 and E2 are produced together with a torsion bar T.

First, as shown in FIG. 28A, an SOI wafer 8 is prepared. As noted above, the wafer 8 includes a conductive first silicon layer 20, a conductive second silicon layer 21 and an intermediate insulating layer 160.

Then, oxide films are grown on the first and the second silicon layers 20, 21 by thermal oxidation. The oxide films are then processed into a pattern 72 or 74, as shown in FIG. 28B. The oxide film patterns 72 and 74 serve as a mask in etching the first or second silicon layer to provide comb-teeth electrodes E1 and E2. As shown in FIG. 28C, a resist pattern 73 is formed on the first silicon layer 20. The pattern 73 serves as a mask for the portion to be processed into a torsion bar T. Then, as shown in FIG. 28D, the first silicon layer 20 is subjected to DRIE with the patterns 72 and 73 used as a mask until grooves each having a depth of 5 μm are formed.

Figure 29A:
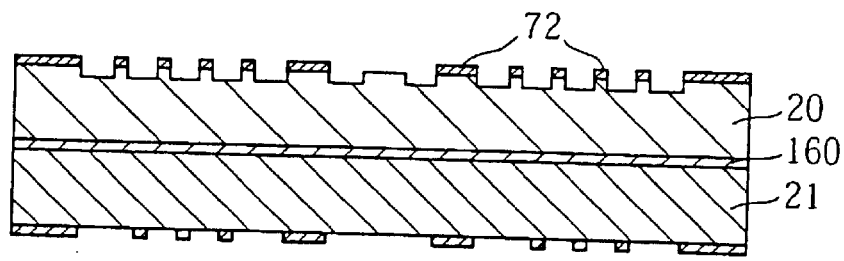
Figure 29B:
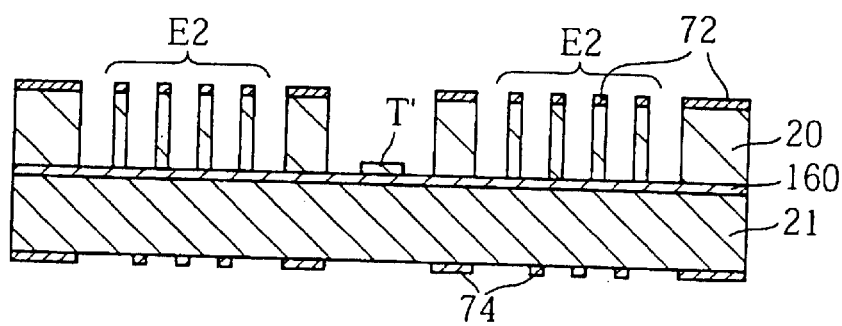
Figure 29C:
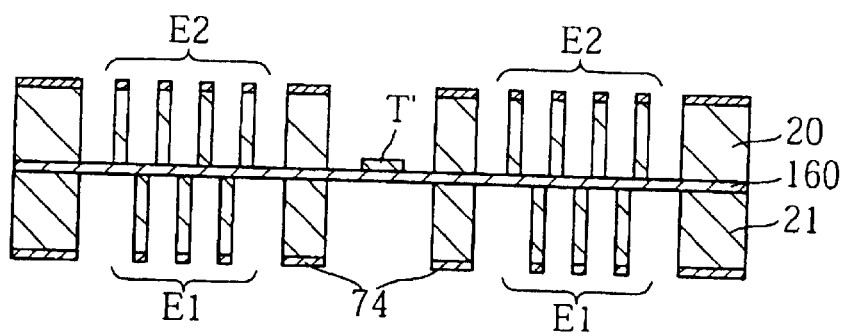
Figure 29D:
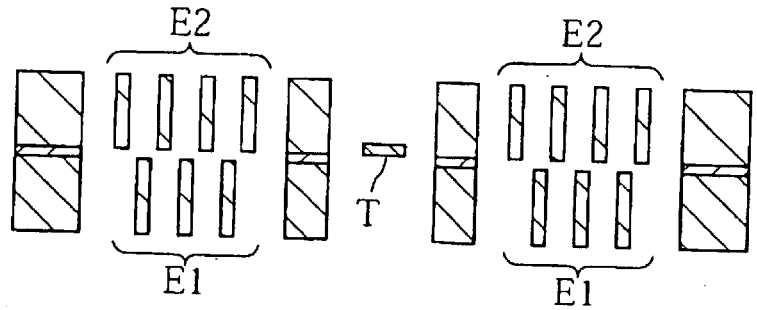

Then, as shown in FIG. 29A, the resist pattern 73 is removed. Then, as shown in FIG. 29B, the first silicon layer 20 is subjected to DRIE with the pattern 72 used as a mask until the etching reaches the insulating layer 160. Thus, a pre-torsion bar T' contacting with the layer 160 and also a comb-teeth electrode E2 contacting with the layer 160 are obtained. Then, as shown in FIG. 29C, the second silicon layer 21 is subjected to DRIE with the pattern 74 used as a mask until the etching reaches the insulating layer 160. Thus, a comb-teeth electrode E1 is obtained. Then, as shown in FIG. 29D, the insulating layer 160 exposed at the steps of FIGS. 29B and 29C is etched away. At this time, the oxide film patterns 72, 74 are also removed. Thus, a torsion bar T is obtained.

During the DRIE at the step of FIG. 29A, the difference between the etching rate in the comb-teeth electrode region and the etching rate in the torsion bar region is negligible since the etching depth to be attained is relatively small (5 μm). However, during the DRIE at the step of FIG. 29B, the etching depth to be attained is rather great (several ten micrometers). Accordingly, the etching rate tends to be greater in the torsion bar region than in the comb-teeth electrode region due to the difference in extent of the openings. In light of this, preferably the etching depth to be attained at the step of FIG. 29A may be set at a value greater than the prescribed thickness of the torsion bar (5 μm in the illustrated embodiment). With this precaution, when the etching at the step of FIG. 29B reaches the insulating layer 160, the resulting pre-torsion bar T' will have the desired thickness (5 μm).

Reference is now made to FIGS. 30A–30E, 31A–31E, 32A–32E and 33A–33F illustrating a modified version of the micromirror unit fabrication method of the ninth embodiment of the present invention. In accordance with this modified version, a torsion bar T and comb-teeth electrodes E1, E2 are produced at different etching steps, as described below.

First, as shown in FIG. 30A, an SOI wafer 8 is prepared. The illustrated wafer 8 is the same as the wafer shown in FIG. 26A. Then, oxide films are grown on the first and the second silicon layers 20, 21 by thermal oxidation. The obtained oxide films are then processed into a pattern 72 or 74, as shown in FIG. 30B. Then, as shown in FIG. 30C, a resist pattern 75 is formed on the first silicon layer 20. The resist pattern 75 serves as a mask for a region to be processed into a torsion bar T and for regions to be processed into a mirror forming portion M, comb-teeth electrodes E1, E2 and frames. Then, as shown in FIG. 30D, the first silicon layer 20 is subjected to DRIE with the pattern 75 used as a mask until grooves each having a depth of Sum are formed in the layer 20. Then, as shown in FIG. 30E, the resist pattern 75 is removed.

Then, as shown in FIG. 31A, a photoresist 76' is formed on the first silicon layer 20. Then, the photoresist 76' is exposed to light and developed, to be processed into a resist pattern 76, as shown in FIG. 31B. The pattern 76 serves as a mask for regions to be processed into a mirror forming portion M, comb-teeth electrodes E1, E2 or frames. Then, as shown in FIG. 31C is the first silicon layer 20 is subjected to DRIE with the pattern 76 as a mask until the etching reaches the insulating layer 160. Thus, a pre-torsion bar T' contacting with the insulating layer 160 is obtained. Then, as shown in FIG. 31D, the resist pattern 76 is removed. Then, as shown in FIG. 31E, a photoresist 77' is formed on the first silicon layer 20 and the pre-torsion bar T' by spraying the material from above.

Figure 32A:
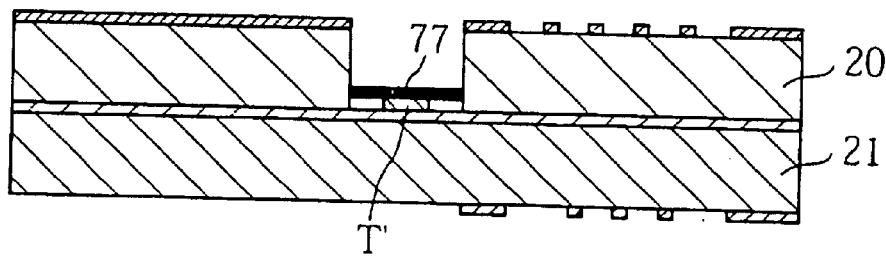
Figure 32B:
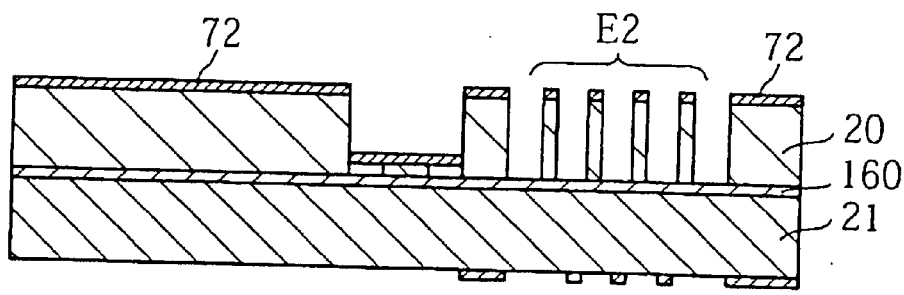
Figure 32C:
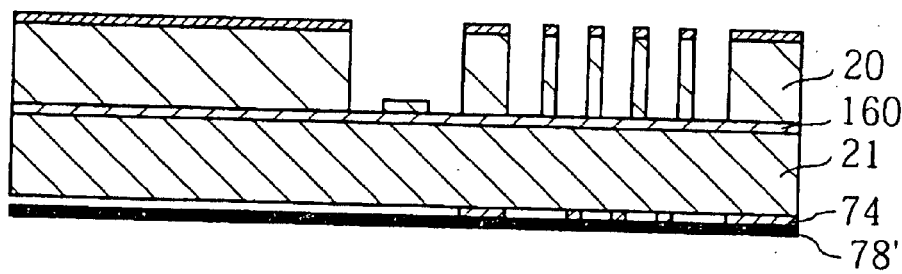
Figure 32D:
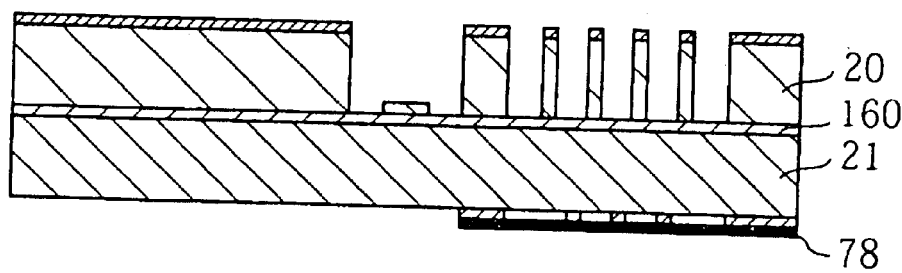
Figure 32E:
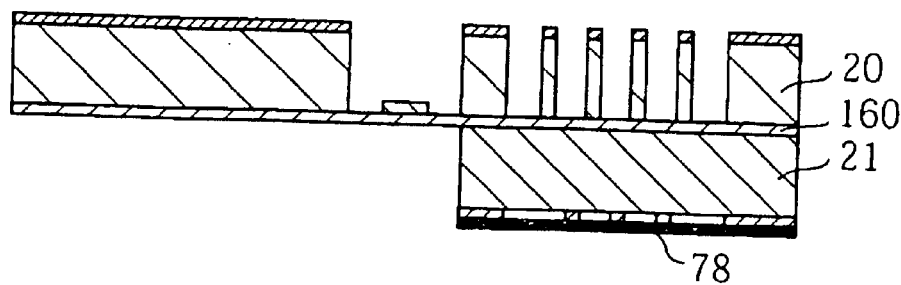

Then, the photoresist 77' is exposed to light and developed, to be processed into a resist pattern 77, as shown in FIG. 32A. The pattern 77 serves as a mask for the pre-torsion bar T'. Then, as shown in FIG. 32B, the first silicon layer 20 is subjected to etching with the pattern 72 used as a mask until the etching reaches the insulating layer 160. Thus, an comb-teeth electrode E2 contacting with the insulating layer 160 is obtained. Then, as shown in FIG. 32C, the resist pattern 77 is removed, while a photoresist 78' is formed on the second silicon layer 21. Then, as shown in FIG. 32D, the photoresist 78' is processed into a resist pattern 78. Then, as shown in FIG. 32E, the second silicon layer 21 is subjected to DRIE with the pattern 78 used as a mask until the etching reaches the insulation layer 160.

Figure 33A:
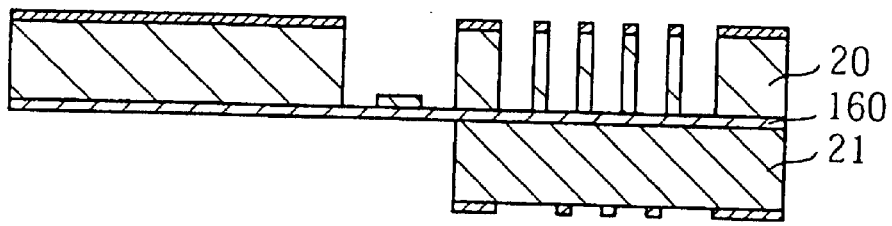
Figure 33B:
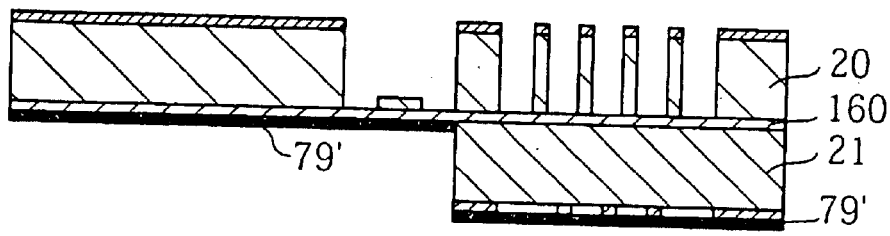
Figure 33C:
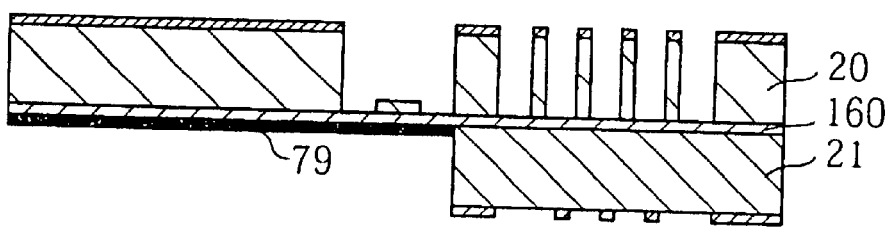
Figure 33D:
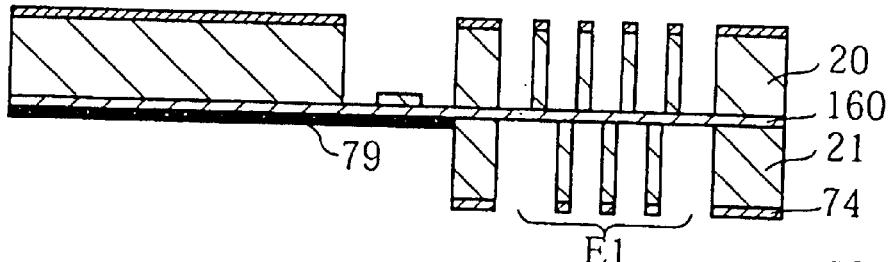
Figure 33E:
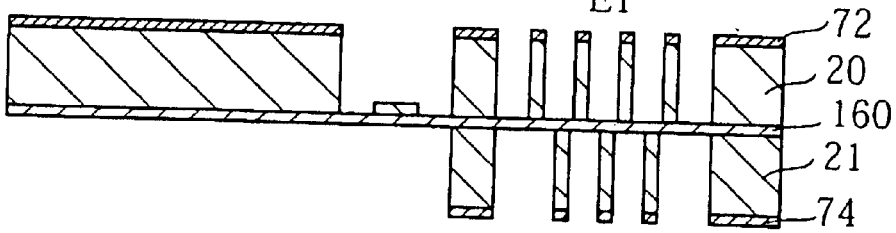
Figure 33F:
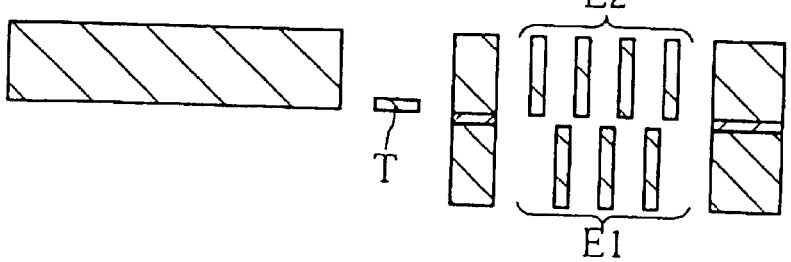

Then, as shown in FIG. 33A, the resist pattern 78 is removed. Then, as shown in FIG. 33B, a photoresist 79' is formed by spraying the material from below. Then, as shown in FIG. 33C, the photoresist 79' is processed into a resist pattern 79. Then, as shown in FIG. 33D, the second silicon layer 21 is subjected to DRIE with the pattern 74 used as a mask until the etching reaches the insulating layer 160. Thus, a comb-teeth electrode E1 contacting with the insulating layer 160 is obtained. Then, as shown in FIG. 33E, the resist pattern 79 is removed. Then, as shown in FIG. 33F, the exposed insulating layer 160 is etched away. At this time, the oxide film patterns 72, 74 are also removed.

According to the present invention, as described above, the torsion bar T can be substantially completed at an earlier stage than the comb-teeth electrodes E1 and E2, and vice versa.

Figure 34A:
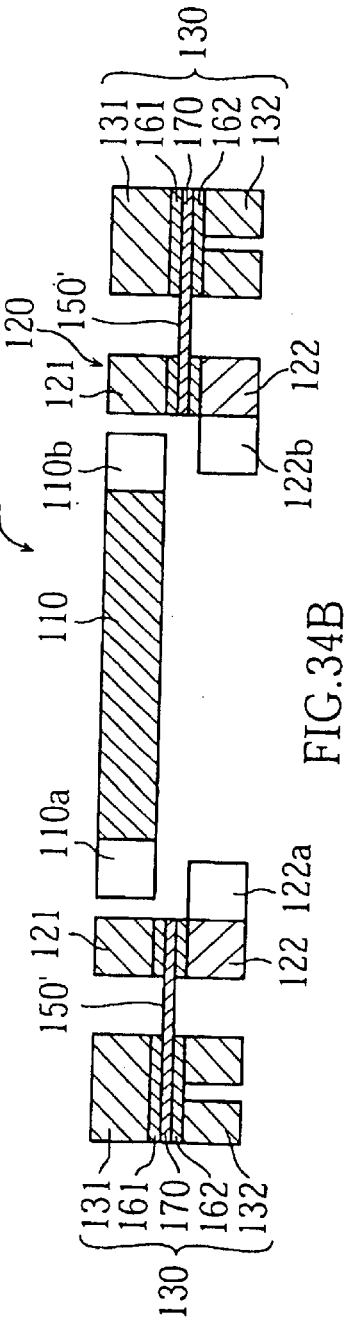
FIGS. 34A–34C are sectional views illustrating a micromirror unit according to a tenth embodiment of the present invention.
Figure 34B:
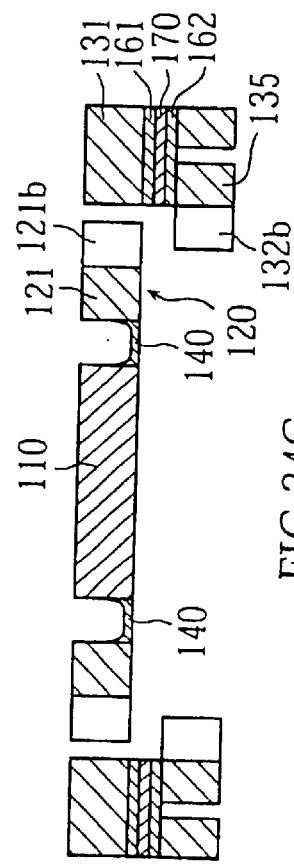
Figure 34C:
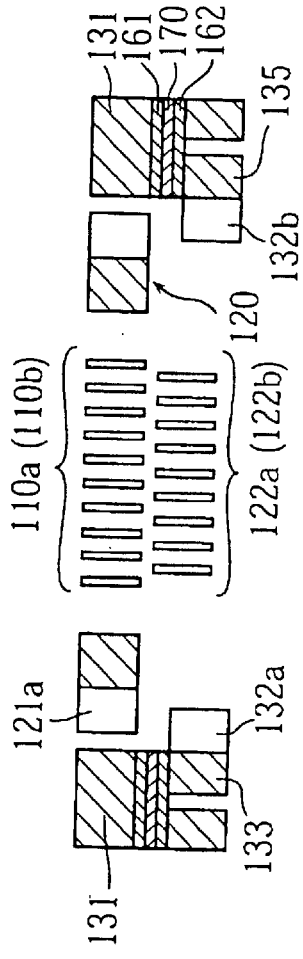

Reference is now made to FIGS. 34A–34C illustrating a micromirror unit 100' according to a tenth embodiment of the present invention. FIGS. 34A–34C correspond to FIGS. 2A–2C (first embodiment of the present invention), respectively. As described below, the micromirror unit 100' is slightly different in arrangement from the unit 100 of the first embodiment.

Specifically, the inner frame 120 of the unit 100' has a multi-layer structure composed of an inner frame body 121, a first inner insulating layer 161, an inner silicon layer 170, a second inner insulating layer 162 and electrode bases 122. The inner silicon layer 170 is vertically sandwiched between the first and the second inner insulating layers 161, 162. The outer frame 130 of the unit 100' has also a multi-layer structure composed of a first outer frame member 131, a first outer insulating layer 161, an outer silicon layer 170, a second outer insulating layer 162 and a second outer frame member 132. The outer silicon layer 170 is vertically sandwiched between the first and second outer insulating layers 161, 162.

The inner frame 120 is connected to the outer frame 130 by a pair of second torsion bars 150'. Each of the second torsion bars 150' has an inner end (on the side of the inner frame 120) and an outer end (on the side of the outer frame 130). The inner end is connected to the inner silicon layer 170 of the inner frame 120, while the outer end is connected to the outer silicon layer 170 of the outer frame 130. The other arrangements of the unit 100' are similar to the counterparts of the unit 100. Thus, the upper and lower plan views of the unit 100' appear the same as those shown in FIGS. 1A and 1B.

Reference is now made to FIGS. 35A–35E and 36A–36E illustrating a micromirror unit fabrication method according to an eleventh embodiment of the present invention. This method employs a micro-machining technique and can produce the above-described micromirror unit 100'.

Figure 35A:
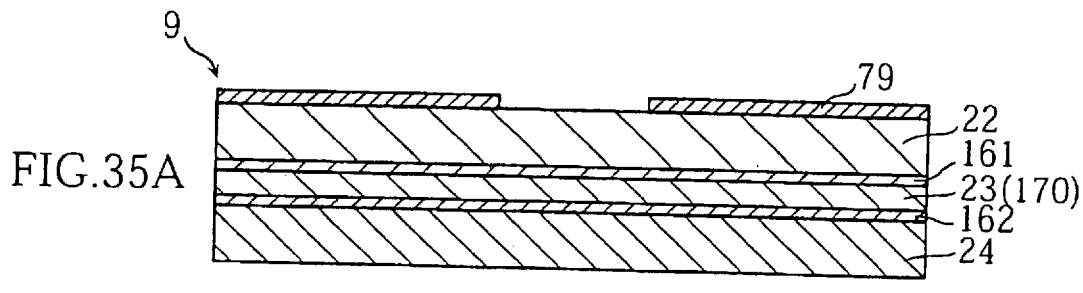
FIGS. 35A–35E and 36A–36E are sectional views illustrating a micromirror unit fabrication method according to an eleventh embodiment of the present invention.

In the illustrated embodiment, first an oxide film pattern 80 is formed on an SOI wafer 9, as shown in FIG. 35A. The wafer 9 has a multi-layer structure composed of a first silicon layer 22, a first insulating layer 161, a second silicon layer 23, a second insulating layer 162 and a third silicon layer 24. The second silicon layer 23 of FIG. 35A corresponds to the inner silicon layer 170 of FIG. 34. The first silicon layer 22, the second silicon layer 23 and the third silicon layer 24 may be made of a conductive silicon (or polysilicon) material doped with n-type impurities such as phosphorus or arsenic. The first silicon layer 22 has a thickness of 100 µm, the second silicon layer 23 has a thickness of 5 µm, and the third silicon layer 24 has a thickness of 100 µm. Each of the first and the second insulating layers 161, 162 has a thickness of 1 µm.

Figure 35B:
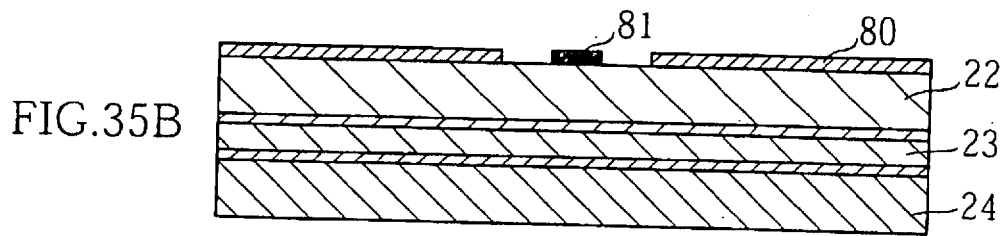
Figure 35C:
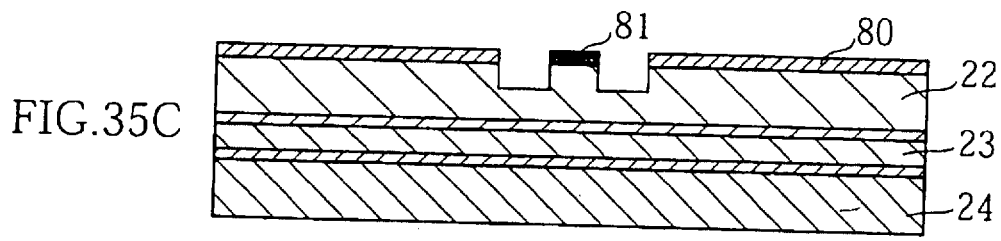
Figure 35D:
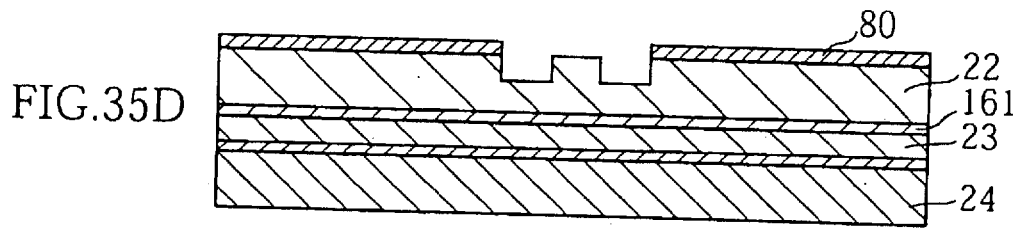
Figure 35E:
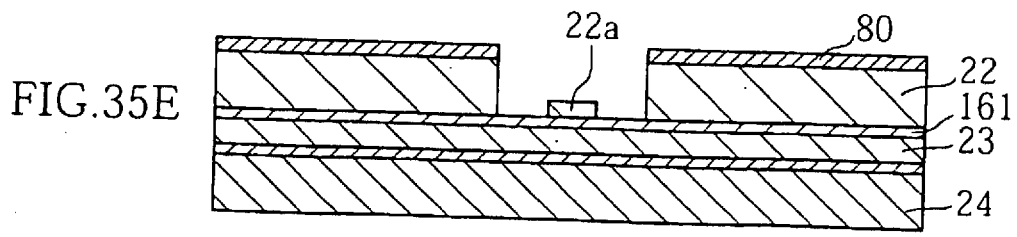

Then, as shown in FIG. 35B, a resist pattern 81 is formed on the first silicon layer 22 for masking a region to be processed into a torsion bar T. Then, as shown in FIG. 35C, the first silicon layer 22 is subjected to DRIE with the patterns 80 and 81 used as a mask until grooves of a predetermined depth (e.g. 5um) are formed. Then, as shown in FIG. 35D, the resist pattern 81 is removed. Then, the first silicon layer 22 is subjected to DRIE with the pattern 80 used as a mask until the etching reaches the first insulating layer 161, as shown in FIG. 35E. In the thus formed groove, a portion 22a of the first silicon layer 22 remains.

Figure 36A:
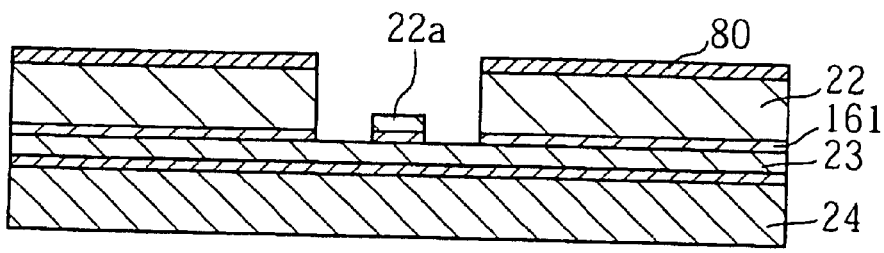
Figure 36B:
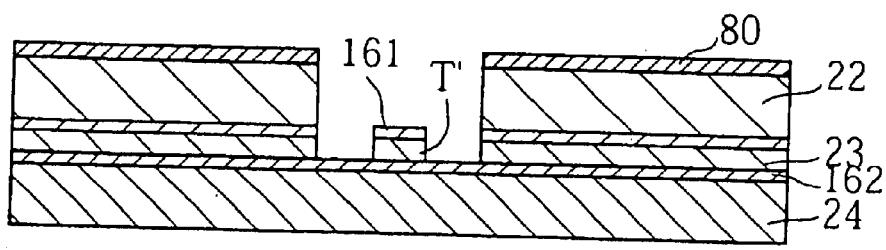
Figure 36C:
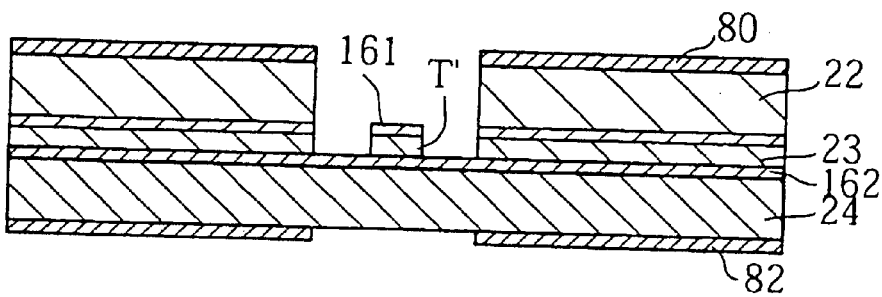
Figure 36D:
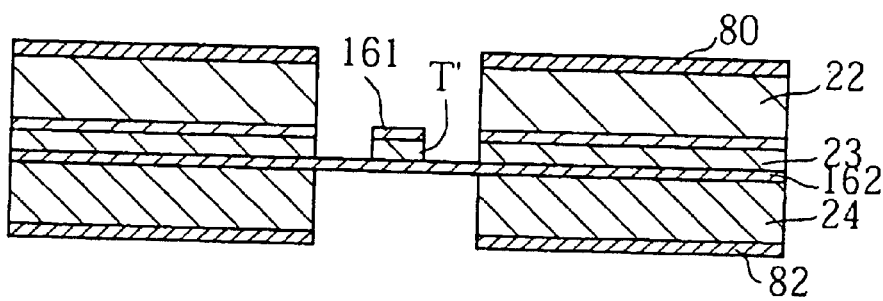
Figure 36E:
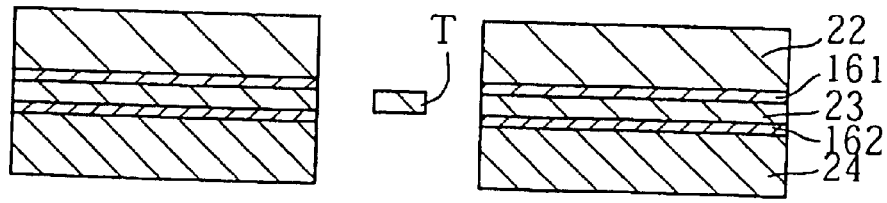

Then, as shown in FIG. 36A, the first insulating layer 161 exposed at the step of FIG. 35E is etched away. Thus, the second silicon layer 23 is partially exposed. The thus exposed second silicon layer 23 is subjected to DRIE with the first insulating layer 161 used as a mask, as shown in FIG. 36B, until the etching reaches the second insulating layer 162. At this stage, the remaining portion 22a of the layer 22 is etched away. As a result, a pre-torsion bar T' contacting with the first and the second insulating layers 161–162 is obtained. Then, as shown in FIG. 36C, an oxide film pattern 82 is formed on the third silicon layer 24. Then, the layer 24 is subjected to DRIE with the pattern 82 used as a mask until the etching reaches the second insulating layer 162, as shown in FIG. 36D. Then, as shown in FIG. 36E, the first and the second insulating layers 161, 162 contacting with the pre-torsion bar T' are removed by immersion into etchant. At this time, the exposed oxide film patterns 80, 82 are also etched away. Thus, a torsion bar T is obtained.

In the above-described embodiment, at the step of FIG. 35D, the resist pattern 81 is removed, and then the layer 22 is subjected to an additional etching step. Alternatively, the pattern 81 may remain through some subsequent steps to be used as a mask for making the pre-torsion bar T'.

Further, in the above-described embodiment, the pre-torsion bar T' in the making is held in contact with both the first and the second insulating layers 161–162. Thereafter, the two layers 161–162 are removed to provide the complete pre-torsion bar T'. In this manner, the thickness of the resulting pre-torsion bar T' is determined by the thickness of the second silicon layer 23 of the SOI wafer 9. Therefore, a precisely thin (e.g. 5um) torsion bar T can be obtained at the vertical center of the wafer 9.

Reference is now made to FIGS. 37A–37D and 38A–38D illustrating a micromirror unit fabrication method according to a twelfth embodiment of the present invention. This method again employs a micro-machining technique and can produce the above-described micromirror unit 100'.

Figure 37A:
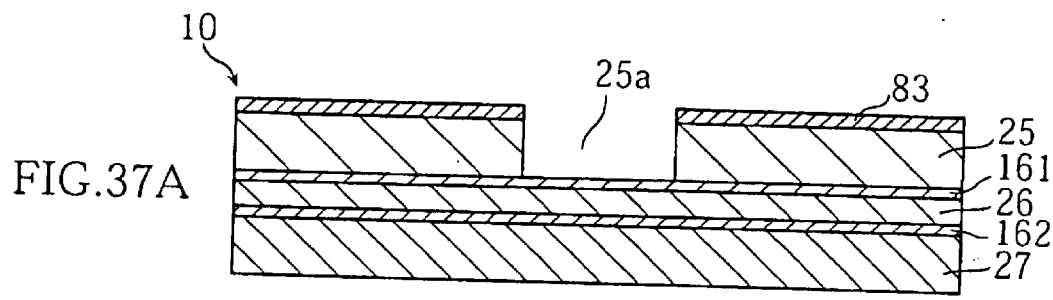
FIGS. 37A–37D and 38A–38D are sectional views illustrating a micromirror unit fabrication method according to an twelfth embodiment of the present invention.

In the illustrated embodiment, first, an oxide film pattern 83 is formed on an SOI wafer 10, as shown in FIG. 37A. The wafer 10 has a multi-layer structure composed of a first silicon layer 25, a first insulating layer 161, a second silicon layer 26, a second insulating layer 162 and a third silicon layer 27. The first silicon layer 25 is formed with a groove 25a by using the pattern 83 as a mask. The second silicon layer 26 corresponds to the inner silicon layer 170 shown in FIG. 34. The first silicon layer 25, the second silicon layer 26 and the third silicon layer 27 are made of a conductive silicon (or polysilicon) material doped with n-type impurities such as phosphorus or arsenic. The first silicon layer 25 has a thickness of 100 µm, the second silicon layer 26 has a thickness of 5 µm, and the third silicon layer 27 has a thickness of 100 µm. Each of the first and the second insulating layers 161–162 has a thickness of 1 µm.

Figure 37B:
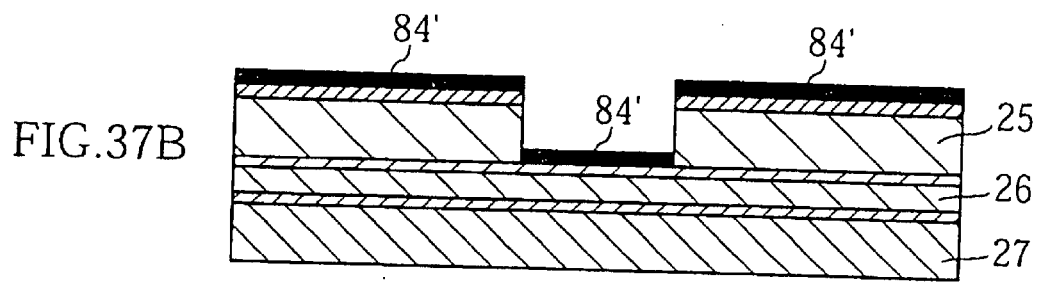
Figure 37C:
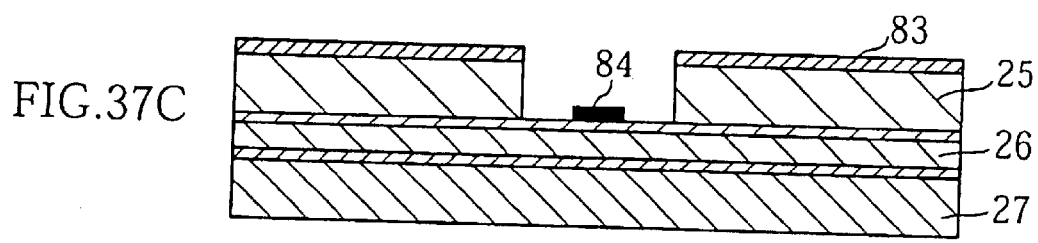
Figure 37D:
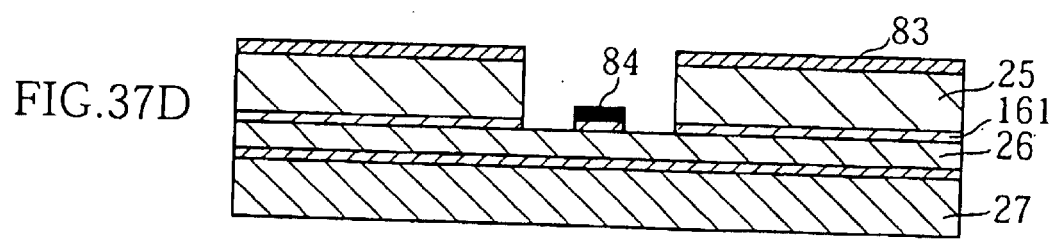

Then, as shown in FIG. 37B, a photoresist 84' is formed by spraying the material from above. Then, the photoresist 84' is processed into a resist pattern 84, as shown in FIG. 37C. The resist pattern 84 serves as a mask for a region to be processed into a torsion bar T. Then, as shown in FIG. 37D, the exposed regions of the first insulating layer 161 are etched away with the pattern 84 used as a mask.

Figure 38A:
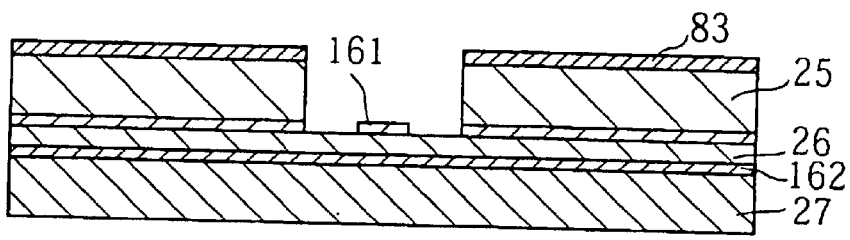
Figure 38B:
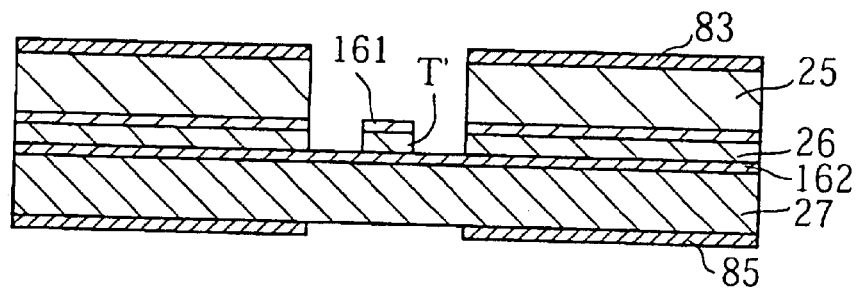
Figure 38C:
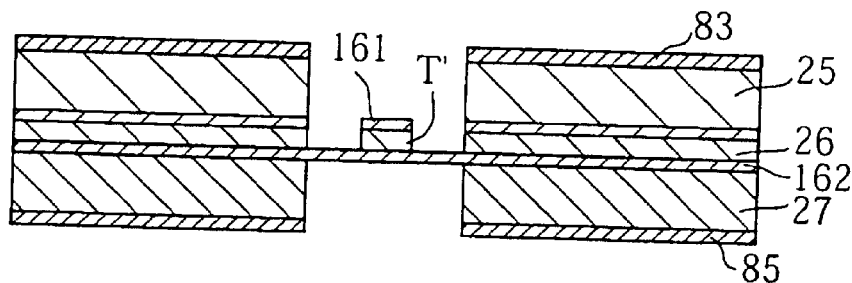
Figure 38D:
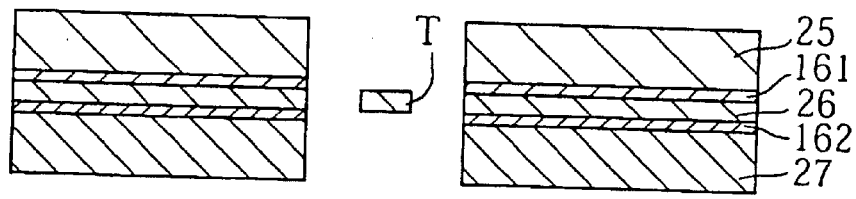
Figure 39:
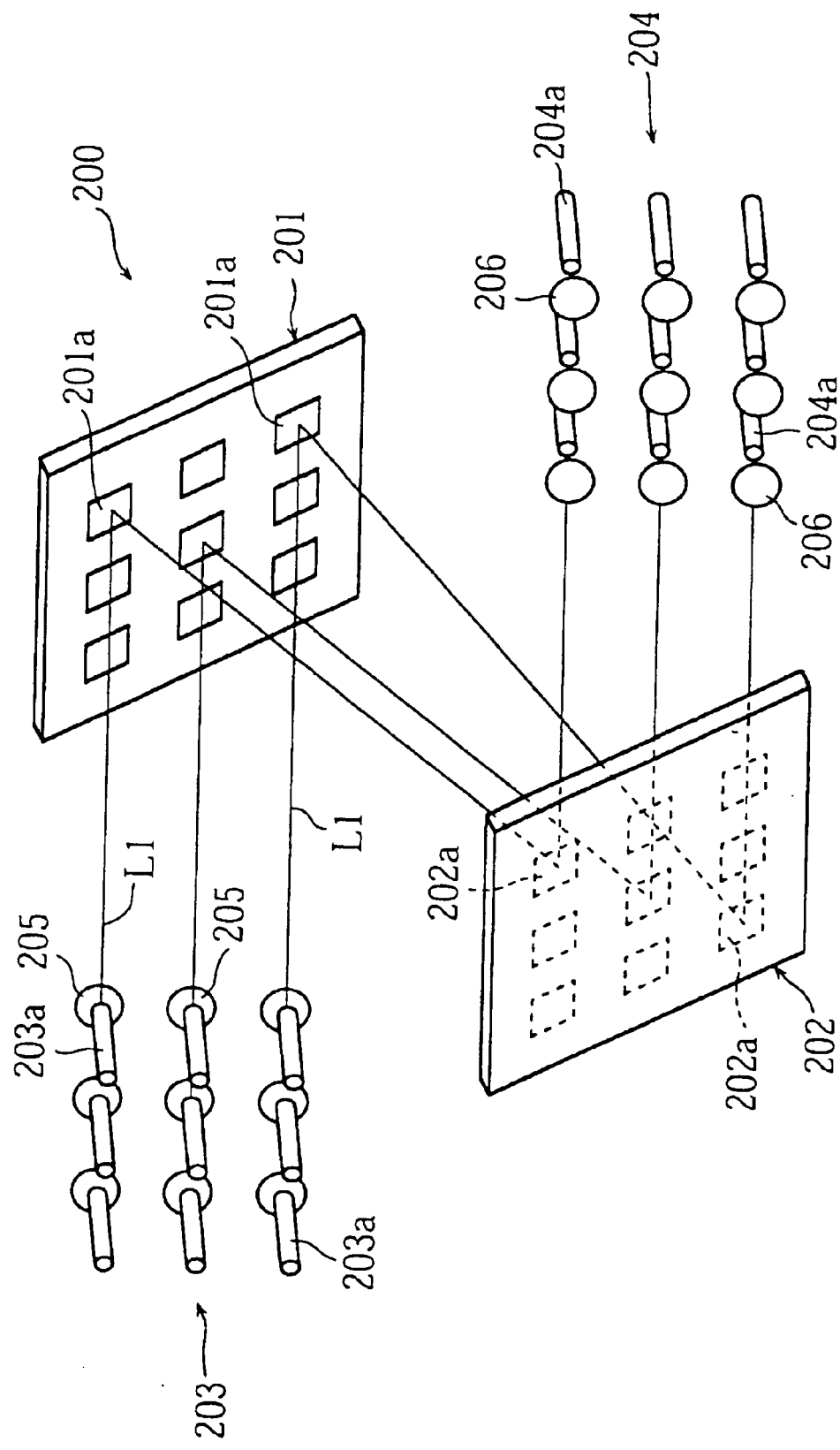
FIG. 39 is a perspective view showing a conventional optical switching apparatus.
Figure 40:
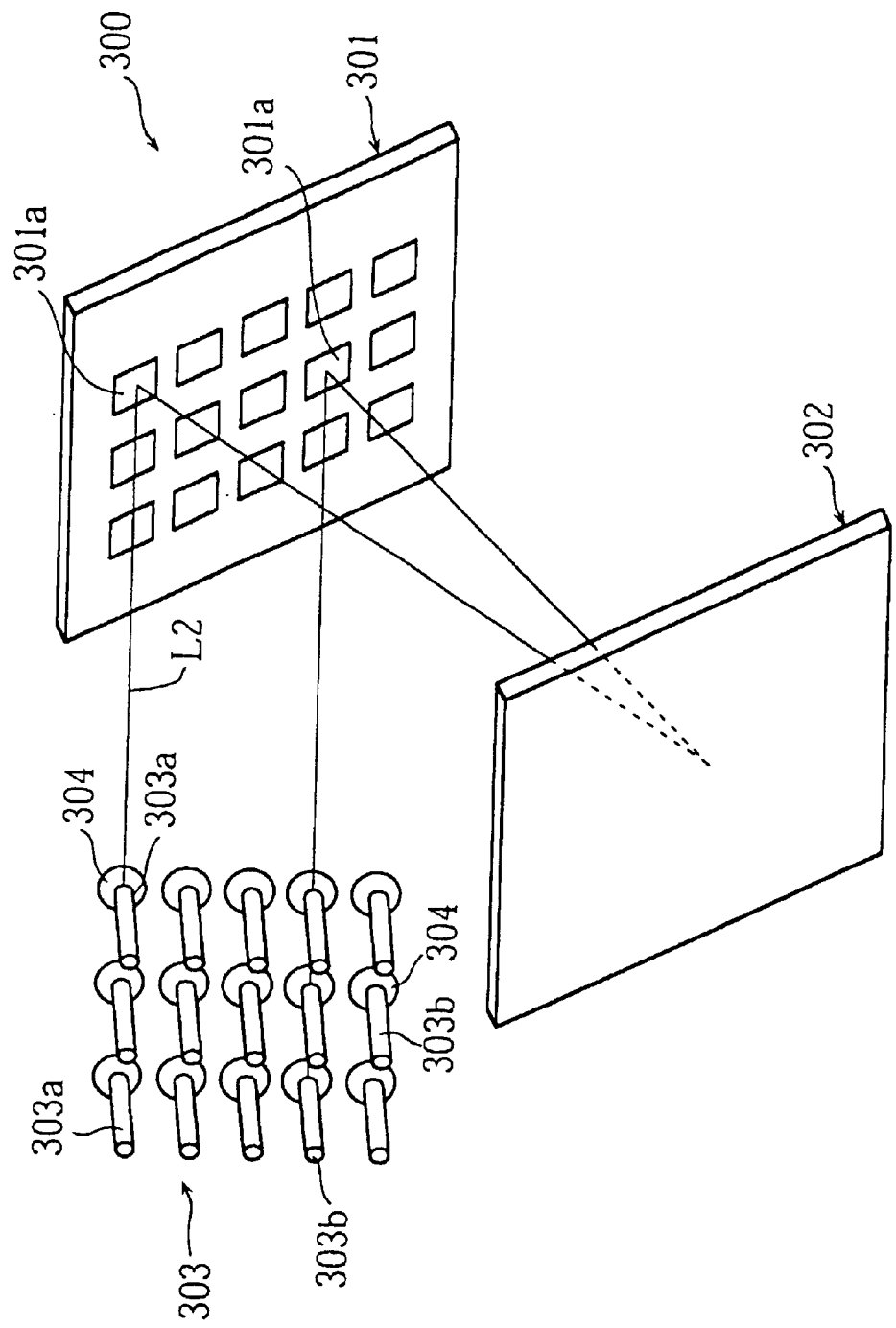
FIG. 40 is a perspective view showing a different type of conventional optical switching apparatus.
Figure 41:
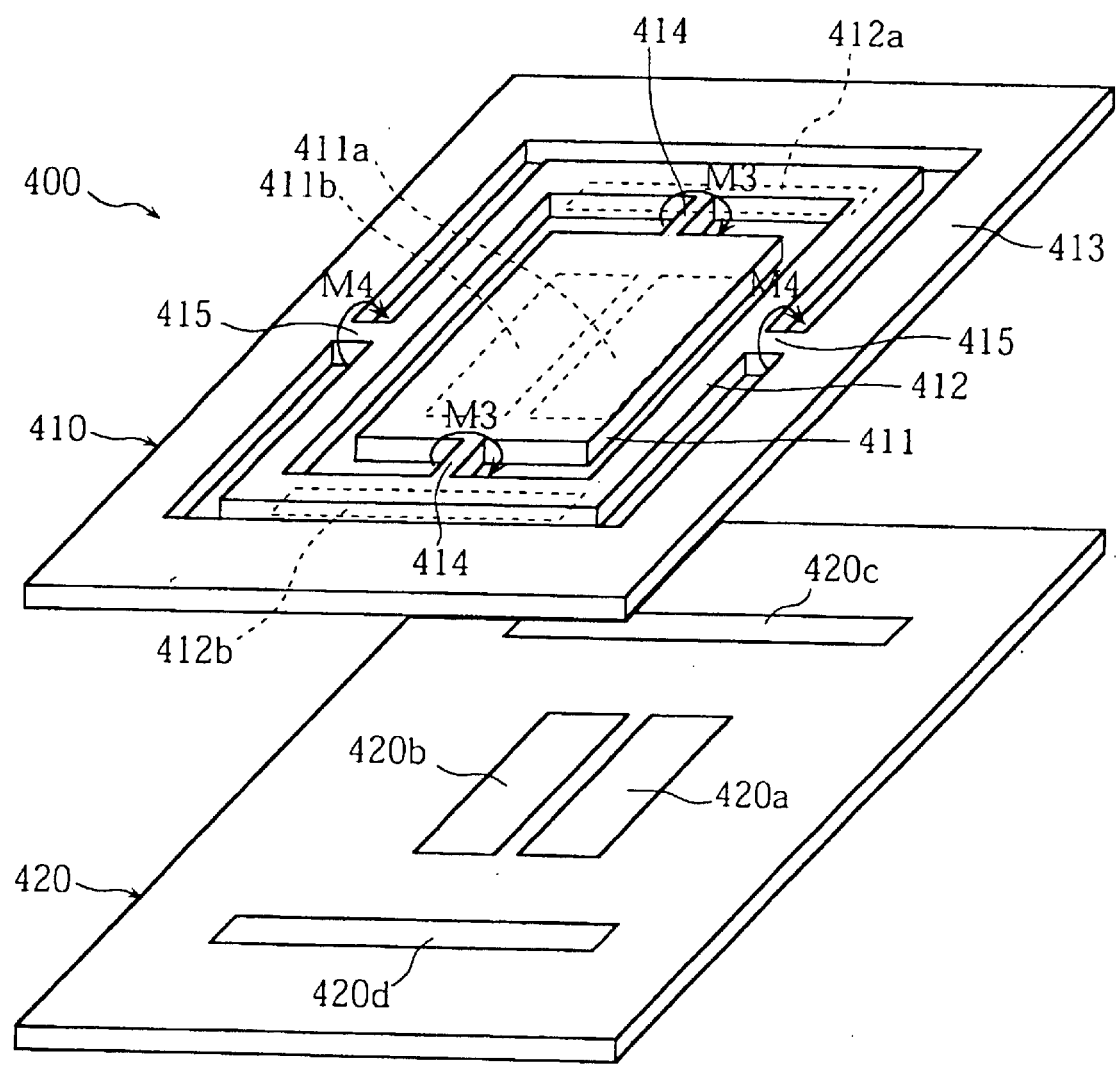
FIG. 41 is an exploded view showing a conventional flat electrode type micromirror unit.
Figure 42:
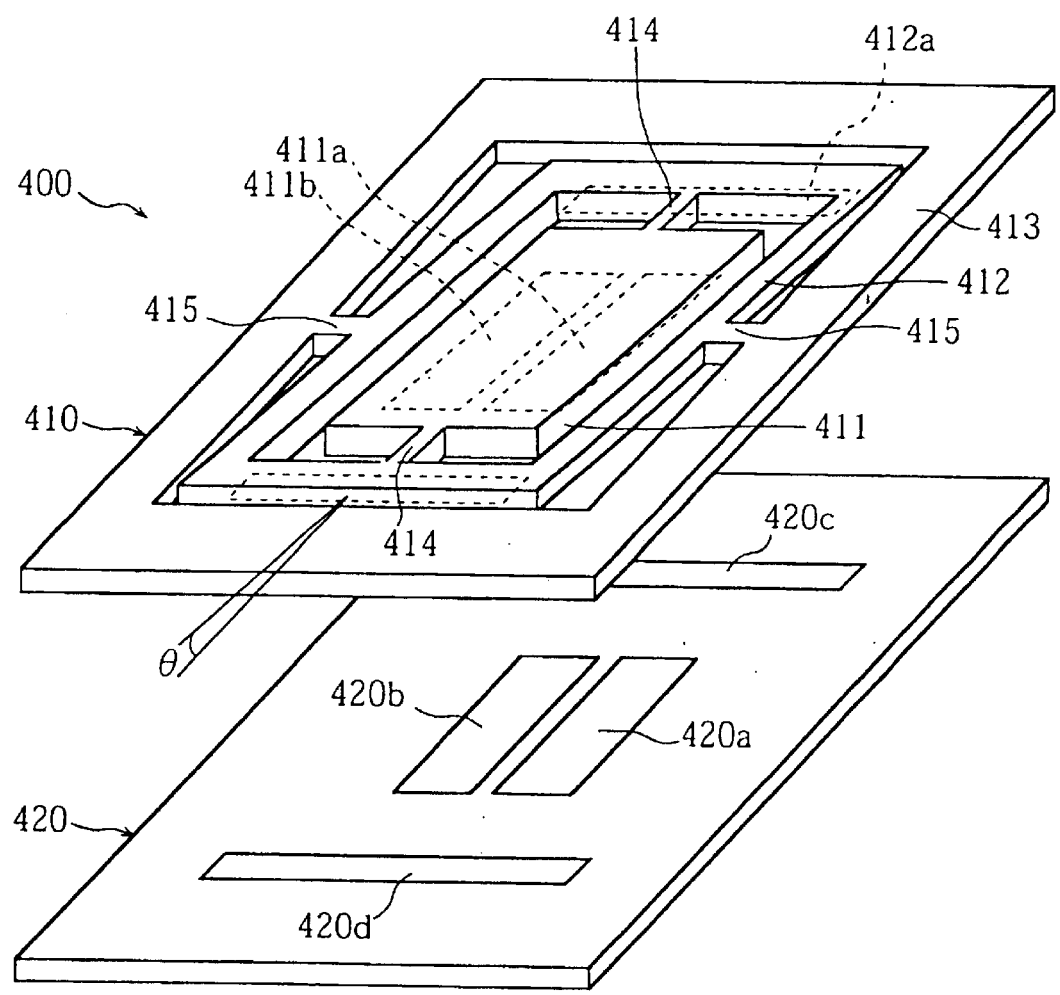
FIG. 42 is an exploded view showing the micromirror unit of FIG. 41 in which the inner frame is rotated through an angle θ relative to the outer frame.
Figure 43:
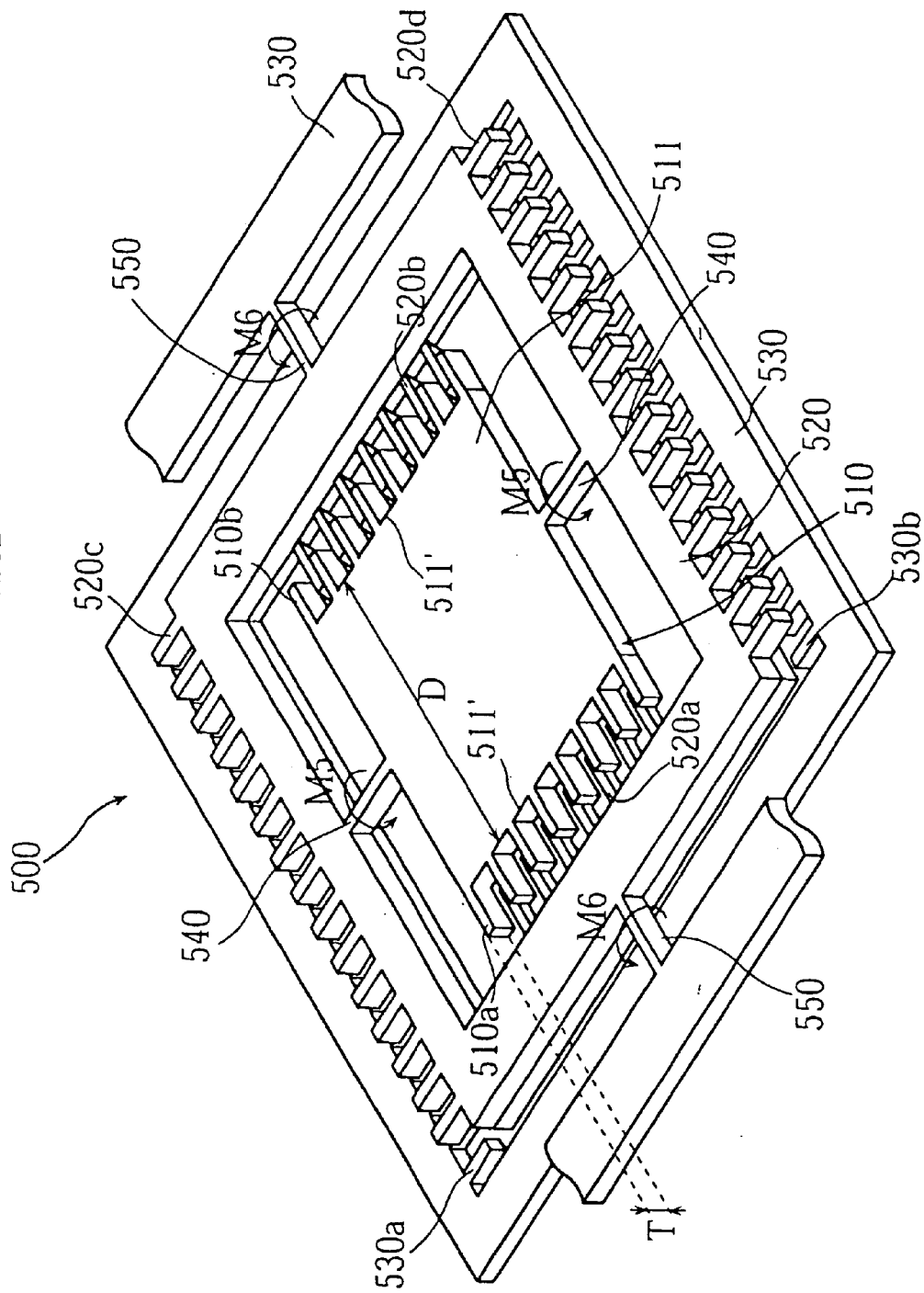
FIG. 43 is a perspective view illustrating a conventional micromirror unit provided with comb-teeth electrodes.
Figure 44A:
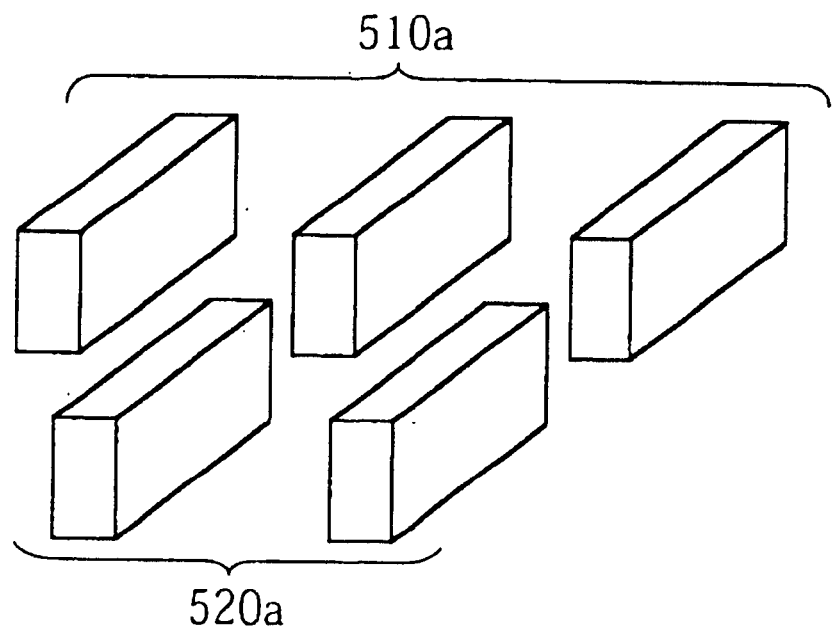
FIG. 44A is a perspective view showing some of the conductive teeth of the comb-teeth electrodes of the micromirror unit shown in FIG. 43 in which the upper three teeth extend in parallel to the lower two teeth.
Figure 44B:
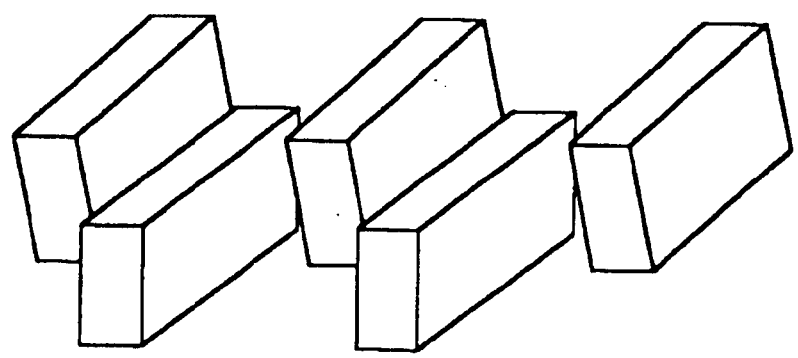
FIG. 44B is a perspective view showing the skewed orientation of the upper teeth relative to the lower teeth.

Then, as shown in FIG. 38A, the resist pattern 84 is removed. Then, as shown in FIG. 38B, the second silicon layer 26 is subjected to DRIE with the first insulating layer 161 used as a mask until the etching reaches the second insulating layer 162. Thus, a pre-torsion bar T' contacting with the first and the second insulating layers 161–162 is obtained. At this stage, an oxide film pattern 85 is formed on the third silicon layer 27. Then, as shown in FIG. 38C, the third silicon layer 27 is subjected to DRIE with the pattern 85 used as a mask until the etching reaches the second insulating layer 162 Then, as shown in FIG. 38D, the insulating layers 161–162 contacting with the pre-torsion bar T' are etched away by immersion into etchant. At this time, the oxide film patterns 83, 85 are also removed. Thus, a torsion bar T is obtained.

The present invention being thus described, it is obvious that the same may be varied in many ways. Such variations are not to be regarded as a departure from the spirit and scope of the present invention, and all such modifications as would be obvious to those skilled in the art are intended to be included within the scope of the following claims.

What is claimed is:

1. A micromirror unit comprising:
    a mirror forming base;
    frames having a multi-layer structure including a plurality of silicon layers and at least one intermediate layer; and
    a torsion bar which is smaller in thickness than the mirror forming base, the torsion bar defining an axis about which the mirror forming base is rotated relative to the frames, the torsion bar having an inner end connected to a portion of the silicon layers that is held in contact with the intermediate layer, the torsion bar also having an outer end connected to another portion of the silicon layers that is held in contact with the intermediate layer.

2. The micromirror unit according to claim 1, wherein the frames include a first frame and a second frame each of which includes a silicon layer and an intermediate layer held in contact with the silicon layer, the torsion bar having one end connected to the silicon layer of the first frame and another end connected to the silicon layer of the second frame.

3. The micromirror unit according to claim 2, wherein the first frame is provided with a third comb-teeth electrode, the second frame being provided with a fourth comb-teeth electrode cooperating with the third comb-teeth electrode to move the first frame and the mirror forming base.

4. The micromirror unit according to claim 1, wherein the frames include two intermediate layers between which only one of the silicon layers is disposed, the torsion bar being connected to said one of the silicon layers.

5. The micromirror unit according to claim 4, wherein the frames include first and second frames each of which includes two intermediate layers between which only one silicon layer is disposed, the torsion bar having one end connected to said one silicon layer of the first frame and another end connected to said one silicon layer of the second frame.

6. The micromirror unit according to claim 1, wherein the intermediate layer is made of an insulating material.

7. The micromirror unit according to claim 1, wherein the mirror forming base is provided with a first comb-teeth electrode, the frames being provided with a second comb-teeth electrode cooperating with the first comb-teeth electrode to move the mirror forming base.

8. A micromirror unit comprising:
    a mirror forming base;
    frames having a multi-layer structure including a plurality of silicon layers and at least one intermediate layer; and
    a torsion bar which is smaller in thickness than the mirror forming base, the torsion bar defining an axis about which the mirror forming base is rotated relative to the frames, the torsion bar having an end connected to a portion of the silicon layers that is held in contact with the intermediate layer;
    wherein the frames include two intermediate layers between which only one of the silicon layers is disposed, the torsion bar being connected to said one of the silicon layers.

9. The micromirror unit according to claim 8, wherein the frames include first and second frames each of which includes two intermediate layers between which only one silicon layer is disposed, the torsion bar having one end connected to said one silicon layer of the first frame and another end connected to said one silicon layer of the second frame.

* * * * *